United States Patent
Lee et al.

(10) Patent No.: US 10,134,638 B2
(45) Date of Patent: Nov. 20, 2018

(54) FETS AND METHODS OF FORMING FETS

(71) Applicant: Taiwan Semiconductor Manufacturing Company, Ltd., Hsin-Chu (TW)

(72) Inventors: Tung Ying Lee, Hsin-Chu (TW); Yu-Lien Huang, Jhubei (TW); You-Ru Lin, New Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/432,438

(22) Filed: Feb. 14, 2017

(65) Prior Publication Data
US 2017/0154820 A1 Jun. 1, 2017

Related U.S. Application Data

(62) Division of application No. 14/505,997, filed on Oct. 3, 2014, now Pat. No. 9,583,598.

(51) Int. Cl.
| | |
|---|---|
| *H01L 29/66* | (2006.01) |
| *H01L 21/8234* | (2006.01) |
| *H01L 29/06* | (2006.01) |
| *H01L 29/165* | (2006.01) |
| *H01L 29/10* | (2006.01) |
| *H01L 21/8238* | (2006.01) |
| *H01L 21/84* | (2006.01) |
| *H01L 29/78* | (2006.01) |

(Continued)

(52) U.S. Cl.
CPC ........ *H01L 21/823412* (2013.01); *H01L 21/02236* (2013.01); *H01L 21/823431* (2013.01); *H01L 21/823821* (2013.01); *H01L 21/845* (2013.01); *H01L 27/0924* (2013.01); *H01L 27/1211* (2013.01); *H01L 29/0653* (2013.01); *H01L 29/1054* (2013.01); *H01L 29/165* (2013.01); *H01L 29/66795* (2013.01); *H01L 29/785* (2013.01); *H01L 29/7849* (2013.01)

(58) Field of Classification Search
USPC ........................................... 257/192
See application file for complete search history.

(56) References Cited

U.S. PATENT DOCUMENTS

| | | | |
|---|---|---|---|
| 7,241,653 B2 | 7/2007 | Hareland et al. | |
| 7,994,020 B2 * | 8/2011 | Lin ............... | H01L 21/76232 |
| | | | 257/E21.54 |

(Continued)

FOREIGN PATENT DOCUMENTS

| | | |
|---|---|---|
| JP | 2009259865 A | 11/2009 |
| JP | 2014140017 A | 7/2014 |

*Primary Examiner* — Timor Karimy
(74) *Attorney, Agent, or Firm* — Slater Matsil, LLP

(57) ABSTRACT

An embodiment is a structure. The structure comprises a fin on a substrate, isolation regions on the substrate, a dielectric region, and a gate structure. The fin includes a first epitaxial portion. The isolation regions are on opposing sides of the fin, and at least the first epitaxial portion of the fin protrudes from between the isolation regions. The dielectric region directly underlies the first epitaxial portion. A material of the dielectric region is different from a material of the isolation regions. The gate structure is along sidewalls and is over an upper surface of the fin. The gate structure defines a channel region in the first epitaxial portion.

20 Claims, 43 Drawing Sheets

(51) Int. Cl.
*H01L 27/092* (2006.01)
*H01L 27/12* (2006.01)
*H01L 21/02* (2006.01)

(56) References Cited

U.S. PATENT DOCUMENTS

| | | |
|---|---|---|
| 8,237,226 B2 | 8/2012 | Okano |
| 2012/0241722 A1 | 9/2012 | Ikeda et al. |
| 2014/0191297 A1 | 7/2014 | Utomo et al. |
| 2014/0210010 A1 | 7/2014 | Liu et al. |
| 2015/0129934 A1* | 5/2015 | Xie .................... H01L 27/0886 257/192 |
| 2015/0318176 A1* | 11/2015 | Qi ....................... H01L 29/6681 438/283 |
| 2016/0027777 A1 | 1/2016 | Eneman et al. |
| 2016/0099352 A1 | 4/2016 | Lee |

* cited by examiner

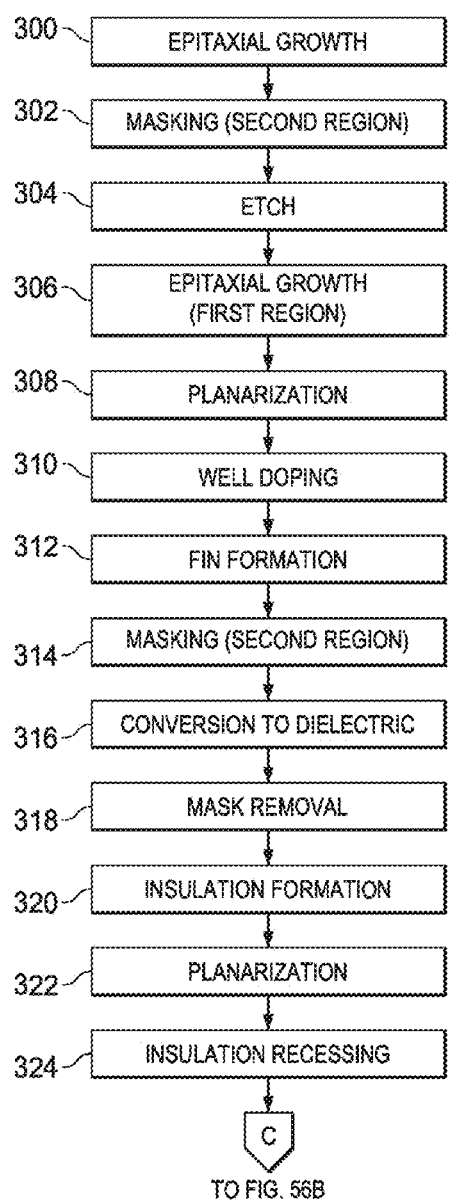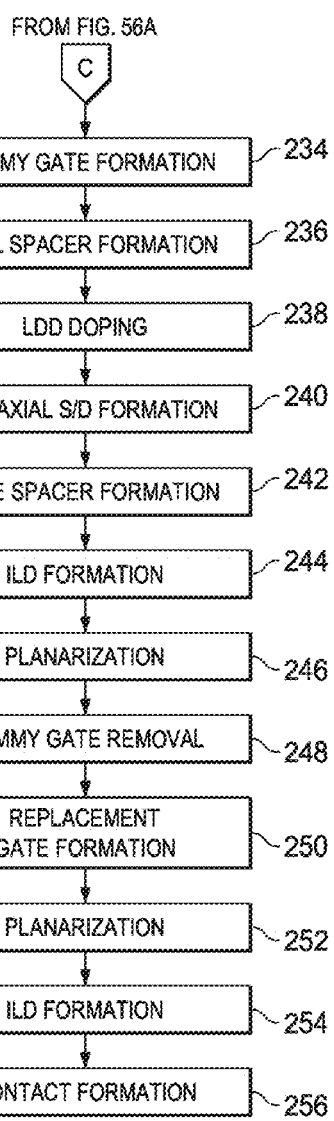

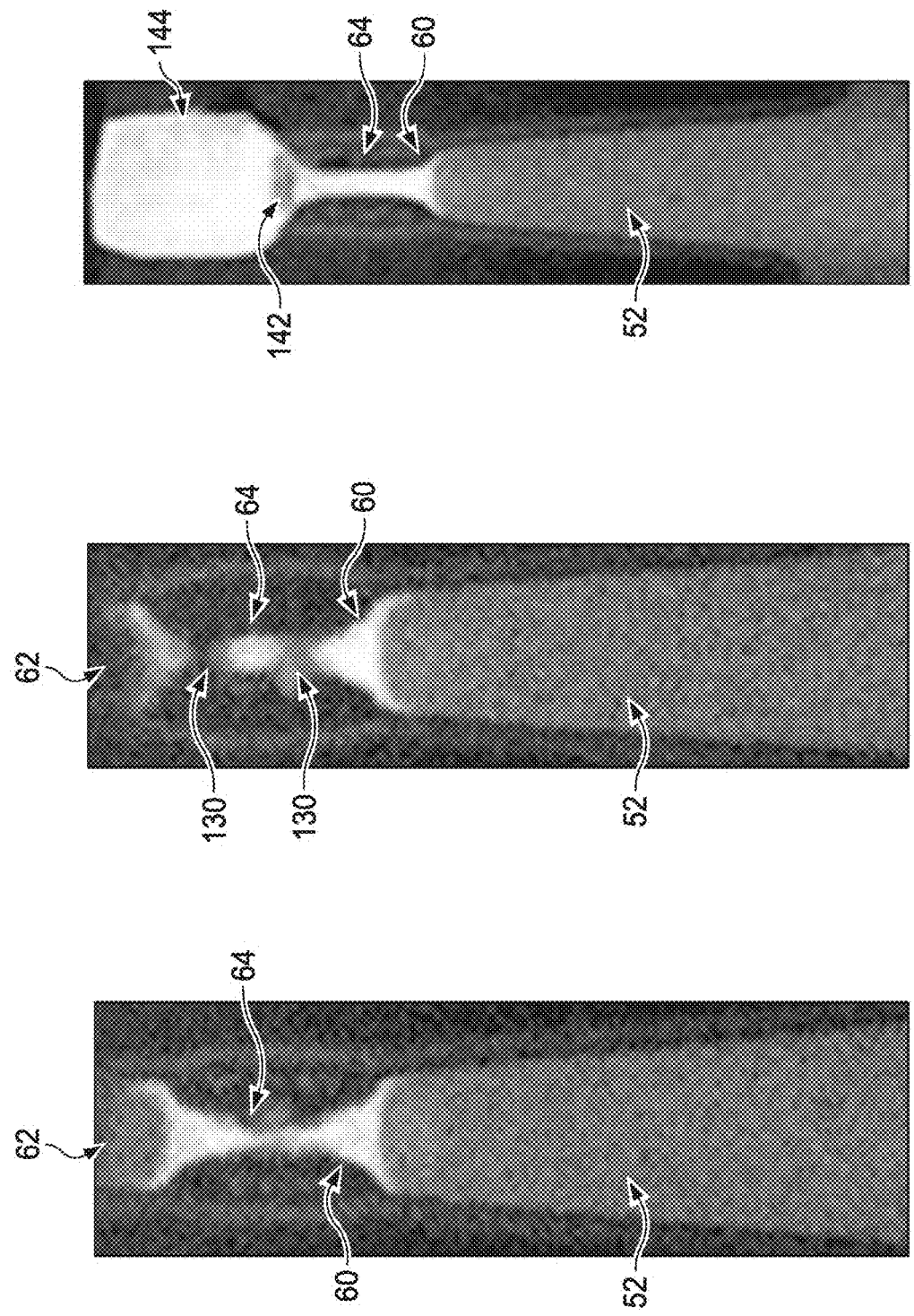

FETS AND METHODS OF FORMING FETS

PRIORITY CLAIM AND CROSS-REFERENCE

This application is a divisional of U.S. application Ser. No. 14/505,997, filed on Oct. 3, 2014, entitled "FETs and Methods of Forming FETs," which application is hereby incorporated herein by reference.

BACKGROUND

Semiconductor devices are used in a large number of electronic devices, such as computers, cell phones, and others. Semiconductor devices comprise integrated circuits that are formed on semiconductor wafers by depositing many types of thin films of material over the semiconductor wafers, and patterning the thin films of material to form the integrated circuits. Integrated circuits typically include field-effect transistors (FETs).

Conventionally, planar FETs have been used in integrated circuits. However, with the ever increasing density and decreasing footprint requirements of modern semiconductor processing, planar FETs may generally incur problems when reduced in size. Some of these problems include sub-threshold swing degradation, significant drain induced barrier lowering (DIBL), fluctuation of device characteristics, and leakage. Fin field-effect transistors (finFETs) have been studied to overcome some of these problems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 56A and 56B are a process flow of the process shown in accordance with some embodiments.

FIGS. 61 through 63 are transmission electron microscopy (TEM) images of samples in accordance with embodiments.

DETAILED DESCRIPTION

Figure 1:
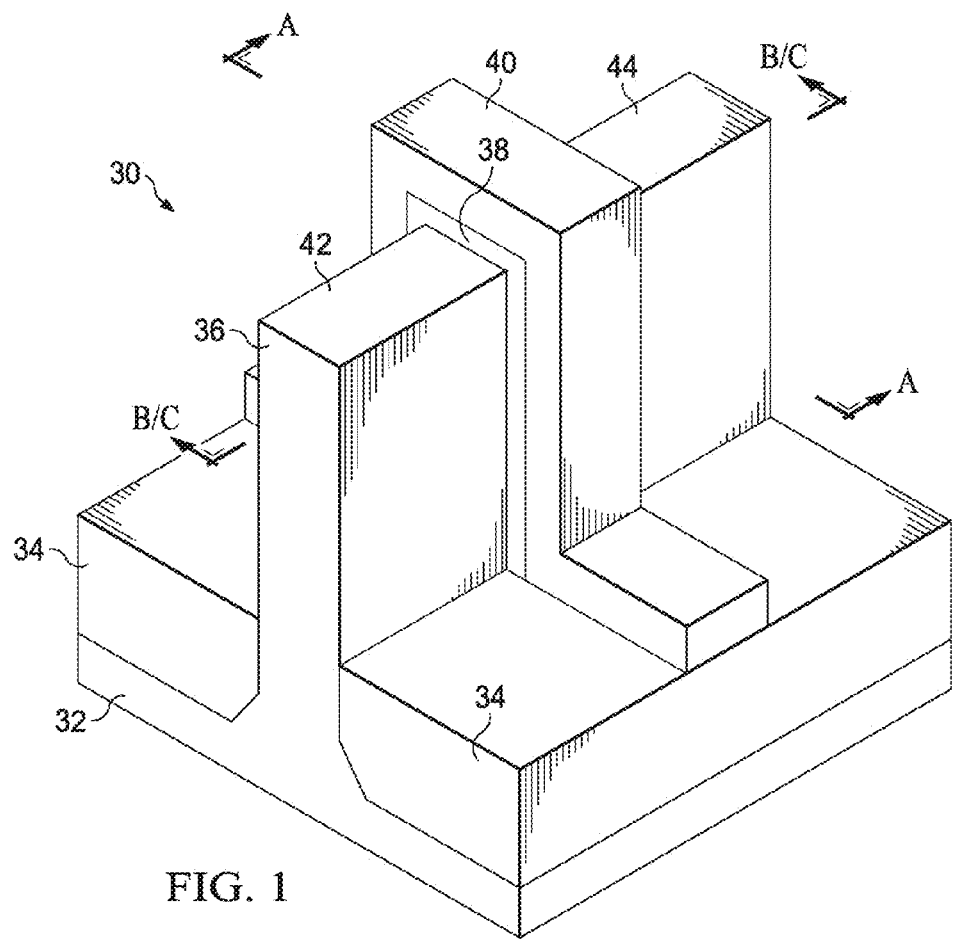
FIG. 1 is an example of a Fin Field-Effect Transistor (finFET) in a three-dimensional view.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fin Field-Effect Transistors (finFETs) and methods of forming the same are provided in accordance with various embodiments. Intermediate stages of forming finFETs are illustrated. Some embodiments discussed herein are discussed in the context of finFETs formed using a gate-last process. In other embodiments, a gate-first process may be used. Also, some embodiments contemplate aspects used in planar devices, such as planar FETs. Some variations of the embodiments are discussed. One of ordinary skill in the art will readily understand other modifications that may be made that are contemplated within the scope of other embodiments. Although method embodiments are discussed in a particular order, various other method embodiments may be performed in any logical order and may include fewer or more steps described herein.

FIG. 1 illustrates an example of a finFET 30 in a three-dimensional view. The finFET 30 comprises a fin 36 on a substrate 32. The substrate 32 includes isolation regions 34, and the fin 36 protrudes above and from between neighboring isolation regions 34. A gate dielectric 38 is along sidewalls and over a top surface of the fin 36, and a gate electrode 40 is over the gate dielectric 38. Source/drain regions 42 and 44 are disposed in opposite sides of the fin 36 with respect to the gate dielectric 38 and gate electrode 40. FIG. 1 further illustrates reference cross-sections that are used in later figures. Cross-section A-A is across a channel, gate dielectric 38, and gate electrode 40 of the finFET 30. Cross-section B/C-B/C is perpendicular to cross-section A-A and is along a longitudinal axis of the fin 36 and in a direction of, for example, a current flow between the source/drain regions 42 and 44. Subsequent figures refer to these reference cross-sections for clarity.

Figure 23A:
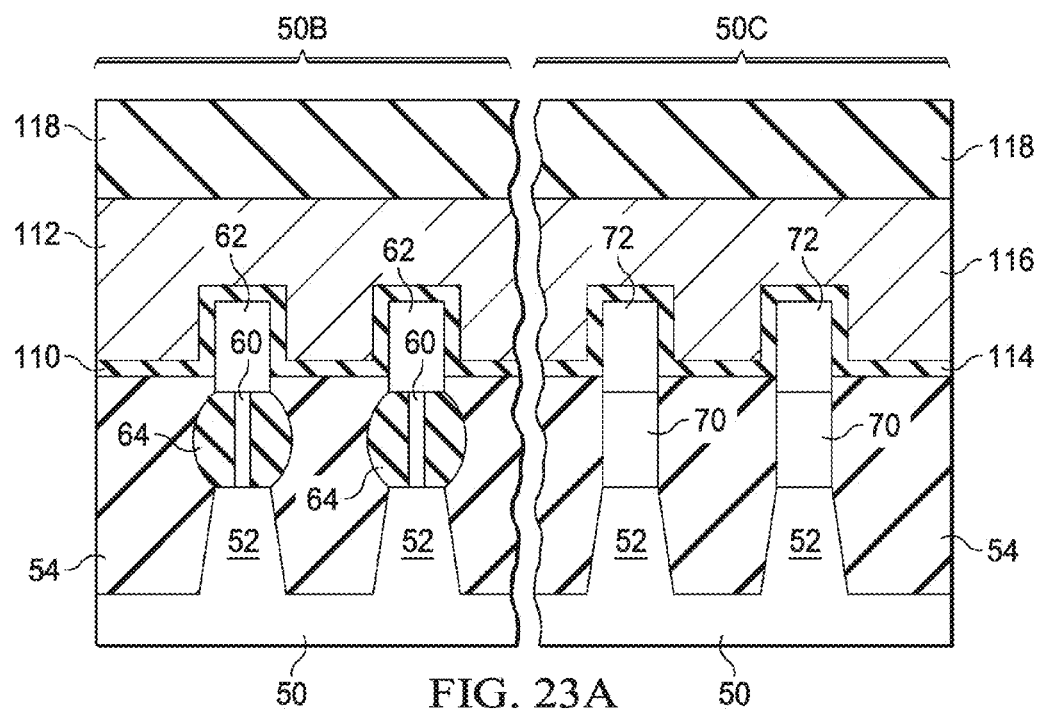
Figure 23B:
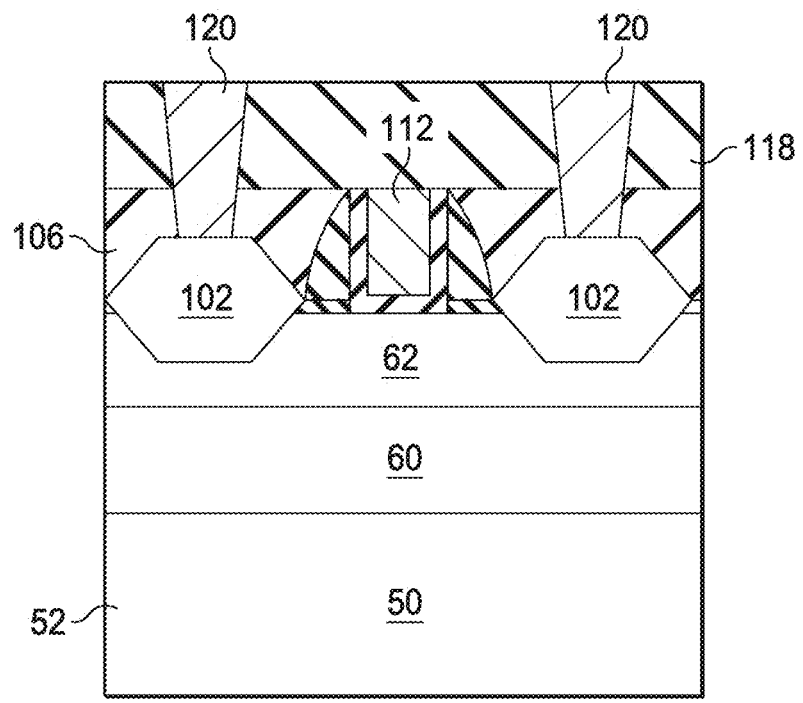
Figure 23C:
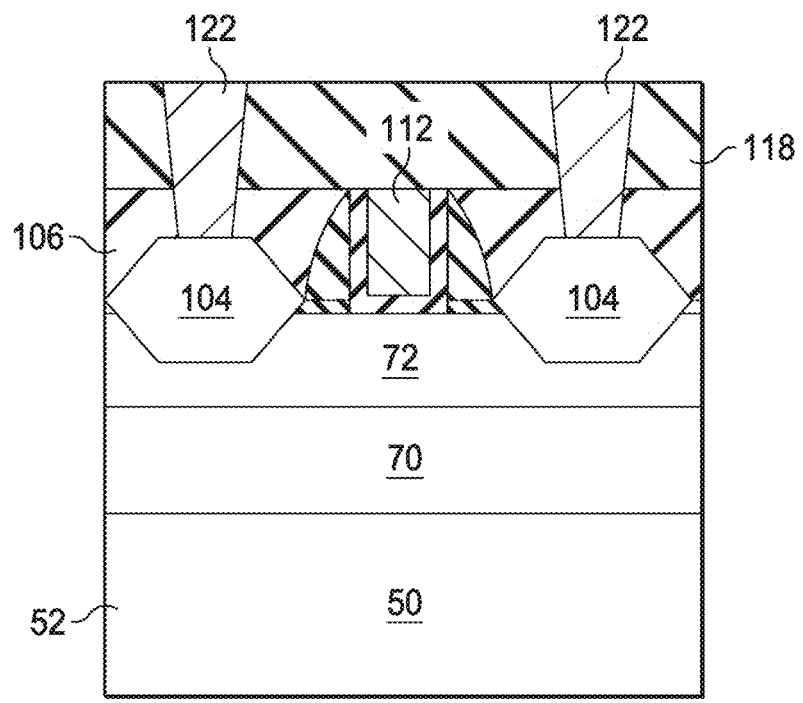
Figure 24A:
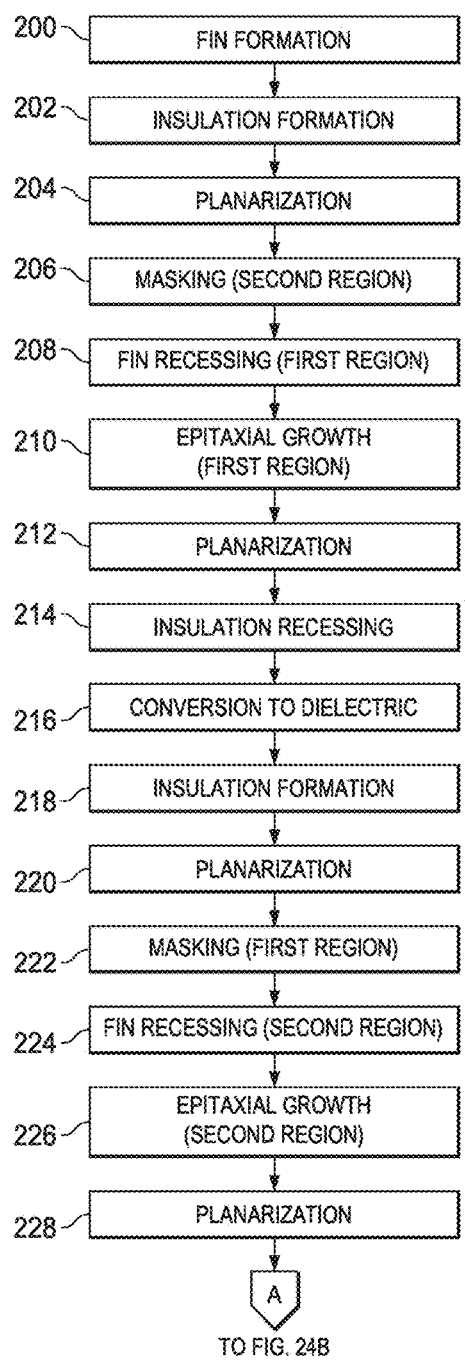
FIGS. 24A and 24B are a process flow of a process in accordance with some embodiments.
Figure 24B:
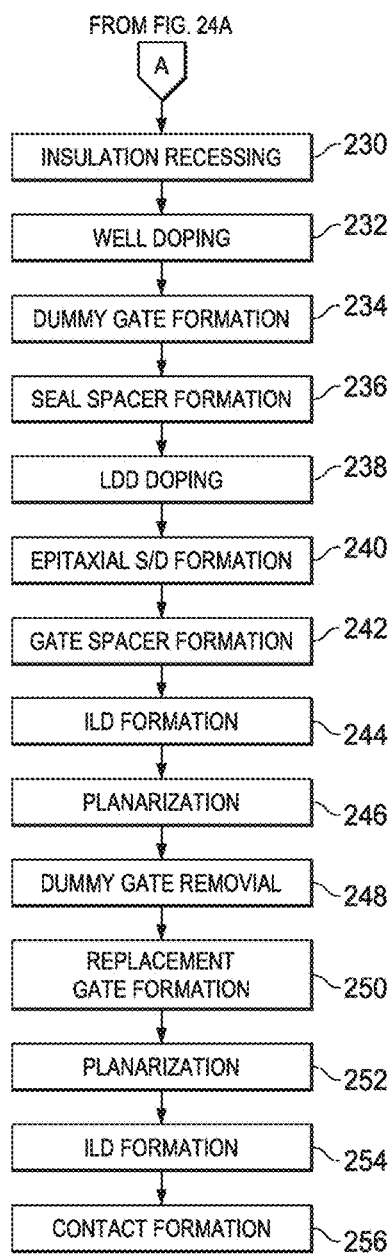

FIGS. 2 through 23C are cross-sectional views of intermediate stages in the manufacturing of finFETs in accordance with an exemplary embodiment, and FIGS. 24A and 24B are a process flow of the process shown in FIGS. 2 through 23C. FIGS. 2 through 15 illustrate reference cross-section A-A illustrated in FIG. 1, except for multiple finFETs. In FIGS. 16A through 23C, figures ending with an "A" designation are illustrated along a similar cross-section A-A; figures ending with a "B" designation are illustrated along a similar cross-section B/C-B/C and in a first region on a substrate; and figures ending with a "C" designation are illustrated along a similar cross-section B/C-B/C and in a second region on a substrate.

Figure 2:
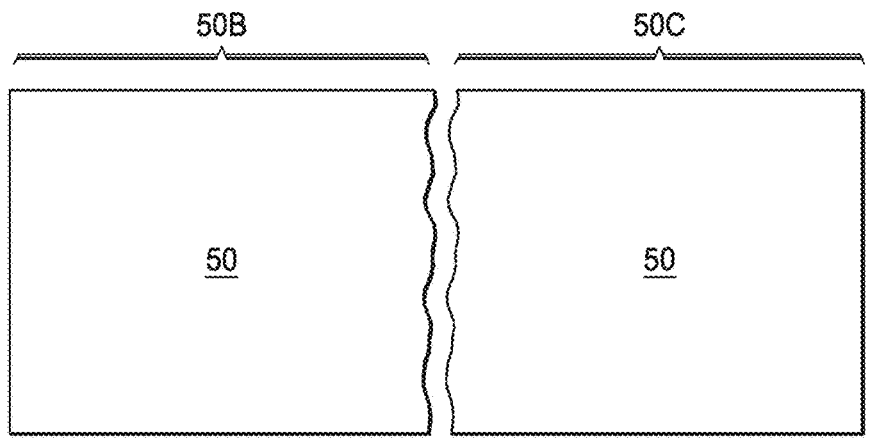
FIGS. 2 through 15, 16A-C, 17A-C, 18A-C, 19A-C, 20A-C, 21A-C, 22A-C, and 23A-C are cross-sectional views of intermediate stages in the manufacturing of finFETs in accordance with some embodiments.

FIG. 2 illustrates a substrate 50. Substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has a first region 50B and a second region 50C. The first region 50B (which corresponds to subsequent figures ending in "B") can be for forming n-type devices, such as NMOS transistors, such as n-type finFETs. The second region 50C (which corresponds to subsequent figures ending in "C") can be for forming p-type devices, such as PMOS transistors, such as p-type finFETs.

Figure 3:
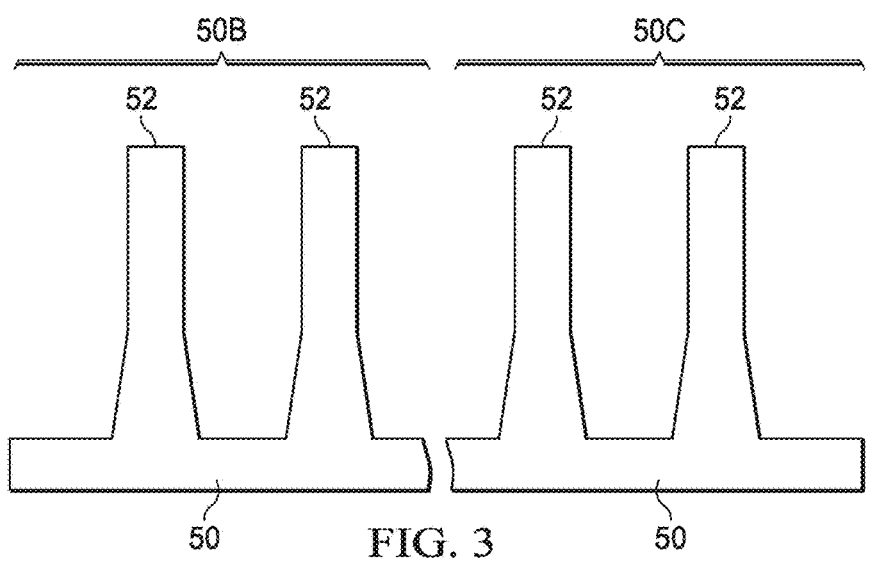
Figure 4:
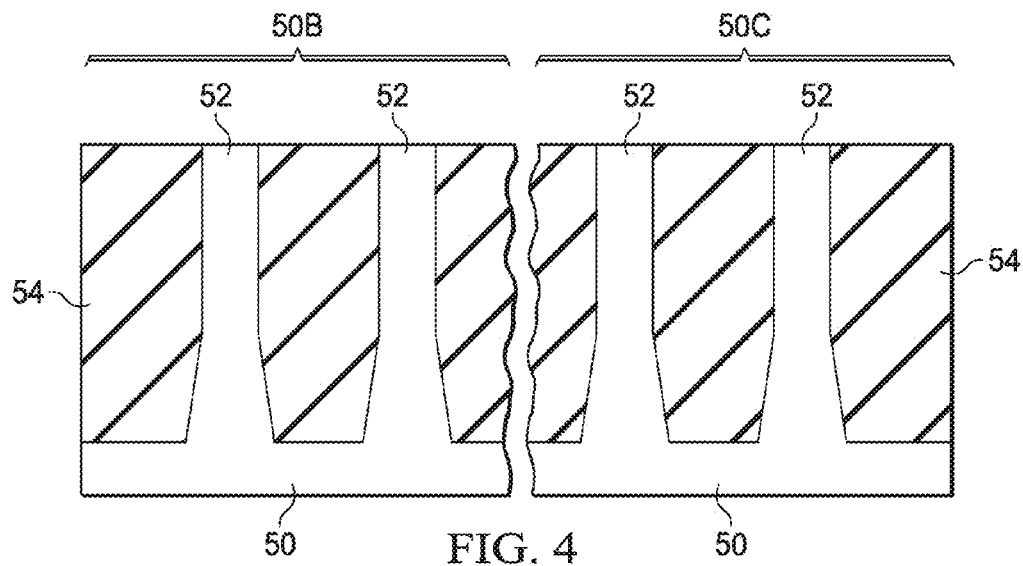

FIGS. 3 and 4 illustrate the formation of fins 52 and isolation regions 54 between neighboring fins 52. In FIG. 3 and in step 200, fins 52 are formed in the substrate 50. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

In FIG. 4 and step 202, an insulation material is formed between neighboring fins 52 to form the isolation regions 54. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material is silicon oxide formed by a FCVD process. An anneal process may be performed once the insulation material is formed. Further in FIG. 4 and in step 204, a planarization process, such as a chemical mechanical polish (CMP), may remove any excess insulation material and form top surfaces of the isolation regions 54 and top surfaces of the fins 52 that are co-planar.

Figure 5:
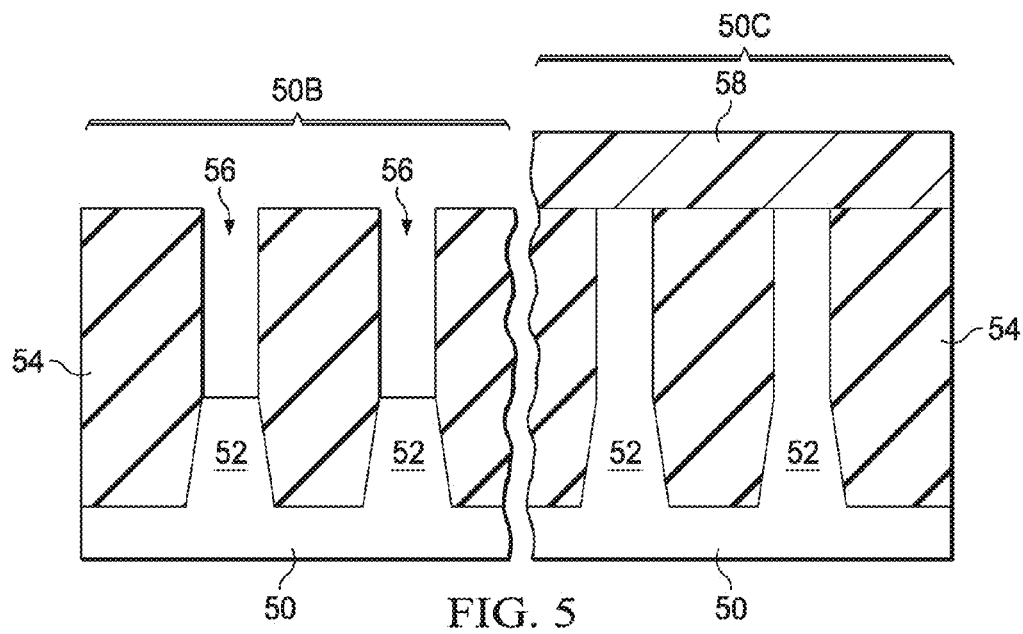

In FIG. 5 and step 206, a mask 58 is formed over the second region 50C of the substrate 50 while the first region 50B is exposed. The mask 58 may be a photoresist patterned by an acceptable photolithography process or the like. Further in FIG. 5 and in step 208, while the mask 58 is on the second region 50C, recesses 56 are formed in the fins 52 and/or the isolation regions 54 in the first region 50B. The recesses 56 may be formed by etching using any acceptable etch process, such as a RIE, NBE, tetramethylammonium hydroxide (TMAH), ammonium hydroxide (NH$_4$OH), a wet etchant capable of etching silicon with good etch selectivity between silicon and a material of the isolation regions 54, the like, or a combination thereof. The etch may be anisotropic. Surfaces of the fins 52 are exposed as at least portions of the bottom surfaces of the recesses 56. As illustrated, the bottom surfaces of the recesses 56 include all of top surfaces of the fins 52 after an etching process. In the illustrated embodiment, the top surfaces of the fins 52 are each planar. In other embodiments, the top surfaces of the fins 52 may have different configurations, some of which are discussed below.

Figure 6:
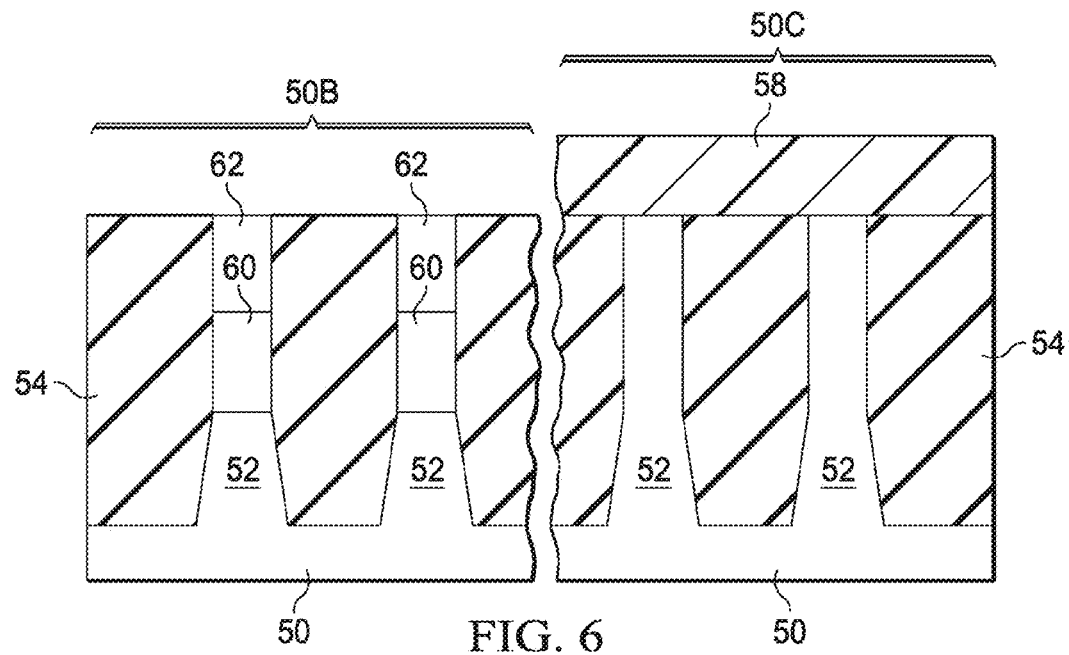

In FIG. 6 and step 210, epitaxial fins, or active areas, are formed in the recesses 56 in the first region 50B. In some embodiments, the epitaxial fins are formed by epitaxially growing a material in the recesses 56, such as by metal-organic CVD (MOCVD), molecular beam epitaxy (MBE), liquid phase epitaxy (LPE), vapor phase epitaxy (VPE), selective epitaxial growth (SEG), the like, or a combination thereof. As illustrated, each of the epitaxial fins in the first region 50B comprises a lower epitaxial portion 60 and an upper epitaxial portion 62. The lower epitaxial portions 60 are epitaxially grown on the top surfaces of the fins 52, and the upper epitaxial portions 62 are epitaxially grown on the lower epitaxial portions 60.

A material of the upper epitaxial portions 62 is different from a material of the lower epitaxial portions 60. In some embodiments, the different materials of the upper epitaxial portions 62 and the lower epitaxial portions 60 allow a significant portion of the lower epitaxial portions 60 to be converted to a dielectric material while the upper epitaxial portions 62 are not significantly converted to a dielectric material. In the illustrated embodiment, the lower epitaxial portions 60 are silicon germanium, where the concentration of germanium is equal to or greater than 10% (e.g., $Si_{1-x}Ge_x$, where x>=0.10), such as greater than 30%, and the upper epitaxial portions 62 are silicon. As will be discussed below, the silicon germanium of the lower epitaxial portions 60 may be converted to silicon germanium oxide by an oxidation process, while the silicon of the upper epitaxial portions 62 are not significantly converted to an oxide. In other embodiments, the epitaxial fins can comprise other material, such as silicon, silicon carbide, germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

The lower epitaxial portions 60 may be buffer layers. Further, the lower epitaxial portions 60 may be stress relaxation buffer layers. Stress relaxation buffer layers may be substantially relaxed when the material of the stress relaxation buffer layer is lattice mismatched to the material underlying the stress relaxation buffer layer, such as the material of the fins 52. The stress relaxation buffer layer may be substantially relaxed through plastic relaxation by dislocations being generated in the stress buffer layer and/or through elastic relaxation. The stress relaxation buffer layer may further induce a stress in an overlying material, such as the upper epitaxial portions 62. When a relaxed layer, such as a stress relaxation buffer layer, is lattice mismatched with an overlying layer, such as an upper epitaxial portion 62, the overlying layer may be stressed through pseudomorphic epitaxial growth. For example, assuming the lower epitaxial portion 60 is relaxed SiGe and the upper epitaxial portion 62 is silicon, the upper epitaxial portion 62 may be tensilely strained, which may be advantageous for n-type devices. Other material combinations may achieve a tensile strain in the upper epitaxial portion 62. In other embodiments, the upper epitaxial portion 62 may be compressively strained, which may be advantageous for p-type devices. Still in other embodiments, even when materials of a lower epitaxial portion 60 and an upper epitaxial portion 62 are lattice mismatched, the upper epitaxial portion 62 may be partially or substantially relaxed by plastic and/or elastic relaxation.

After the epitaxial fins in the first region 50B are formed, the mask 58 is removed. For example, if the mask 58 is a photoresist, the mask 58 may be removed by an appropriate ashing process, such as using an oxygen plasma. In other embodiments, the mask 58 may be removed using an etch, a CMP process, or the like. Further in FIG. 6 and in step 212, a planarization process, such as a CMP process, may be used to form the top surfaces of the epitaxial fins and the isolation regions 54 to be co-planar, for example, when the epitaxial fins are overgrown above the top surface of the isolation regions 54.

Figure 7:
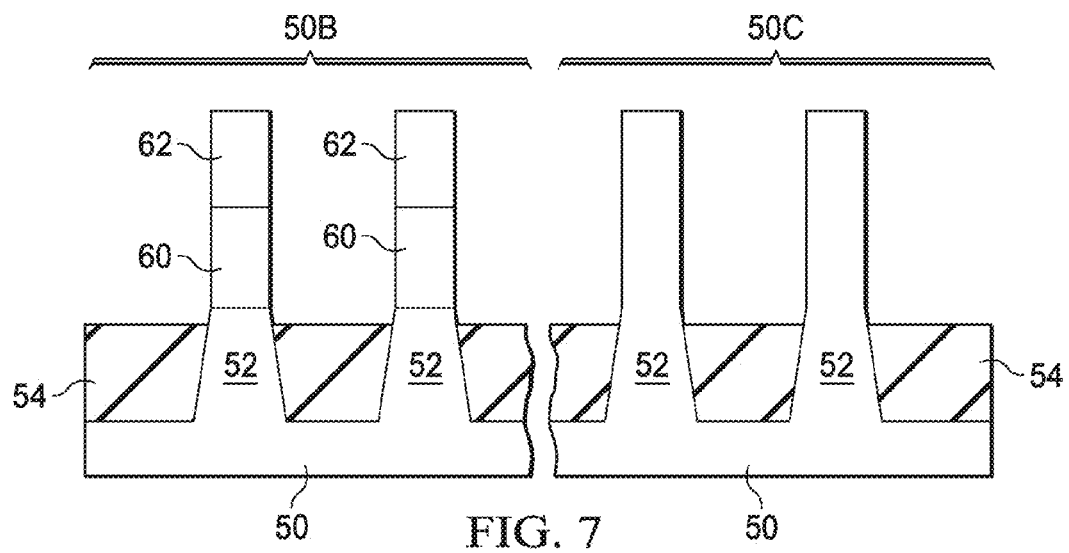

In FIG. 7 and step 214, the isolation regions 54 are recessed. The isolation regions 54 are recessed such that epitaxial fins in the first region 50B and the fins 52 in the second region 50C protrude from between neighboring isolation regions 54. As illustrated, the top surfaces of the isolation regions 54 are below bottom surfaces of the lower epitaxial portions 60 in the first region 50B. In other embodiments, the top surfaces of the isolation regions 54 may be at different positions. In some embodiments, the recessing of the isolation regions 54 facilitates conversion to a dielectric material, such as by oxidation, of the lower epitaxial portions 60. The depth to which the isolations regions 54 may be recessed may depend on a process used for such conversion, such as an oxidation process. If conversion can be achieved without recessing the isolation regions 54, the recessing can be omitted, for example. The isolation regions 54 may be recessed using an acceptable etching process, such as one that is selective to the material of the isolation regions 54. For example, a chemical oxide removal using a CERTAS® etch or an Applied Materials SICONI tool or dilute hydrofluoric (dHF) acid may be used.

Figure 8:
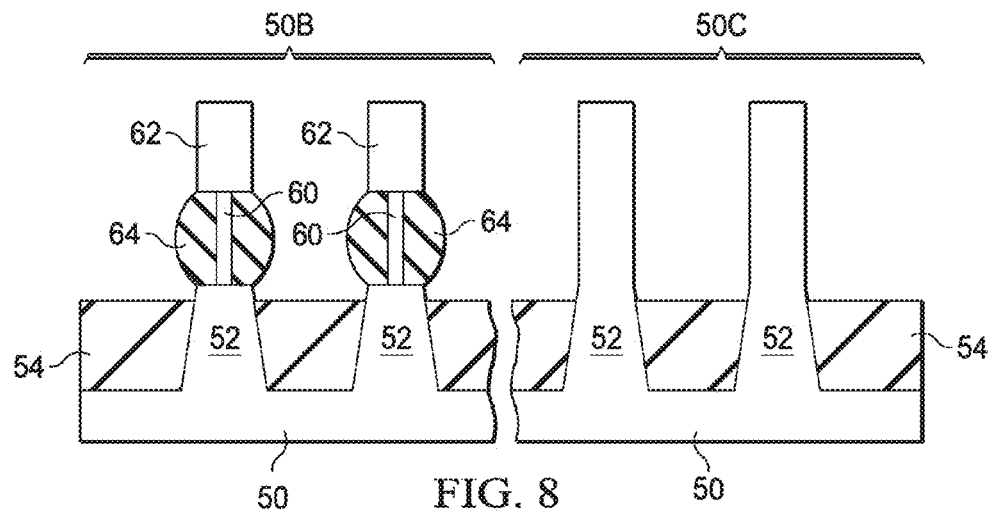

In FIG. 8 and step 216, the lower epitaxial portions 60 are converted to a dielectric material 64. In some embodiments, the conversion process is an oxidation process. The oxidation process may use a steam furnace. For example, the substrate 50 comprising the lower epitaxial portions 60 may be placed in a furnace such that the substrate 50 is exposed to a steam environment. The steam environment may be generated at a temperature between about 400° C. and about 600° C., such as about 500° C. Water ($H_2O$) steam may be provided flowing at a flow rate of between about 100 sccm and about 1000 sccm. The substrate 50 may be exposed to the steam environment in the furnace for a duration between about 0.5 hour and about 3 hour, such as about 1 hour. As illustrated in FIG. 8, when a steam environment is used for oxidation, the steam may reach the lower epitaxial portions 60 to convert the lower epitaxial portions 60 to a dielectric material 64. Other conversion processes may be used.

In some embodiments where the fins 52 are silicon, the lower epitaxial portions 60 are $Si_{1-x}Ge_x$, where $x>=0.10$, and the upper epitaxial portions 62 are silicon, as discussed above, and an oxidation process is used for the conversion, the lower epitaxial portions 60 may oxidize to form SiGeO faster than the fins 52 and the upper epitaxial portions 62 are oxidized, since germanium oxidizes at a greater rate than silicon. Hence, a significant portion of each lower epitaxial portion 60 may be oxidized while very little of the fins 52 and upper epitaxial portions 62 are oxidized.

In the illustrated embodiment in FIG. 8, the lower epitaxial portions 60 are converted to a dielectric material 64 to an extent such that a continuous region of the lower epitaxial portion 60 remains between the upper epitaxial portions 62 and respective fins 52. As will be discussed subsequently, the lower epitaxial portions 60 may be converted to a dielectric material 64 to an extent such that a discontinuous region of the lower epitaxial portion 60 remains.

Figure 9:
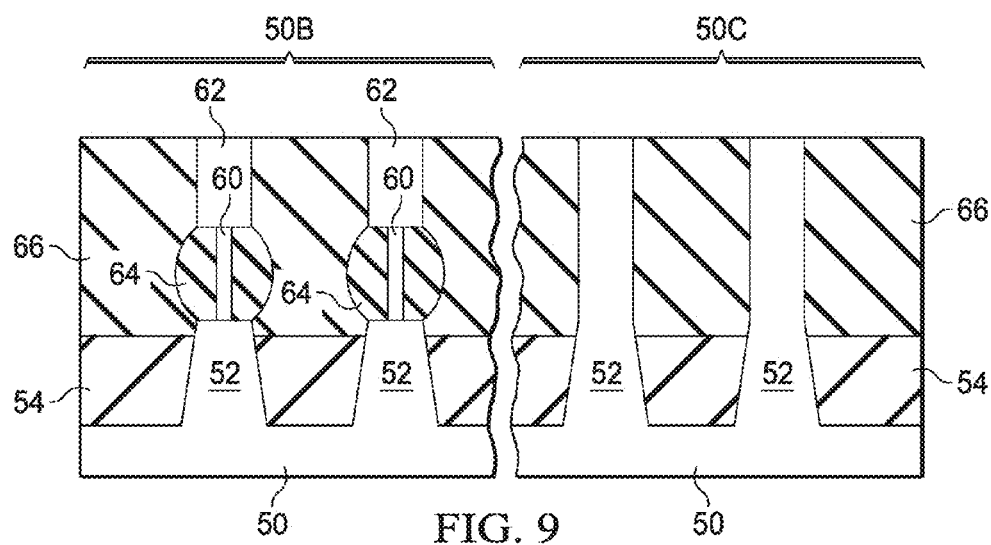

In FIG. 9 and step 218, an insulation material 66 is formed between neighboring epitaxial fins in the first region 50B and neighboring fins 52 in the second region 50C over the isolation regions 54. The insulation material 66 may be deposited when the isolation regions 54 were previously recessed, such as discussed with respect to FIG. 7. If the isolation regions 54 were not recessed, the insulation material 66 may be omitted, for example. The insulation material may be an oxide, such as silicon oxide, a nitride, the like, or a combination thereof, and may be formed by a HDP-CVD, a FCVD, the like, or a combination thereof. Other insulation materials formed by any acceptable process may be used. In the illustrated embodiment, the insulation material is silicon oxide formed by a FCVD process. An anneal process may be performed once the insulation material is formed. Further in FIG. 9 and in step 220, a planarization process, such as a CMP, may remove any excess insulation material and form top surfaces of the insulating material 66 and top surfaces of the epitaxial fins and fins 52 that are co-planar.

Figure 10:
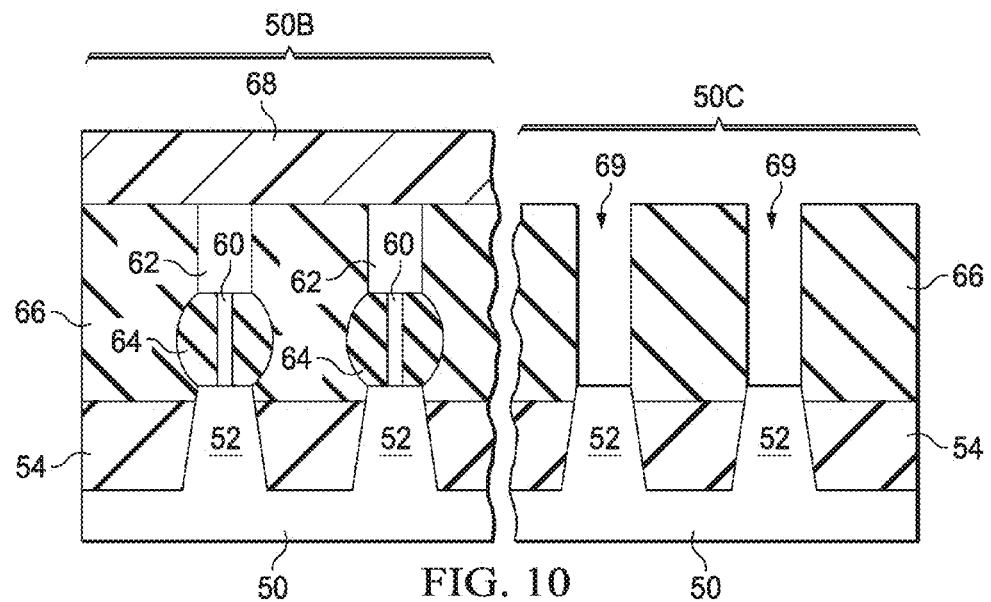

In FIG. 10 and step 222, a mask 68 is formed over the first region 50B of the substrate 50 while the second region 50C is exposed. The mask 68 may be a photoresist patterned by an acceptable photolithography process or the like. Further in FIG. 10 and in step 224, while the mask 68 is on the first region 50B, recesses 69 are formed in the fins 52 and/or the isolation regions 54 in the second region 50C. The recesses 69 may be formed by etching using any acceptable etch process, such as a RIE, NBE, TMAH, ammonium hydroxide, a wet etchant capable of etching silicon with good etch selectivity between silicon and a material of the isolation regions 54 and insulating material 66, the like, or a combination thereof. The etch may be anisotropic. Surfaces of the fins 52 are exposed as at least portions of the bottom surfaces of the recesses 69. As illustrated, the bottom surfaces of the recesses 69 include all of top surfaces of the fins 52 after an etching process. In the illustrated embodiment, the top surfaces of the fins 52 are each planar. In other embodiments, the top surfaces of the fins 52 may have different configurations, some of which are discussed below. The depth of the recesses 69 may depend on the structure subsequently formed in the recesses 69, as discussed in more detail below.

Figure 11:
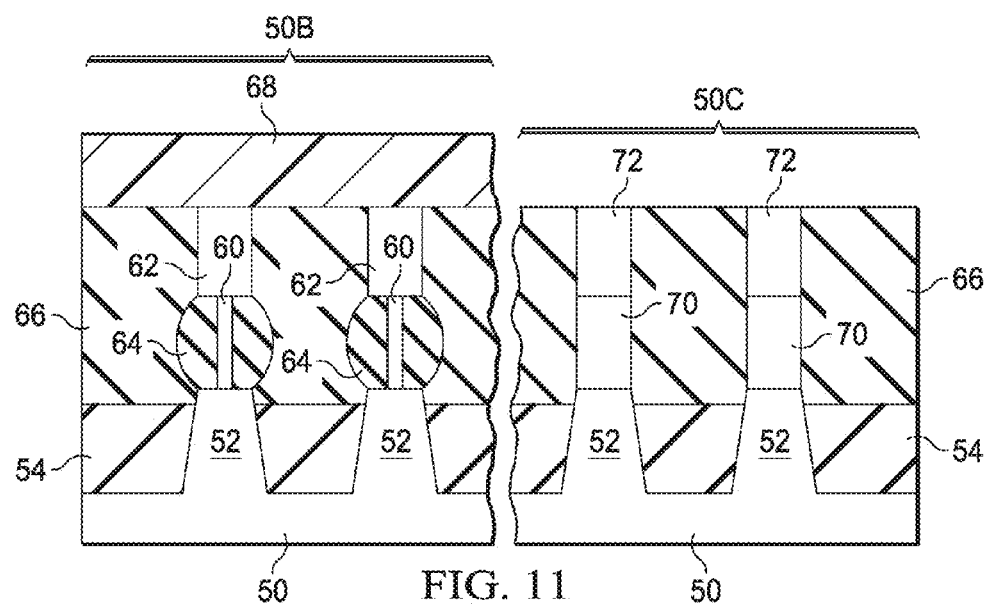

In FIG. 11 and step 226, epitaxial fins are formed in the recesses 69 in the second region 50C. In some embodiments, the epitaxial fins are formed by epitaxially growing a material in the recesses 69, such as by MOCVD, MBE, LPE, VPE, SEG, the like, or a combination thereof. As illustrated, each of the epitaxial fins in the second region 50C comprises a lower epitaxial portion 70 and an upper epitaxial portion 72. The lower epitaxial portions 70 are epitaxially grown on the top surfaces of the fins 52, and the upper epitaxial portions 72 are epitaxially grown on the lower epitaxial portions 60. In some embodiments, the lower epitaxial portions 70 may be omitted. In such embodiments, the depth of the recesses 69 may be lessened, and the upper epitaxial portions 72 may be epitaxially grown on the top surfaces of the fins in the second region 50C.

In some embodiments, the epitaxial fins, including the lower epitaxial portions 70 and upper epitaxial portions 72, can comprise as silicon, silicon carbide, silicon germanium, germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like. A material of the upper epitaxial portions 72 may be different from a material of the lower epitaxial portions 70.

The lower epitaxial portions 70 may be buffer layers. Further, the lower epitaxial portions 70 may be stress relaxation buffer layers, like the stress buffer layers previously discussed. Similar to that discussed above, an overlying layer, such as upper epitaxial portions 72, may have stress induced therein from the lattice mismatch with the stress buffer layer. The upper epitaxial portions 72 may be tensilely or compressively strained. Still in other embodiments, even when materials of a lower epitaxial portion 70 and an upper epitaxial portion 72 are lattice mismatched, the upper epitaxial portion 72 may be partially or substantially relaxed by plastic and/or elastic relaxation.

After the epitaxial fins in the second region 50C are formed, the mask 68 is removed. For example, if the mask 68 is a photoresist, the mask 68 may be removed by an appropriate ashing process, such as using an oxygen plasma. In other embodiments, the mask 68 may be removed using an etch, a CMP process, or the like. Further in FIG. 11 and in step 228, a planarization process, such as a CMP process, may be used to form the top surfaces of the epitaxial fins in the first region 50B and the second region 50C and the insulating material 66 and/or isolation regions 54 to be co-planar, for example, when the epitaxial fins are overgrown above the top surface of the insulating material 66 and/or isolation regions 54.

Figure 12:
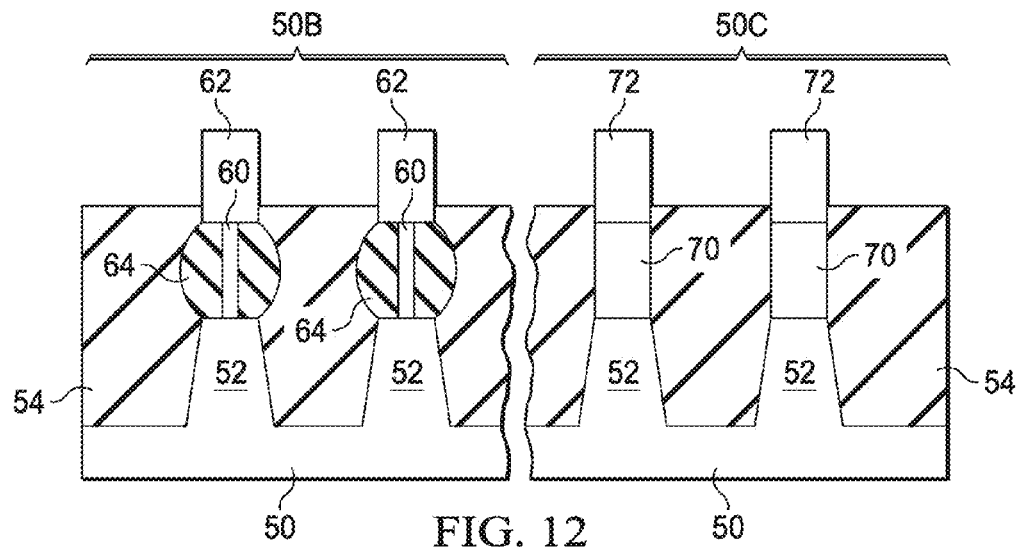

In FIG. 12 and step 230, the insulating material 66 and/or isolation regions 54 are recessed, such as to form Shallow Trench Isolation (STI) regions. The insulating material 66 and/or isolation regions 54 are recessed such that epitaxial fins in the first region 50B and in the second region 50C protrude from between neighboring insulating material 66 and/or isolation regions 54. For simplicity herein, isolation regions 54 are illustrated in the figures; however, the isolation regions 54 may include insulating material 66. As illustrated, the top surfaces of the isolation regions 54 are above top surfaces of the lower epitaxial portions 60 and dielectric material 64 in the first region 50B and above the lower epitaxial portions 70 in the second region 50C. In other embodiments, the top surfaces of the isolation regions 54 may be below top surfaces and above bottom surfaces of the lower epitaxial portions 60 and dielectric material 64 and below top surfaces and above bottom surfaces of the lower epitaxial portions 70, or the top surfaces of the isolation regions 54 may be below bottom surfaces of the lower epitaxial portions 60 and dielectric material 64 and bottom surfaces of the lower epitaxial portions 70. Further, the top surfaces of the isolation regions 54 may have a flat surface as illustrated, a convex surface, a concave surface (such as dishing), or a combination thereof. The top surfaces of the isolation regions 54 may be formed flat, convex, and/or concave by an appropriate etch. The isolation regions 54 may be recessed using an acceptable etching process, such as one that is selective to the material of the isolation regions 54. For example, a chemical oxide removal using a CERTAS® etch or an Applied Materials SICONI tool or dilute hydrofluoric (dHF) acid may be used.

Figure 13:
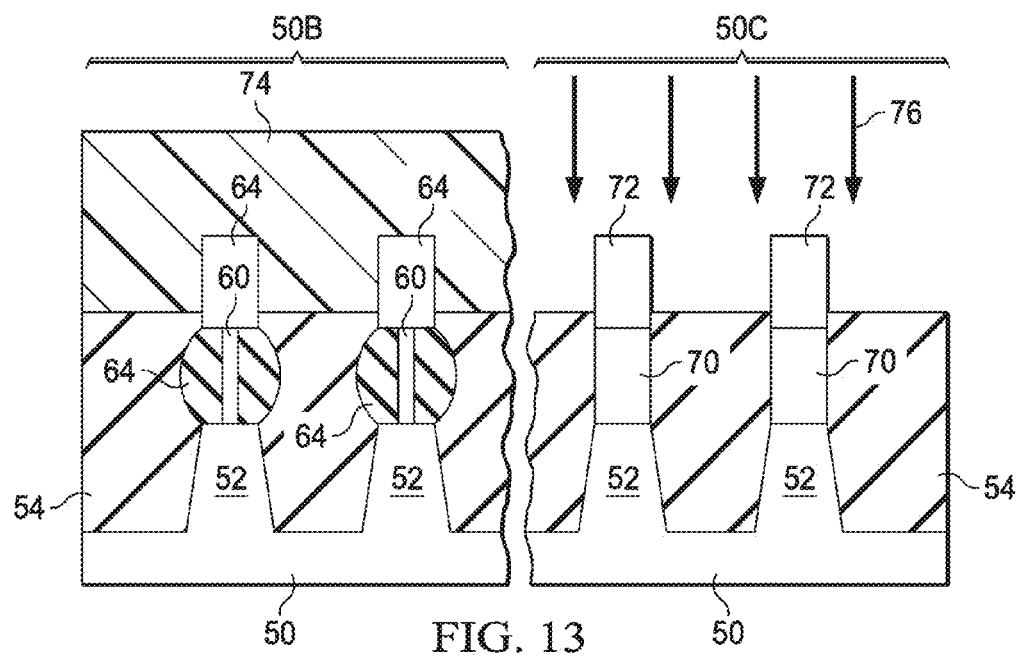
Figure 14:
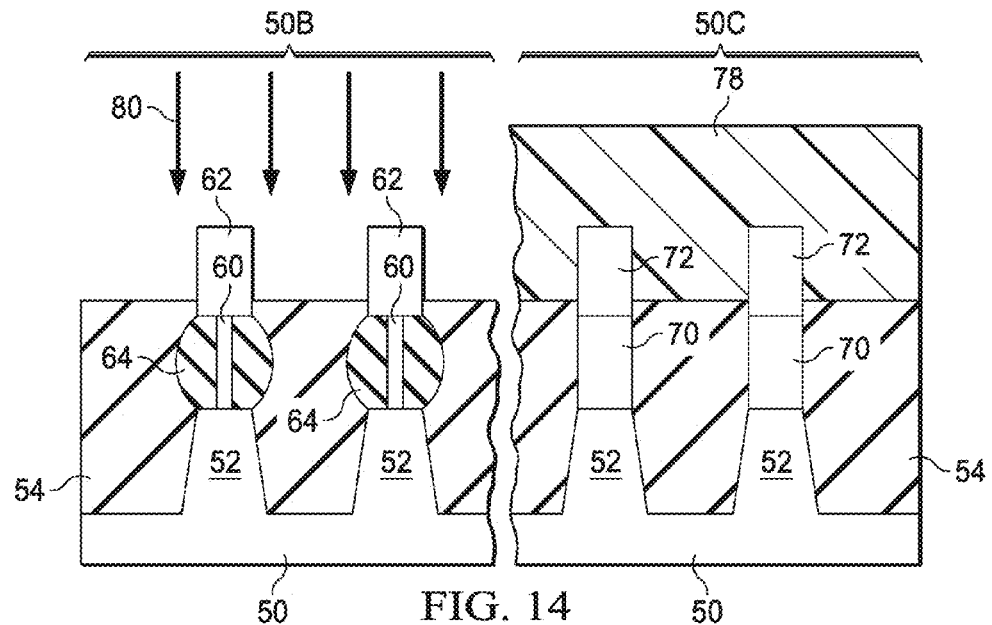

In FIGS. 13 and 14 and step 232, appropriate wells may be formed in the epitaxial fins, fins 52, and/or substrate 50. For example, a P well may be formed in the first region 50B, and an N well may be formed in the second region 50C.

As illustrated in FIG. 13, a photoresist 74 is formed over the epitaxial fins and the isolation regions 54 in the first region 50B. The photoresist 74 is patterned to expose the second region 50C of the substrate 50, such as a PMOS region. The photoresist 74 can be formed by using a spin-on technique and can be patterned using acceptable photolithography techniques. Once the photoresist 74 is patterned, an n-type impurity implant 76 is performed in the second region 50C, and the photoresist 74 may act as a mask to substantially prevent n-type impurities from being implanted into the first region 50B, such as an NMOS region. The n-type impurities may be phosphorus, arsenic, or the like implanted in the first region to a concentration of equal to or less than $10^{18}$ cm$^{-3}$, such as between about $10^{17}$ cm$^{-3}$ and about $10^{18}$ cm$^{-3}$. After the implant 76, the photoresist 74 is removed, such as by an acceptable ashing process.

As illustrated in FIG. 14, a photoresist 78 is formed over the epitaxial fins and the isolation regions 54 in the second region 50C. The photoresist 78 is patterned to expose the first region 50B of the substrate 50, such as the NMOS region. The photoresist 78 can be formed by using a spin-on technique and can be patterned using acceptable photolithography techniques. Once the photoresist 78 is patterned, a p-type impurity implant 80 may be performed in the first region 50B, and the photoresist 78 may act as a mask to substantially prevent p-type impurities from being implanted into the second region, such as the PMOS region. The p-type impurities may be boron, BF$_2$, or the like implanted in the first region to a concentration of equal to or less than $10^{18}$ cm$^{-3}$, such as between about $10^{17}$ cm$^{-3}$ and about $10^{18}$ cm$^{-3}$. After the implant 80, the second photoresist may be removed, such as by an acceptable ashing process.

After the implants 76 and 80, an anneal may be performed to activate the p-type and n-type impurities that were implanted. The implantations may form a p-well in the first region 50B, e.g., the NMOS region, and an n-well in the second region 50C, e.g., the PMOS region. In some embodiments, the grown materials of the epitaxial fins may be in situ doped during growth, which may obviate the implantations, although in situ and implantation doping may be used together.

A person having ordinary skill in the art will readily understand that the process described with respect to FIGS. 2 through 14 is just one example of how epitaxial fins may be formed. In other embodiments, a dielectric layer can be formed over a top surface of the substrate 50; trenches can be etched through the dielectric layer; the epitaxial fins can be epitaxially grown in the trenches; and the dielectric layer can be recessed such that the homoepitaxial and/or heteroepitaxial structures protrude from the dielectric layer to form epitaxial fins. As discussed above, it may be advantageous to epitaxially grow a material or epitaxial fin structure in the NMOS region different from the material or epitaxial fin structure in the PMOS region.

Figure 15:
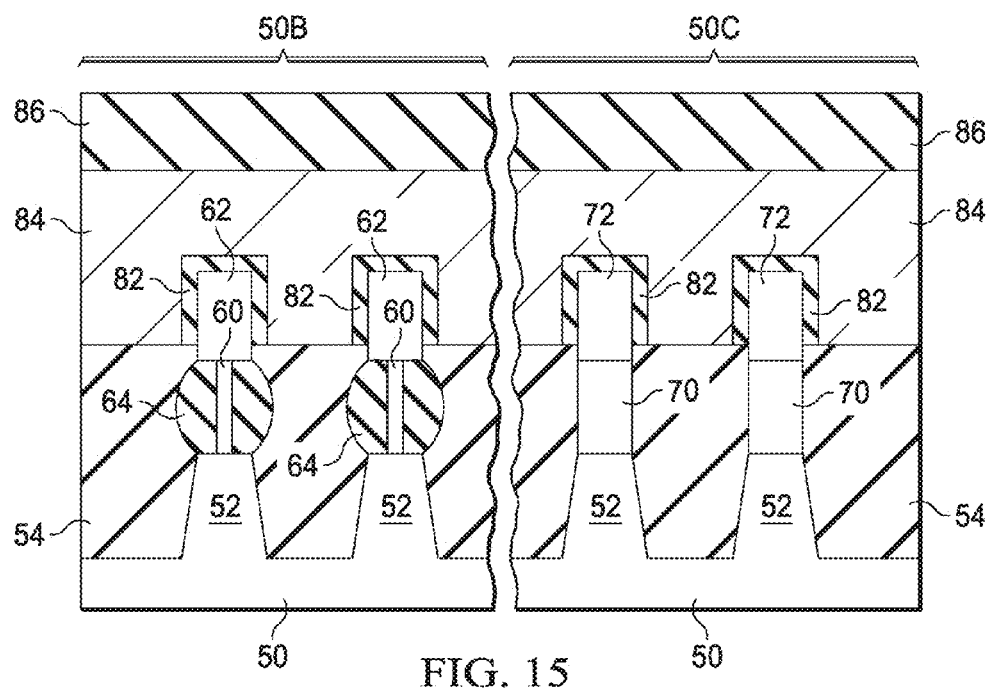

In FIG. 15 and step 234, a dummy dielectric layer 82 is formed on the epitaxial fins. The dummy dielectric layer 82 may be, for example, silicon oxide, silicon nitride, a combination thereof, or the like, and may be deposited or thermally grown according to acceptable techniques. A dummy gate layer 84 is formed over the dummy dielectric layer 82, and a mask layer 86 is formed over the dummy gate layer 84. The dummy gate layer 84 may be deposited over the dummy dielectric layer 82 and then planarized, such as by a CMP. The mask layer 86 may be deposited over the dummy gate layer 84. The dummy gate layer 84 may be comprise, for example, polysilicon, although other materials that have a high etching selectivity from the etching of isolation regions 54 may also be used. The mask layer 86 may comprise, for example, silicon nitride or the like. In this example, a single dummy gate layer 84 and a single mask layer 86 are formed across the first region 50B and the second region 50C. In other embodiments, separate dummy gate layers may be formed in the first region 50B and the second region 50C, and separate mask layers may be formed in the first region 50B and the second region 50C.

Figure 16A:
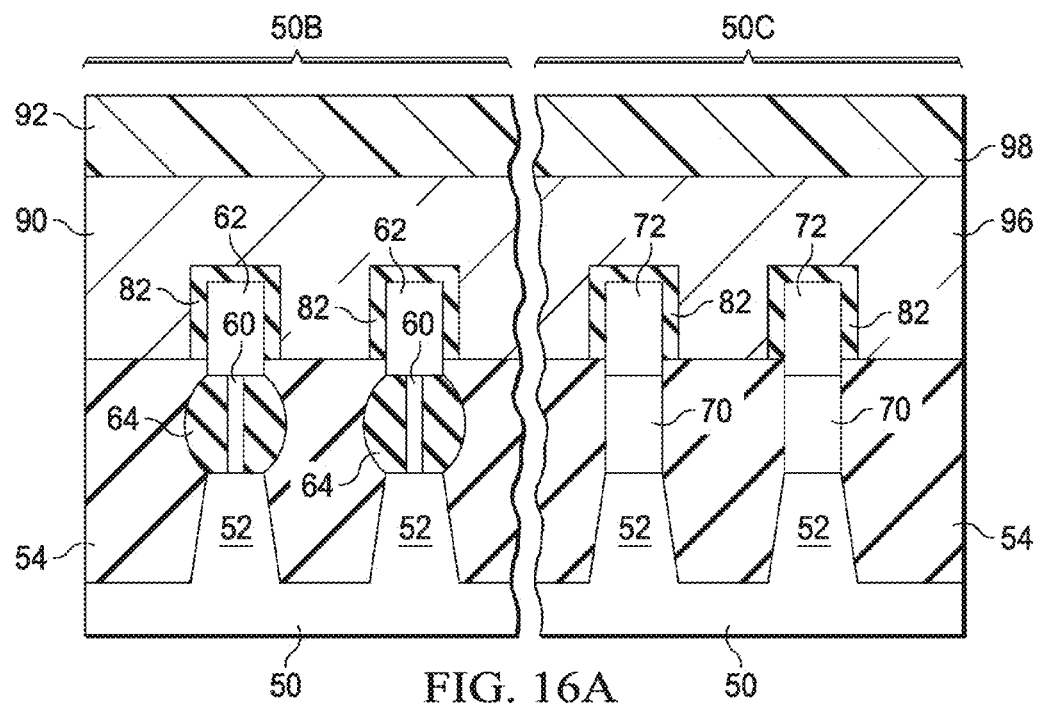
Figure 16B:
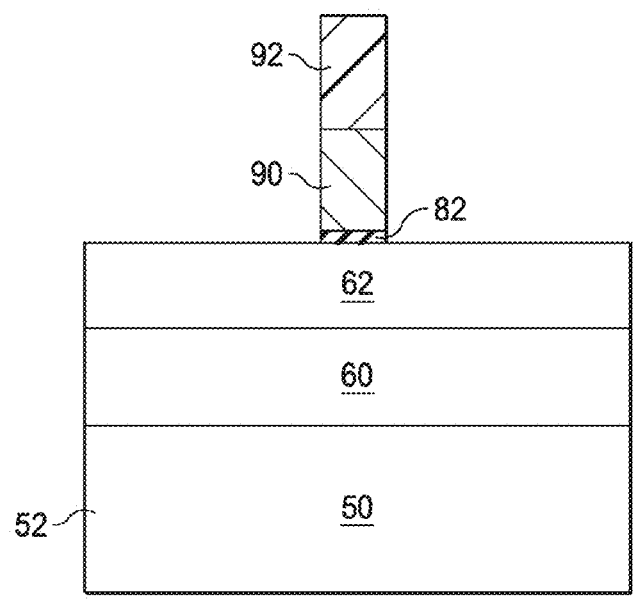
Figure 16C:
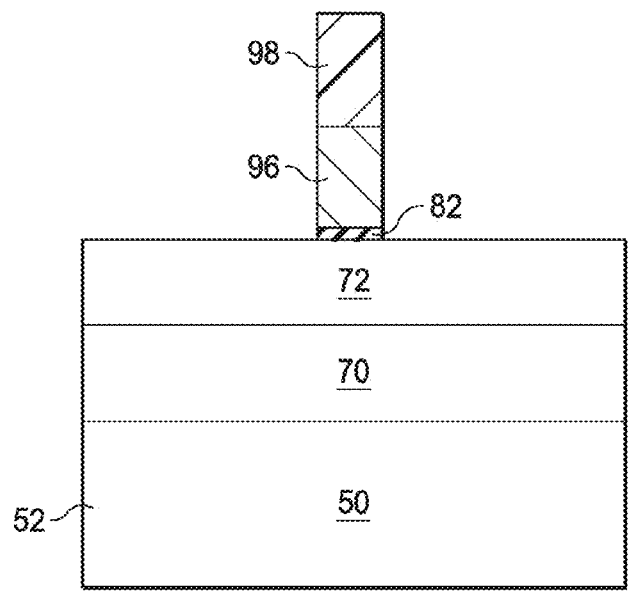

In FIGS. 16A, 16B, and 16C and continuing in step 234, the mask layer 86 may be patterned using acceptable photolithography and etching techniques to form masks 92 in the first region 50B (as illustrated in FIG. 16B) and masks 98 in the second region 50C (as illustrated in FIG. 16C). The pattern of the masks 92 and 98 then may be transferred to the dummy gate layer 84 and dummy dielectric layer 82 by an acceptable etching technique to form dummy gates 90 in the first region 50B and dummy gates 96 in the second region 50C. The dummy gates 90 and 96 cover respective channel regions of the epitaxial fins. The dummy gates 90 and 96 may also have a lengthwise direction substantially perpendicular to the lengthwise direction of respective epitaxial fins.

Figure 17A:
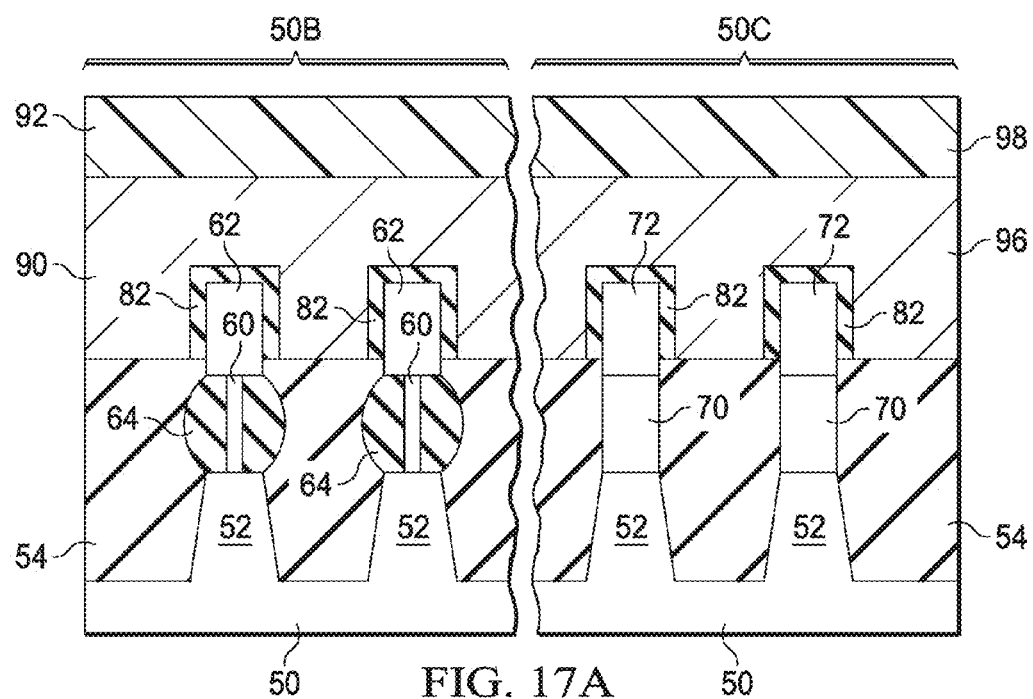
Figure 17B:
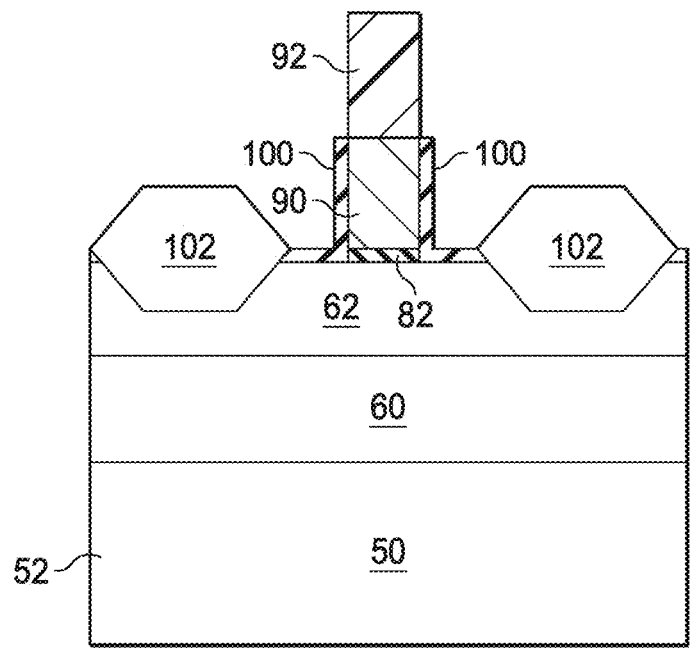
Figure 17C:
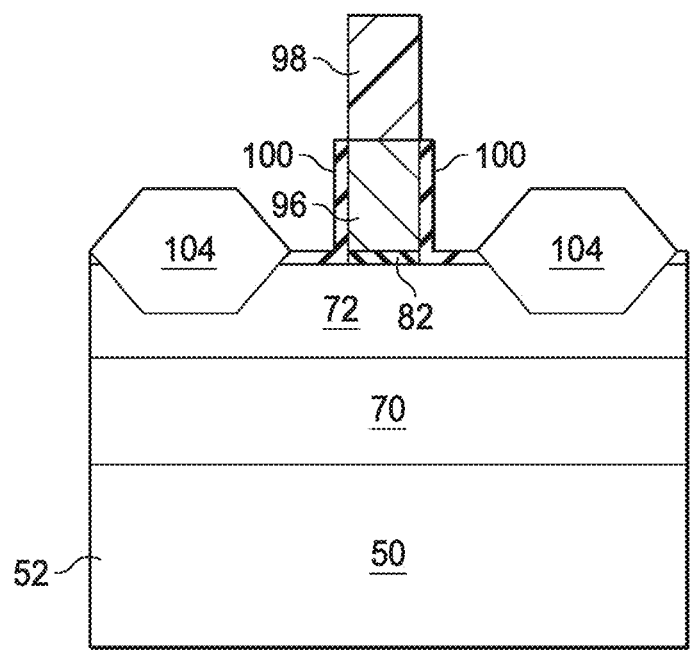

In FIGS. 17A, 17B, and 17C and step 236, gate seal spacers 100 can be formed on exposed surfaces of respective dummy gates 90 and 96 and/or upper epitaxial portions 62 and 72. A thermal oxidation or a deposition followed by an anisotropic etch may form the gate seal spacers 100.

In step 238, implants for lightly doped source/drain (LDD) regions may be performed. Similar to the implants discussed above in FIGS. 13 and 14, a mask, such as a photoresist, may be formed over the first region 50B, e.g., NMOS region, while exposing the second region 50C, e.g., PMOS region, and p-type impurities may be implanted into the exposed epitaxial fins in the second region 50C. The mask may then be removed. Subsequently, a mask, such as a photoresist, may be formed over the second region 50C while exposing the first region 50B, and n-type impurities may be implanted into the exposed epitaxial fins in the first region 50B. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{16}$ cm$^{-3}$. An anneal may be used to activate the implanted impurities.

Further in FIGS. 17A, 17B, and 17C and in step 240, epitaxial source/drain regions 102 and 104 are formed in the epitaxial fins. In the first region 50B, epitaxial source/drain regions 102 are formed in the upper epitaxial portions 62 such that each dummy gate 90 is disposed between respective neighboring pairs of the epitaxial source/drain regions 102. In some embodiments that epitaxial source/drain regions 102 may extend into the lower epitaxial portions 60. In the second region 50C, epitaxial source/drain regions 104 are formed in the upper epitaxial portions 72 such that each dummy gate 96 is disposed between respective neighboring pairs of the epitaxial source/drain regions 104. In some embodiments that epitaxial source/drain regions 104 may extend into the lower epitaxial portions 70.

Epitaxial source/drain regions 102 in the first region 50B, e.g., the NMOS region, may be formed by masking the second region 50C, e.g., the PMOS region, and conformally depositing a dummy spacer layer in the first region 50B followed by an anisotropic etch to form dummy gate spacers (not shown) along sidewalls of the dummy gates 90 and/or gate seal spacers 100 in the first region 50B. Then, source/drain regions of the epitaxial fins in the first region 50B are etched to form recesses. The epitaxial source/drain regions 102 in the first region 50B are epitaxially grown in the recesses. The epitaxial source/drain regions 102 may comprise any acceptable material, such as appropriate for n-type finFETs. For example, if the upper epitaxial portion 62 is silicon, the epitaxial source/drain regions 102 may comprise silicon, SiC, SiCP, SiP, or the like. The epitaxial source/drain regions 102 may have surfaces raised from respective surfaces of the upper epitaxial portions 62 and may have facets. Subsequently, the dummy gate spacers in the first region 50B are removed, for example, by an etch, as is the mask on the second region 50C.

Epitaxial source/drain regions 104 in the second region 50C, e.g., the PMOS region, may be formed by masking the first region 50B, e.g., the NMOS region, and conformally depositing a dummy spacer layer in the second region 50C followed by an anisotropic etch to form dummy gate spacers (not shown) along sidewalls of the dummy gates 96 and/or gate seal spacers 100 in the second region 50C. Then, source/drain regions of the epitaxial fins in the second region 50C are etched to form recesses. The epitaxial source/drain regions 104 in the second region 50C are epitaxially grown in the recesses. The epitaxial source/drain regions 104 may comprise any acceptable material, such as appropriate for p-type finFETs. For example, if the upper epitaxial portion 72 is silicon, the epitaxial source/drain regions 104 may comprise SiGe, SiGeB, Ge, GeSn, or the like. The epitaxial source/drain regions 104 may have surfaces raised from respective surfaces of the upper epitaxial portions 72 and may have facets. Subsequently, the dummy gate spacers in the second region 50C are removed, for example, by an etch, as is the mask on the first region 50B.

Figure 18A:
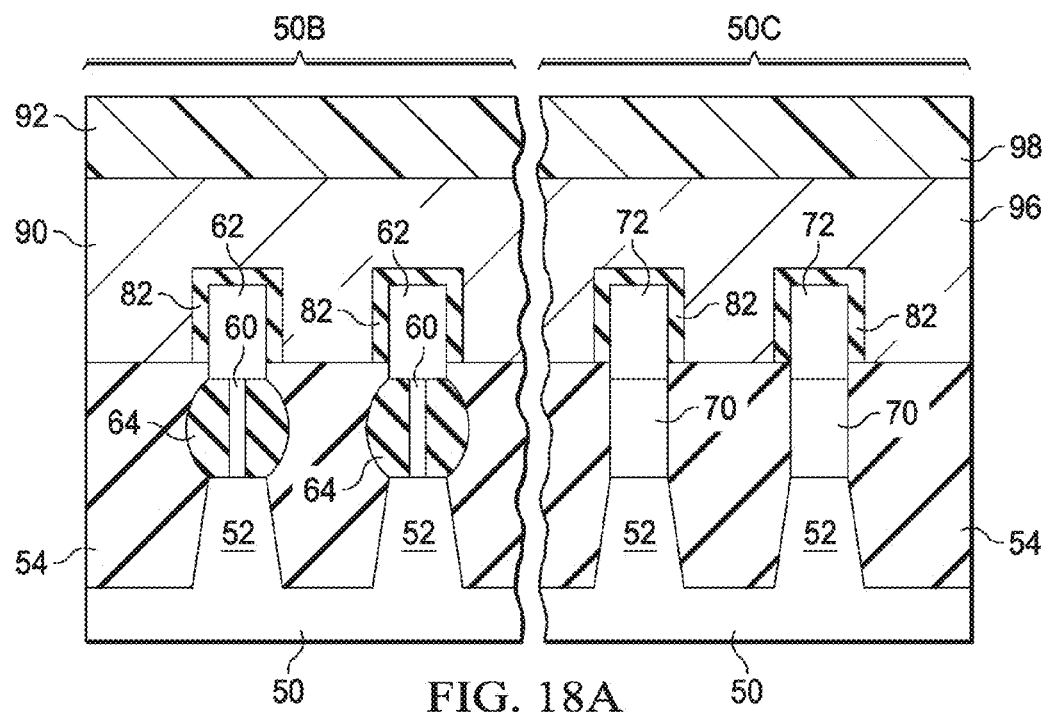
Figure 18B:
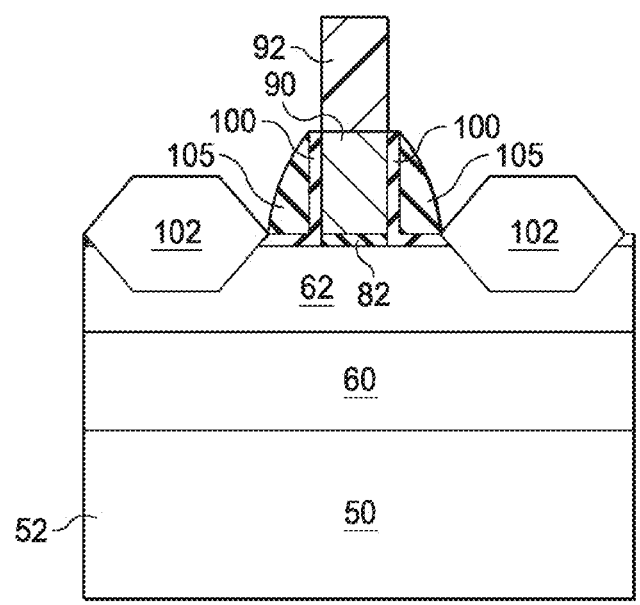
Figure 18C:
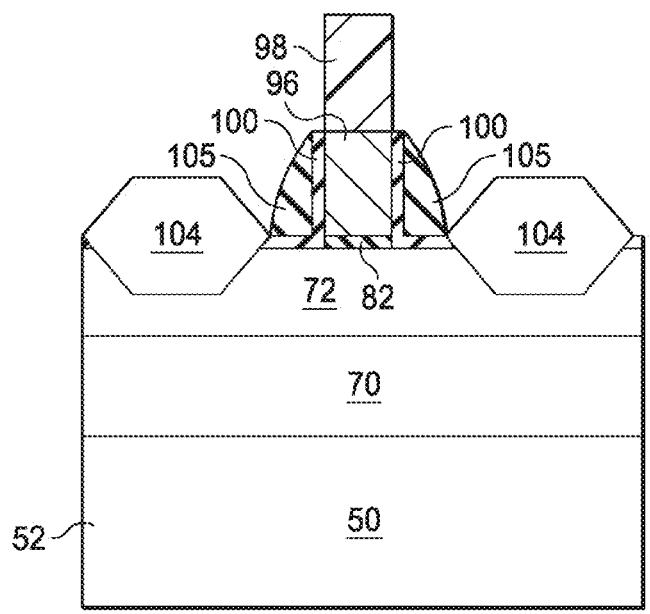

In FIGS. 18A, 18B, and 18C and step 242, gate spacers 105 are formed on the gate seal spacers 100 along sidewalls of the dummy gates 90 and 96. The gate spacers 105 may be formed by conformally depositing a material and subsequently anisotropically etching the material. The material of the gate spacers 105 may be silicon nitride, SiCN, a combination thereof, or the like.

The epitaxial source/drain regions 102 and 104 and/or epitaxial fins may be implanted with dopants to form source/drain regions, similar to the process previously discussed for forming lightly doped source/drain regions, followed by an anneal. The source/drain regions may have an impurity concentration of between about $10^{19}$ cm$^{-3}$ and about $10^{21}$ cm$^{-3}$. The n-type impurities for source/drain regions in the first region 50B, e.g., the NMOS region, may be any of the n-type impurities previously discussed, and the p-type impurities for source/drain regions in the second region 50C, e.g., the PMOS region, may be any of the p-type impurities previously discussed. In other embodiments, the epitaxial source/drain regions 102 and 104 may be in situ doped during growth.

Figure 19A:
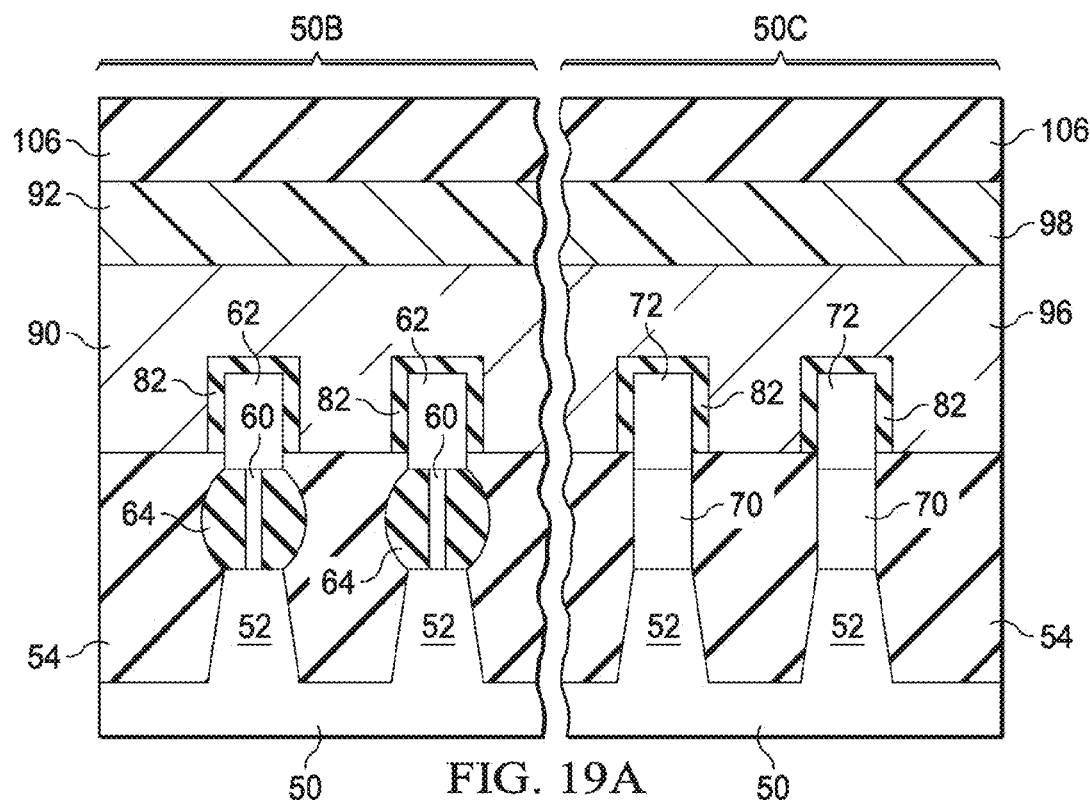
Figure 19B:
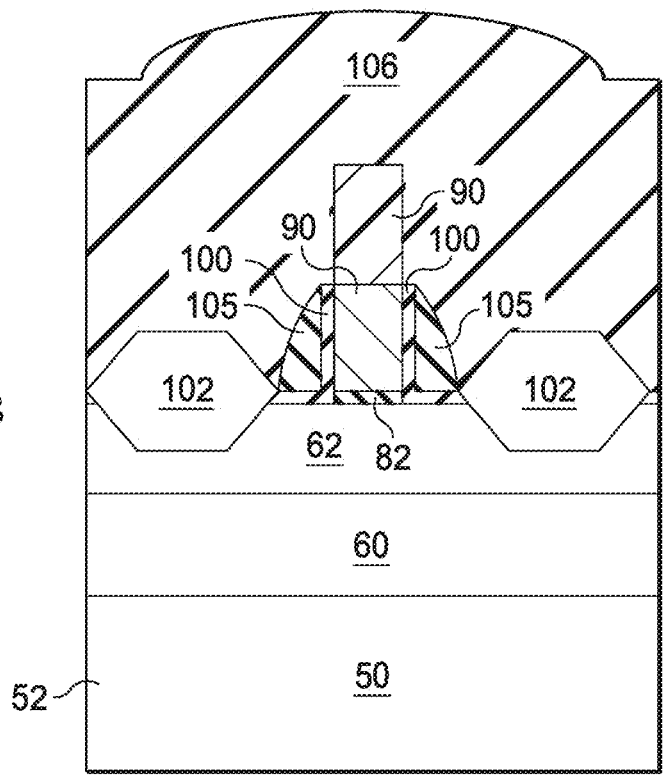
Figure 19C:
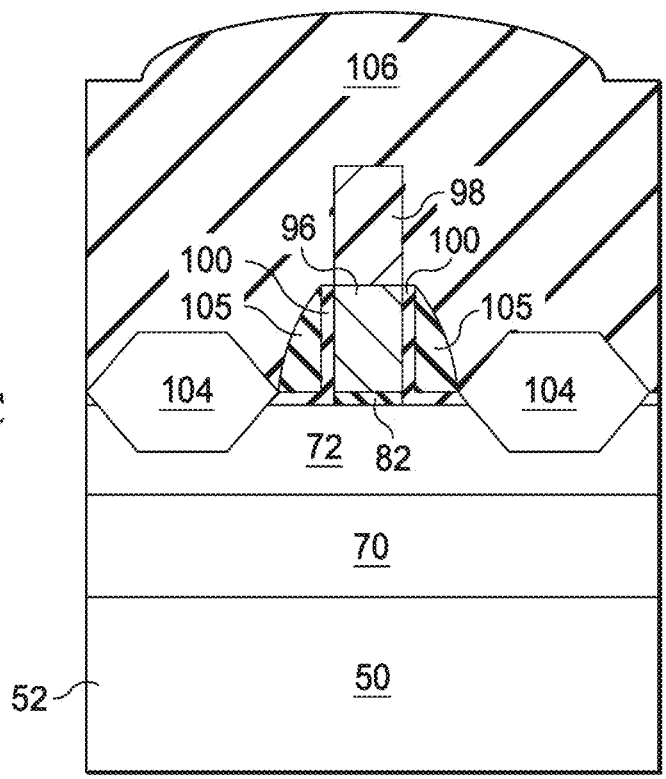

In FIGS. 19A, 19B, and 19C and step 244, an Inter-Layer Dielectric (ILD) 106 is deposited over the structure illustrated in FIGS. 18A, 18B, and 18C. ILD 106 is formed of a dielectric material such as Phospho-Silicate Glass (PSG), Boro-Silicate Glass (BSG), Boron-Doped Phospho-Silicate Glass (BPSG), undoped Silicate Glass (USG), or the like, and may be deposited by any suitable method, such as chemical vapor deposition (CVD), plasma-enhanced CVD (PECVD), or FCVD.

Figure 20A:
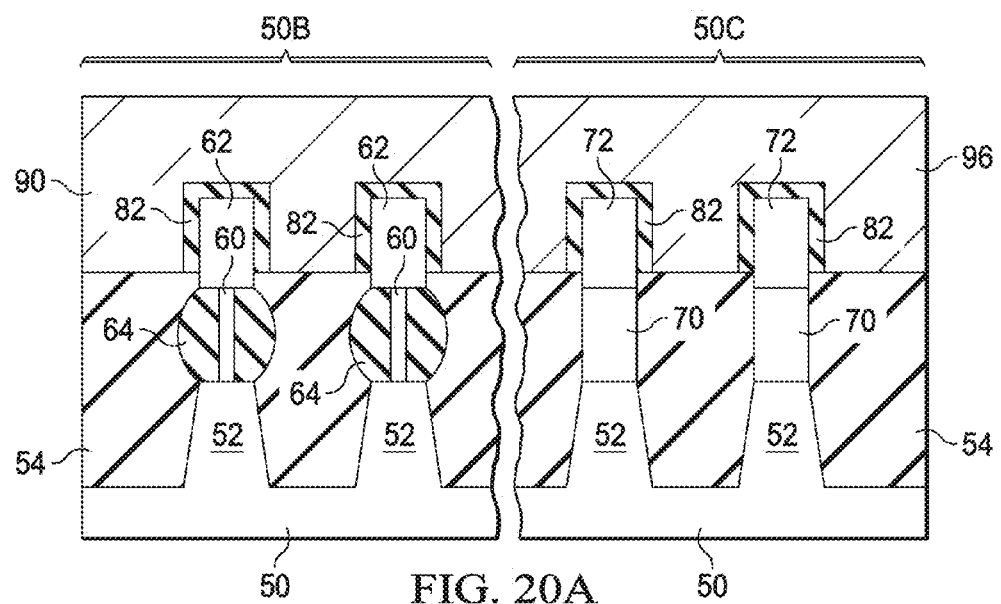
Figure 20B:
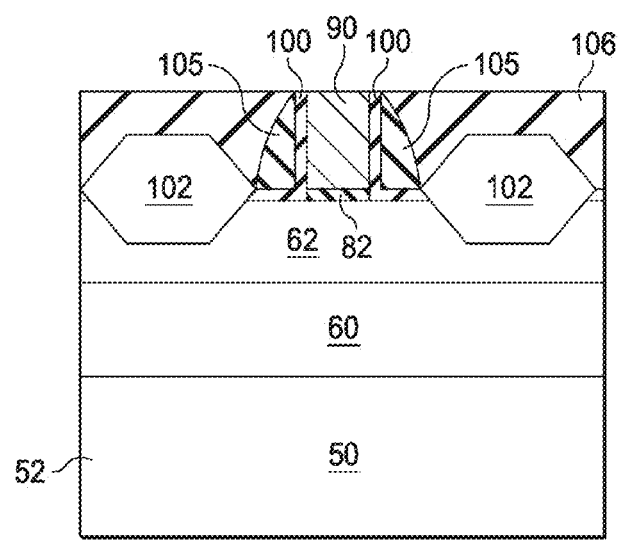
Figure 20C:
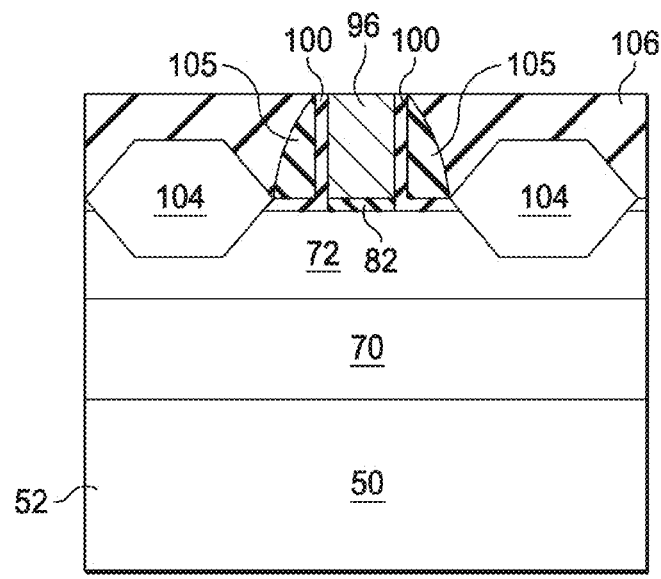

In FIGS. 20A, 20B, and 20C and step 246, a planarization process, such as a CMP, may be performed to level the top surface of ILD 106 with the top surfaces of the dummy gates 90 and 96. The CMP may also remove the masks 92 and 98 on the dummy gates 90 and 96. Accordingly, top surfaces of the dummy gates 90 and 96 are exposed through the ILD 106.

Figure 21A:
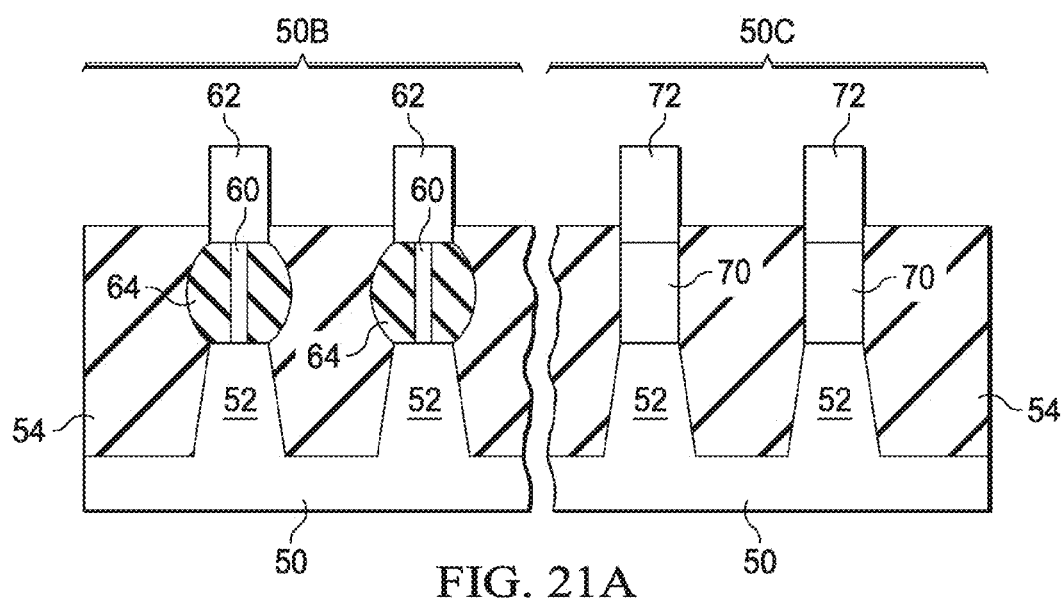
Figure 21B:
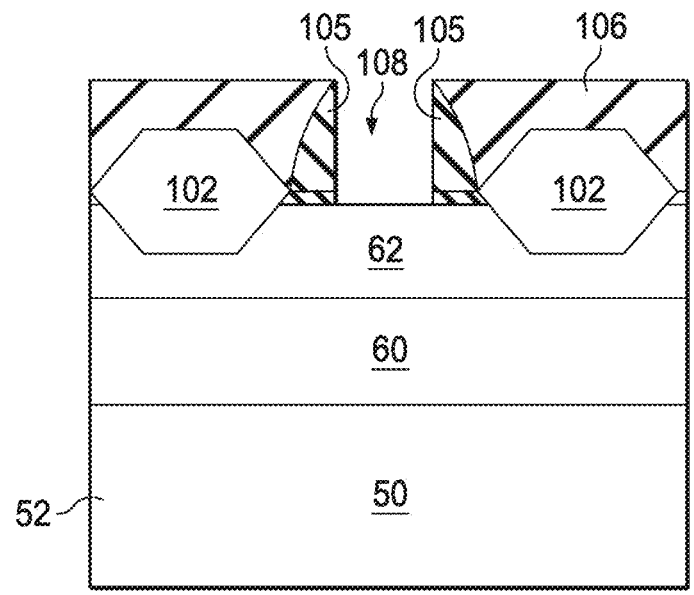
Figure 21C:
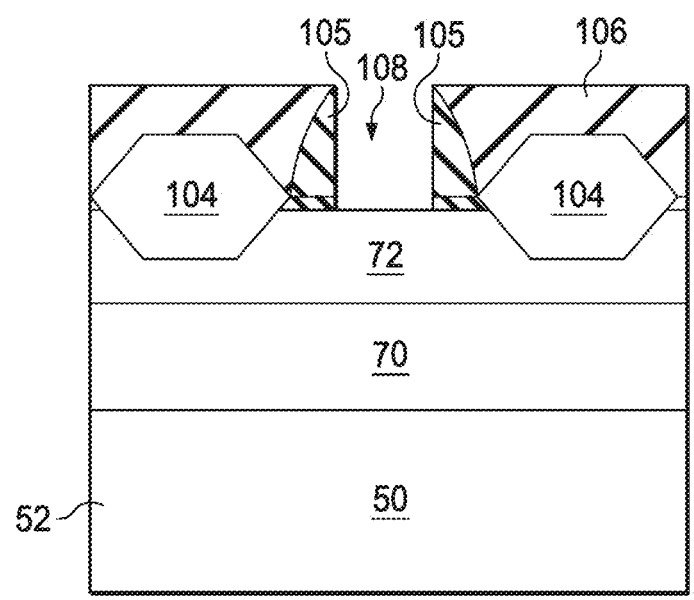

In FIGS. 21A, 21B, and 21C and step 248, the dummy gates 90 and 96, gate seal spacers 100, and portions of the dummy dielectric layer 82 directly underlying the dummy gates 90 and 96 are removed in an etching step(s), so that recesses 108 are formed. Each recess 108 exposes a channel region of a respective epitaxial fin. Each channel region is disposed between neighboring pairs of epitaxial source/drain regions 102 and 104. During the removal, the dummy dielectric layer 82 may be used as an etch stop layer when the dummy gates 90 and 96 are etched. The dummy dielectric layer 82 and gate seal spacers 100 may then be removed after the removal of the dummy gates 90 and 96.

Figure 22A:
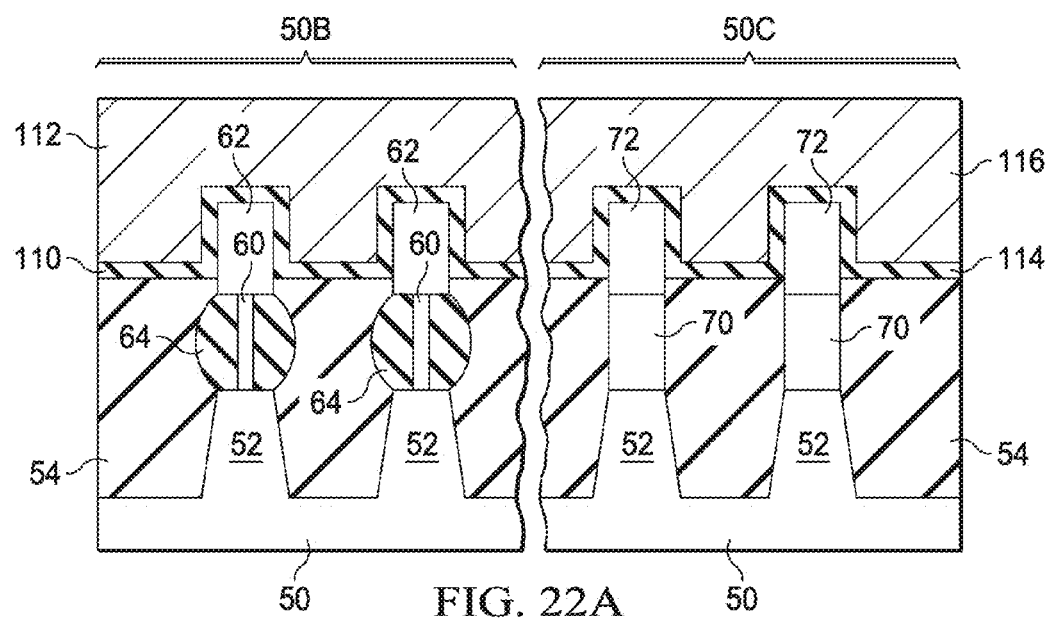
Figure 22B:
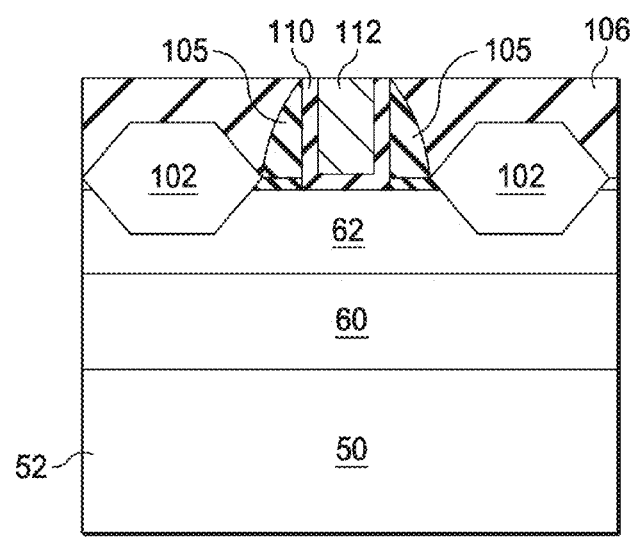
Figure 22C:
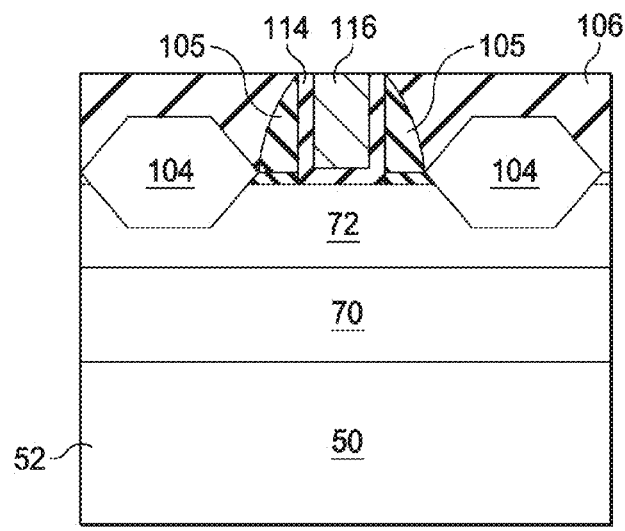

In FIGS. 22A, 22B, and 22C and step 250, gate dielectric layers 110 and 114 and gate electrodes 112 and 116 are formed for replacement gates. Gate dielectric layers 110 and 114 are deposited conformally in recesses 108, such as on the top surfaces and the sidewalls of the epitaxial fins and on sidewalls of the gate spacers 105, and on a top surface of the ILD 106. In accordance with some embodiments, gate dielectric layers 110 and 114 comprise silicon oxide, silicon nitride, or multilayers thereof. In other embodiments, gate dielectric layers 110 and 114 comprise a high-k dielectric material, and in these embodiments, gate dielectric layers 110 and 114 may have a k value greater than about 7.0, and may include a metal oxide or a silicate of Hf, Al, Zr, La, Mg, Ba, Ti, Pb, and combinations thereof. The formation methods of gate dielectric layers 110 and 114 may include Molecular-Beam Deposition (MBD), Atomic Layer Deposition (ALD), PECVD, and the like.

Next, gate electrodes 112 and 116 are deposited over gate dielectric layers 110 and 114, respectively, and fill the remaining portions of the recesses 108. Gate electrodes 112 and 116 may comprise a metal-containing material such as TiN, TaN, TaC, Co, Ru, Al, combinations thereof, or multilayers thereof. After the filling of gate electrodes 112 and 116, in step 252, a planarization process, such as a CMP, may be performed to remove the excess portions of gate dielectric layers 110 and 114 and the material of gate electrodes 112 and 116, which excess portions are over the top surface of ILD 106. The resulting remaining portions of material of gate electrodes 112 and 116 and gate dielectric layers 110 and 114 thus form replacement gates of the resulting finFETs.

The formation of the gate dielectric layers 110 and 114 may occur simultaneously such that the gate dielectric layers 110 and 114 comprise the same materials, and the formation of the gate electrodes 112 and 116 may occur simultaneously such that the gate electrodes 112 and 116 comprise the same materials. However, in other embodiments, the gate dielectric layers 110 and 114 may be formed by distinct processes, such that the gate dielectric layers 110 and 114 may comprise different materials, and the gate electrodes 112 and 116 may be formed by distinct processes, such that the gate electrodes 112 and 116 may comprise different materials. Various masking steps may be used to mask and expose appropriate regions when using distinct processes.

In FIGS. 23A, 23B, and 23C, an ILD 118 is deposited over ILD 106 in step 254, and contacts 120 and 122 are formed through ILD 118 and ILD 106 in step 256. ILD 118 is formed of a dielectric material such as PSG, BSG, BPSG, USG, or the like, and may be deposited by any suitable method, such as CVD and PECVD. Openings for contacts 120 and 122 are formed through the ILDs 106 and 118. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, aluminum, nickel, or the like. A planarization process, such as a CMP, may be performed to remove excess material from a surface of the ILD 118. The remaining liner and conductive material form contacts 120 and 122 in the openings. An anneal process may be performed to form a silicide at the interface between the epitaxial source/drain regions 102 and 104 and the contacts 120 and 122, respectively. Contacts 120 are physically and electrically coupled to the epitaxial source/drain regions 102, and contacts 122 are physically and electrically coupled to the epitaxial source/drain regions 104.

Although not explicitly shown, a person having ordinary skill in the art will readily understand that further processing steps may be performed on the structure in FIGS. 23A, 23B, and 23C. For example, various Inter-Metal Dielectrics (IMD) and their corresponding metallizations may be formed over ILD 118.

Figure 25:
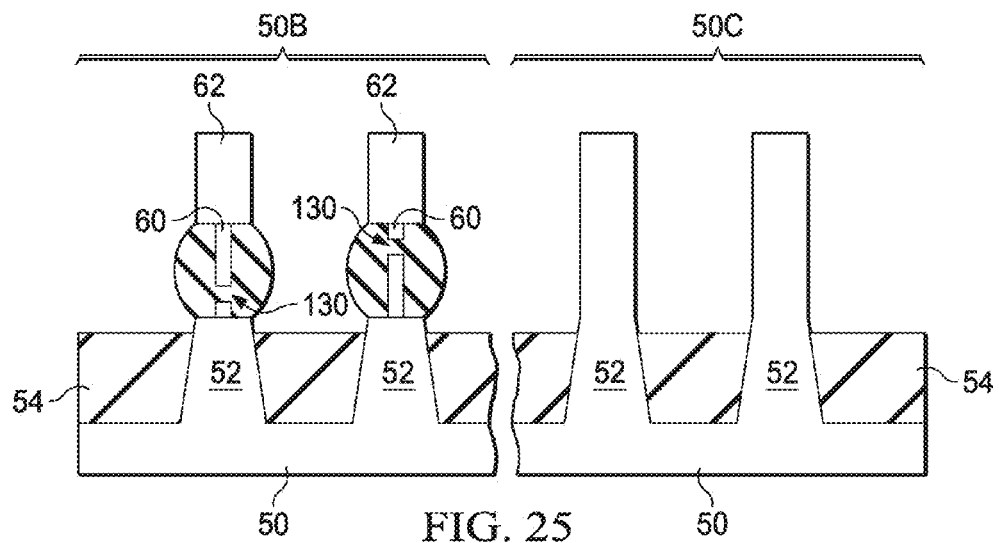
FIGS. 25 and 26A-C are cross-sectional views of intermediate stages comprising a modification in the manufacturing of finFETs in accordance with some embodiments.
Figure 26A:
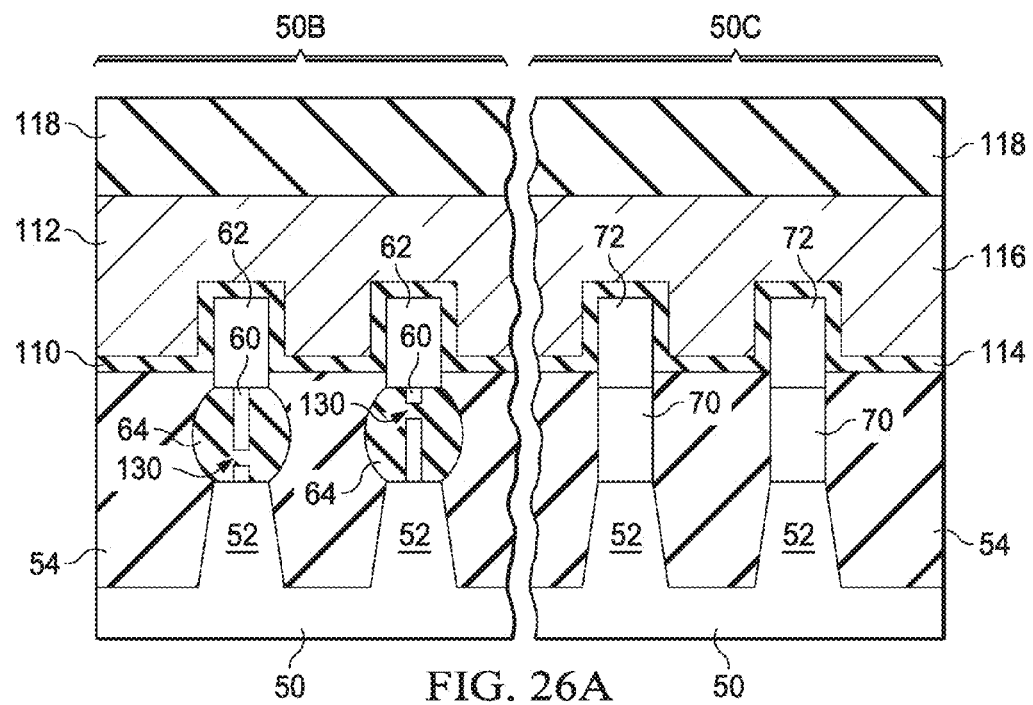
Figure 26B:
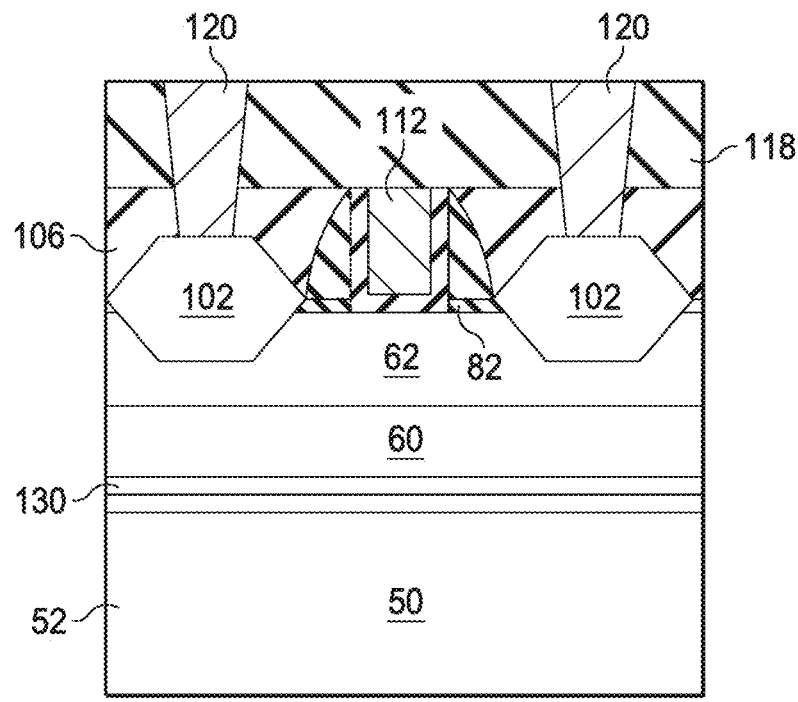
Figure 26C:
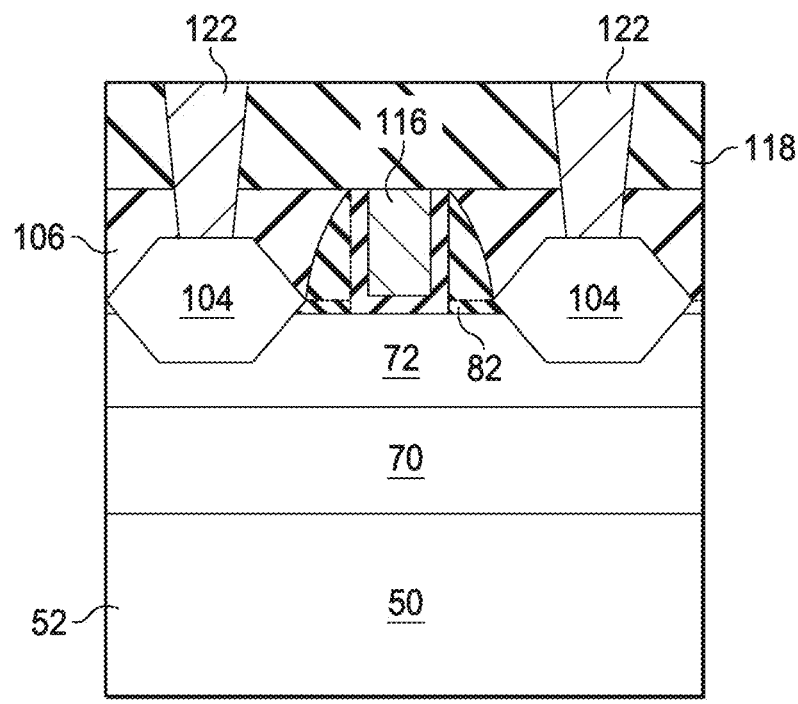

FIGS. 25, 26A, 26B, and 26C illustrate a modification to the process and structures discussed with respect to FIGS. 2 through 24B. FIG. 25 illustrates a cross-sectional view of a structure after processing through the processes discussed with respect to FIGS. 2 through 7 and after a conversion process. In FIG. 25, the lower epitaxial portions 60 are converted to a dielectric material 64. The conversion process may be similar to that discussed above with respect to FIG. 8, and may be, for example, for a longer duration, at a higher temperature, the like, or a combination thereof. In the illustrated embodiment in FIG. 25, the lower epitaxial portions 60 are converted to a dielectric material 64 to an extent such that a discontinuous region of the lower epitaxial portion 60 remains between the upper epitaxial portions 62 and respective fins 52. Discontinuities 130 are illustrated. Processing may then proceed as discussed with respect to FIGS. 9 through 23C to achieve the structure illustrated in FIGS. 26A, 26B, and 26C. The structure illustrated in FIGS. 26A, 26B, and 26C is the same as the structure in FIGS. 23A, 23B, and 23C, except with the discontinuous regions of the lower epitaxial portions 60.

Figure 34:
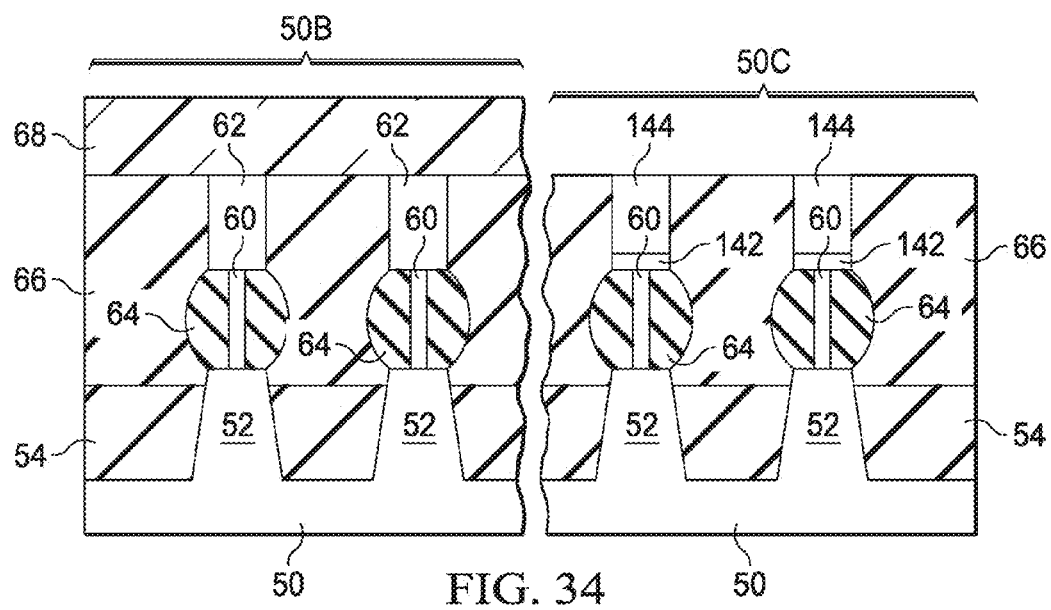
Figure 35:
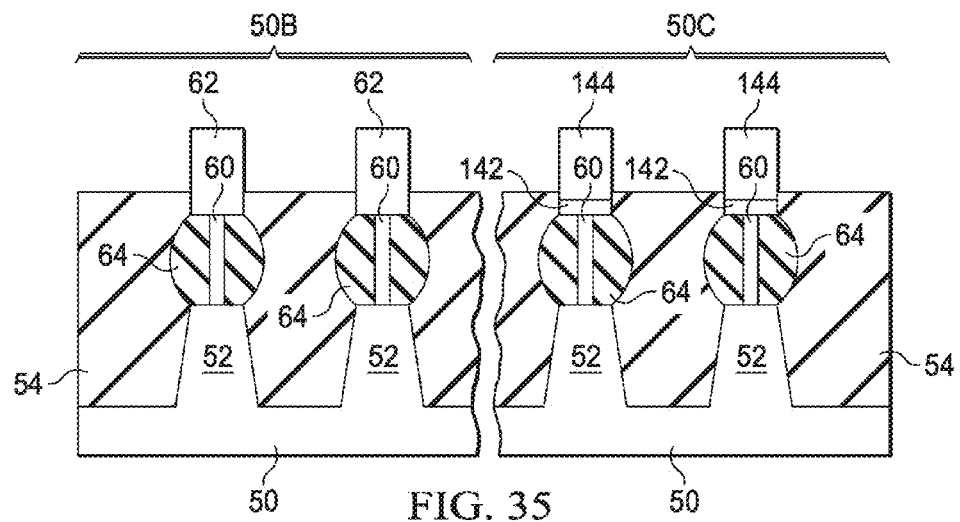
Figure 36A:
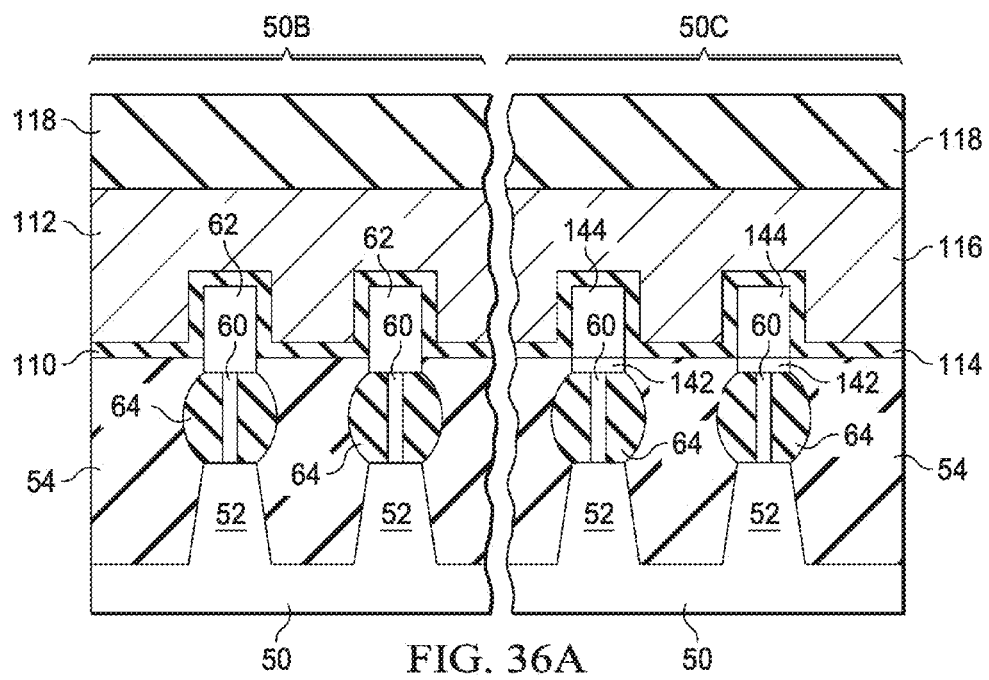
Figure 36B:
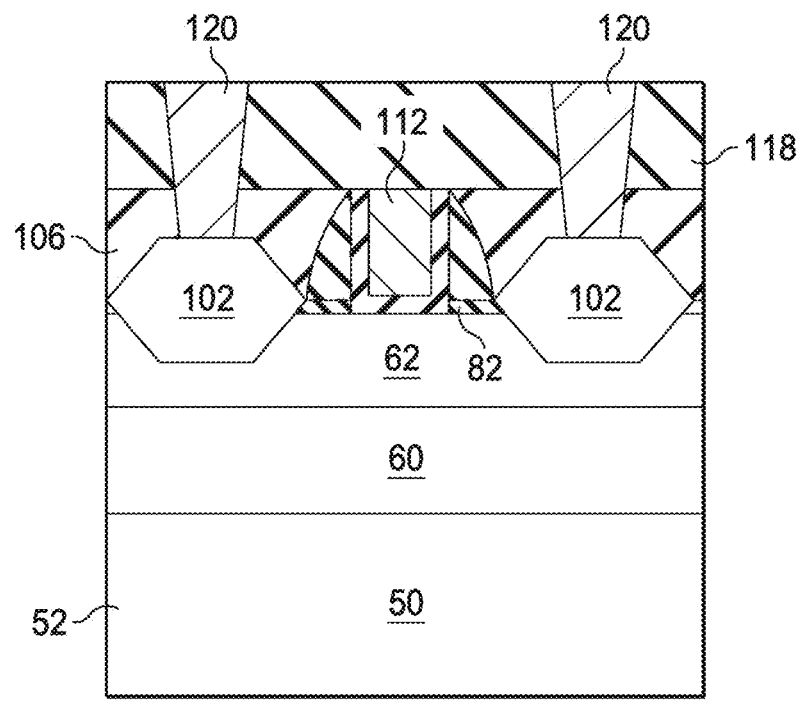
Figure 36C:
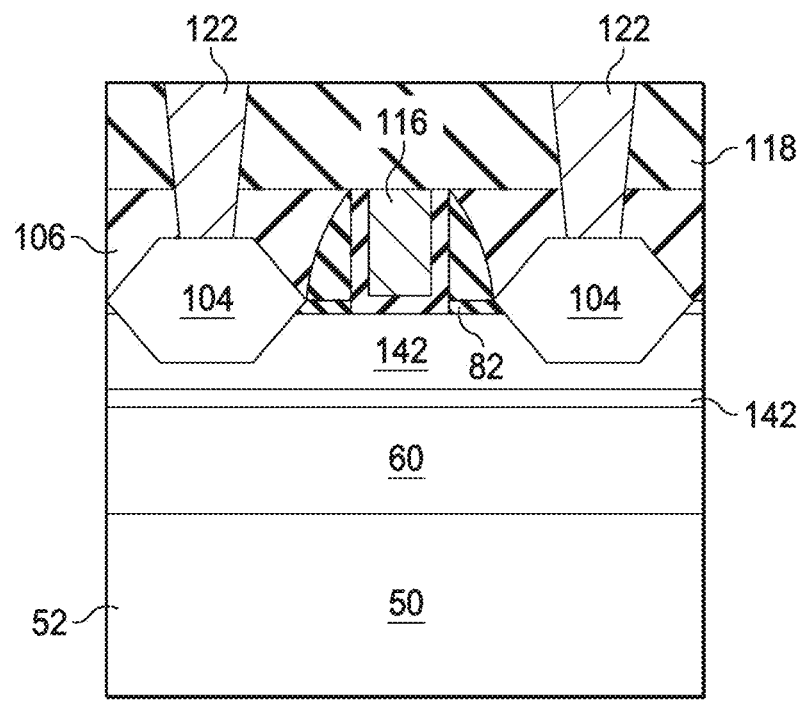
Figure 37A:
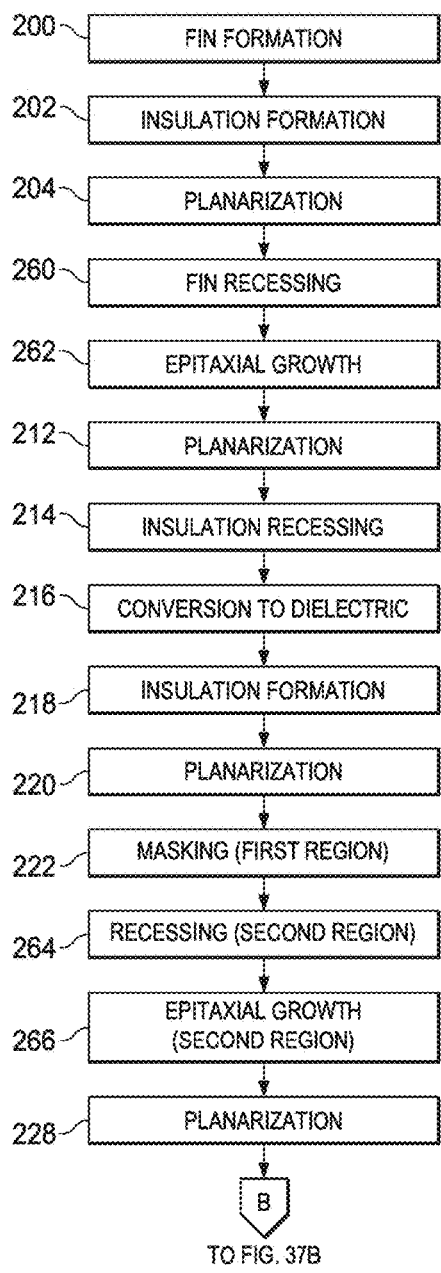
FIGS. 37A and 37B are a process flow of a process in accordance with some embodiments.
Figure 37B:
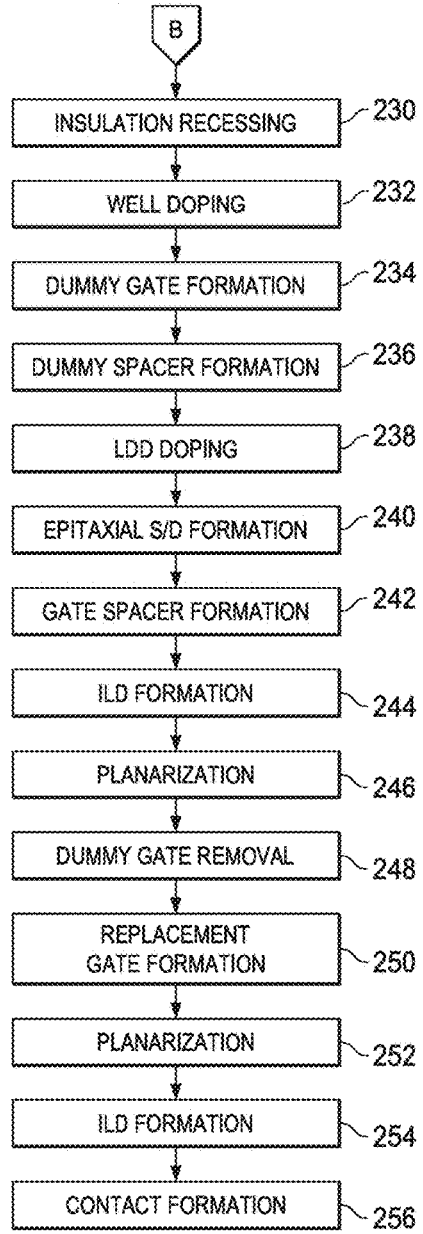

FIGS. 27 through 36C are cross-sectional views of intermediate stages in the manufacturing of finFETs in accordance with another exemplary embodiment, and FIGS. 37A and 37B are a process flow of the process shown in FIGS. 27 through 36C. FIGS. 27 through 35 illustrate reference cross-section A-A illustrated in FIG. 1, except for multiple finFETs. In FIGS. 36A, 36B, and 36C, figures ending with an "A" designation are illustrated along a similar cross-section A-A; figures ending with a "B" designation are illustrated along a similar cross-section B/C-B/C and in a first region on a substrate; and figures ending with a "C" designation are illustrated along a similar cross-section B/C-B/C and in a second region on a substrate.

Figure 27:
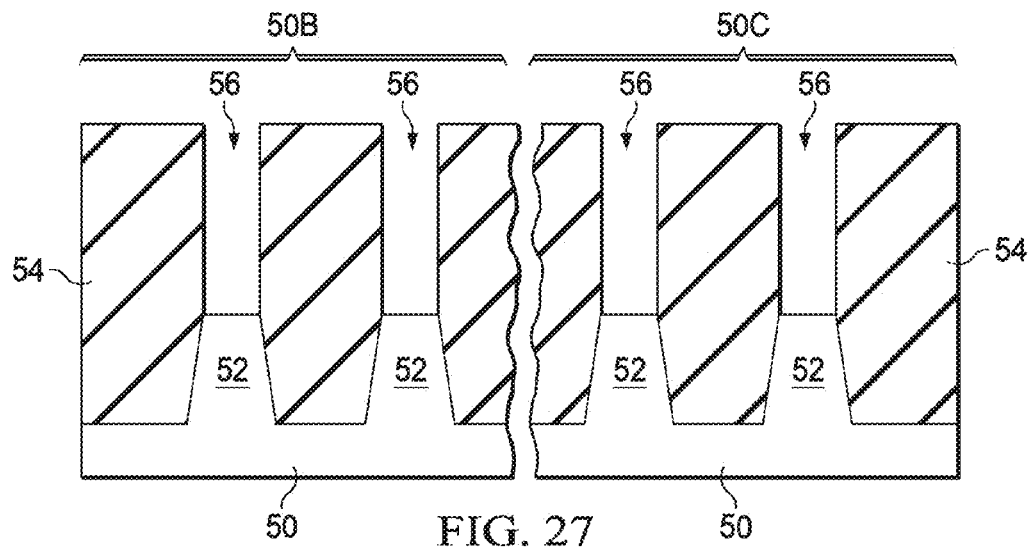
FIGS. 27 through 35 and 36A-C are cross-sectional views of intermediate stages in the manufacturing of finFETs in accordance with other embodiments.

Processing first proceeds as discussed with respect to FIGS. 2 through 4 and steps 200 through 204. In FIG. 27 and step 260, recesses 56 are formed in the fins 52 and/or the isolation regions 54 in the first region 50B and the second region 50C, such as simultaneously. The recesses 56 may be formed by etching using any acceptable etch process. Surfaces of the fins 52 are exposed as at least portions of the bottom surfaces of the recesses 56. As illustrated, the bottom surfaces of the recesses 56 include all of top surfaces of the fins 52 after an etching process. In the illustrated embodiment, the top surfaces of the fins 52 are each planar. In other embodiments, the top surfaces of the fins 52 may have different configurations, some of which are discussed below.

Figure 28:
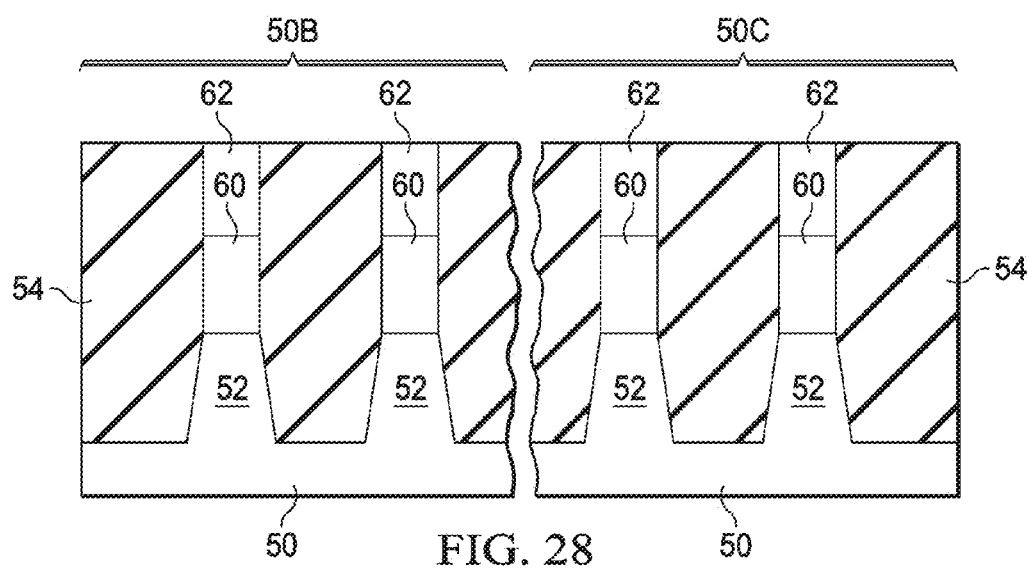

In FIG. 28 and step 262, epitaxial fins are formed in the recesses 56 in the first region 50B and the second region 50C. In some embodiments, the epitaxial fins are formed by epitaxially growing a material in the recesses 56. As illustrated, each of the epitaxial fins in the first region 50B and the second region 50C comprises a lower epitaxial portion 60 and an upper epitaxial portion 62. The lower epitaxial portions 60 are epitaxially grown on the top surfaces of the fins 52, and the upper epitaxial portions 62 are epitaxially grown on the lower epitaxial portions 60.

As previously discussed, a material of the upper epitaxial portions 62 is different from a material of the lower epitaxial portions 60. In some embodiments, the different materials of the upper epitaxial portions 62 and the lower epitaxial portions 60 allow a significant portion of the lower epitaxial portions 60 to be converted to a dielectric material while the upper epitaxial portions 62 are not significantly converted to a dielectric material. In the illustrated embodiment, the lower epitaxial portions 60 are silicon germanium, where the concentration of germanium is equal to or greater than 10% (e.g., $Si_{1-x}Ge_x$, where x>=0.10), such as greater than 30%, and the upper epitaxial portions 62 are silicon. In other embodiments, the epitaxial fins can comprise other material, such as silicon, silicon carbide, germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

The lower epitaxial portions 60 may be buffer layers, such as stress relaxation buffer layers, as discussed above. The stress relaxation buffer layer may further induce a stress in an overlying material, such as the upper epitaxial portions 62. The upper epitaxial portion 62 may be tensilely or compressively strained or may be partially or substantially relaxed, as discussed above.

In step 212, a planarization process, such as a CMP process, may be used to form the top surfaces of the epitaxial fins and the isolation regions 54 to be co-planar, for example, when the epitaxial fins are overgrown above the top surface of the isolation regions 54.

Figure 29:
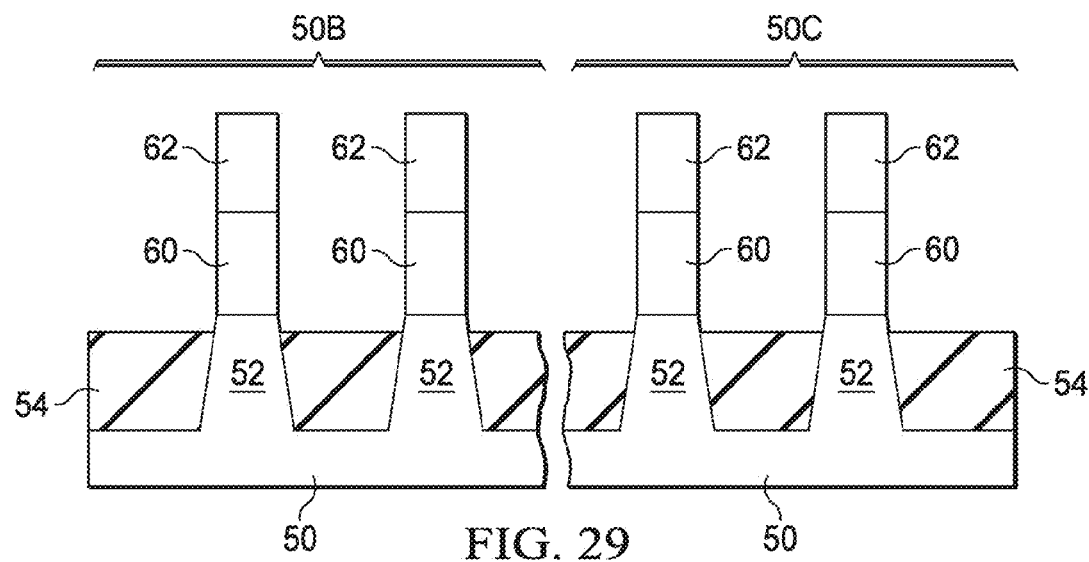

In FIG. 29 and step 214, the isolation regions 54 are recessed. The isolation regions 54 are recessed such that epitaxial fins in the first region 50B and the second region 50C protrude from between neighboring isolation regions 54. As illustrated, the top surfaces of the isolation regions 54 are above top surfaces of the lower epitaxial portions 60. In other embodiments, the top surfaces of the isolation regions 54 may be below top surfaces and above bottom surfaces of the lower epitaxial portions 60, or the top surfaces of the isolation regions 54 may be below bottom surfaces of the lower epitaxial portions 60. In some embodiments, the recessing of the isolation regions 54 facilitates conversion to a dielectric material, such as by oxidation, of the lower epitaxial portions 60. The depth to which the isolations regions 54 may be recessed may depend on a process used for such conversion, such as oxidation. If conversion can be achieved without recessing the isolation regions 54, the recessing can be omitted, for example. The isolation regions 54 may be recessed using an acceptable etching process.

Figure 30:
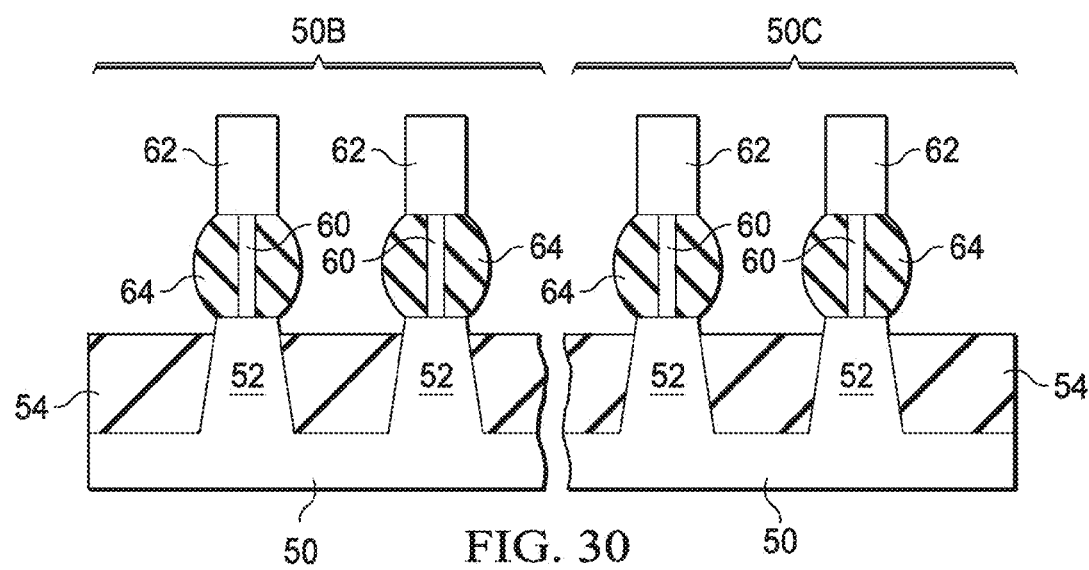

In FIG. 30 and step 216, the lower epitaxial portions 60 are converted to a dielectric material 64. In some embodiments, the conversion process is an oxidation, such as discussed above. Other conversion processes may be used.

In some embodiments where the fins 52 are silicon, the lower epitaxial portions 60 are $Si_{1-x}Ge_x$, where x>=0.10, and the upper epitaxial portions 62 are silicon, as discussed above, and an oxidation process is used for the conversion, the lower epitaxial portions 60 may oxidize to form SiGeO faster than the fins 52 and the upper epitaxial portions 62 are oxidized, since SiGe oxidizes at a greater rate than silicon. Hence, a significant portion of each lower epitaxial portion 60 may be oxidized while very little of the fins 52 and upper epitaxial portions 62 are oxidized.

In the illustrated embodiment in FIG. 30, the lower epitaxial portions 60 are converted to a dielectric material 64 to an extent such that a continuous region of the lower epitaxial portion 60 remains between the upper epitaxial portions 62 and respective fins 52. As will be discussed subsequently, the lower epitaxial portions 60 may be converted to a dielectric material 64 to an extent such that a discontinuous region of the lower epitaxial portion 60 remains.

Figure 31:
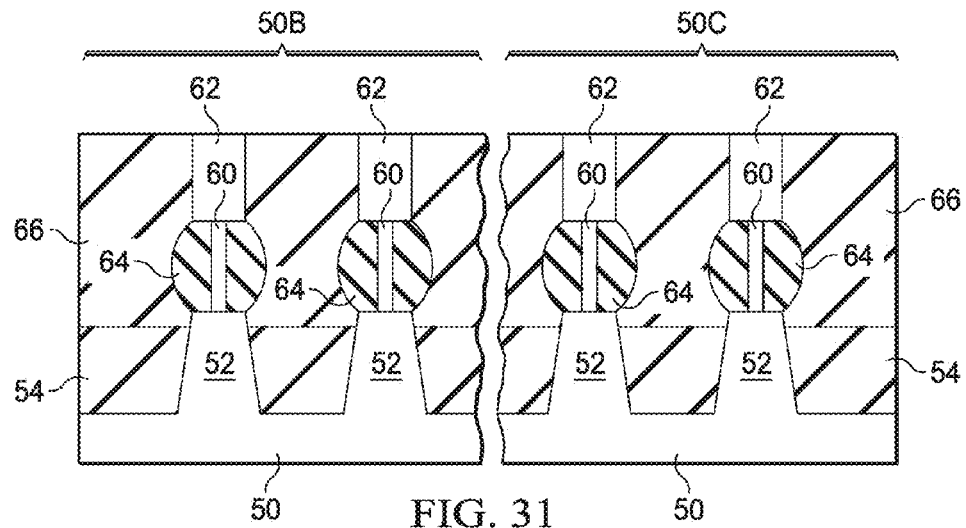

In FIG. 31 and step 218, an insulation material 66 is formed between neighboring epitaxial fins in the first region 50B and the second region 50C over the isolation regions 54. The insulation material 66 may be deposited when the isolation regions 54 were previously recessed, such as discussed with respect to FIG. 29. If the isolation regions 54 were not recessed, the insulation material 66 may be omitted, for example. Further in FIG. 31 and in step 220, a planarization process, such as a CMP, may remove any excess insulation material and form top surfaces of the insulating material 66 and top surfaces of the epitaxial fins that are co-planar.

Figure 32:
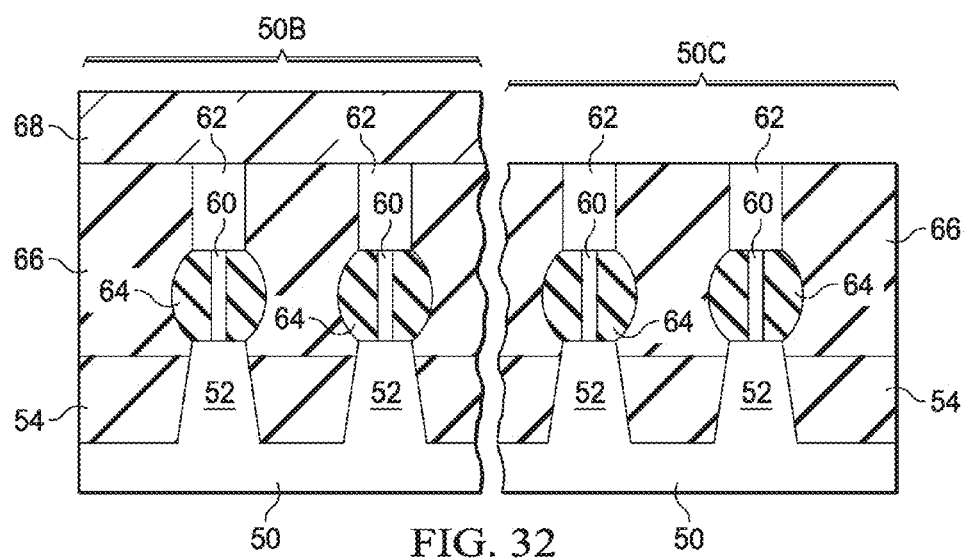
Figure 33:
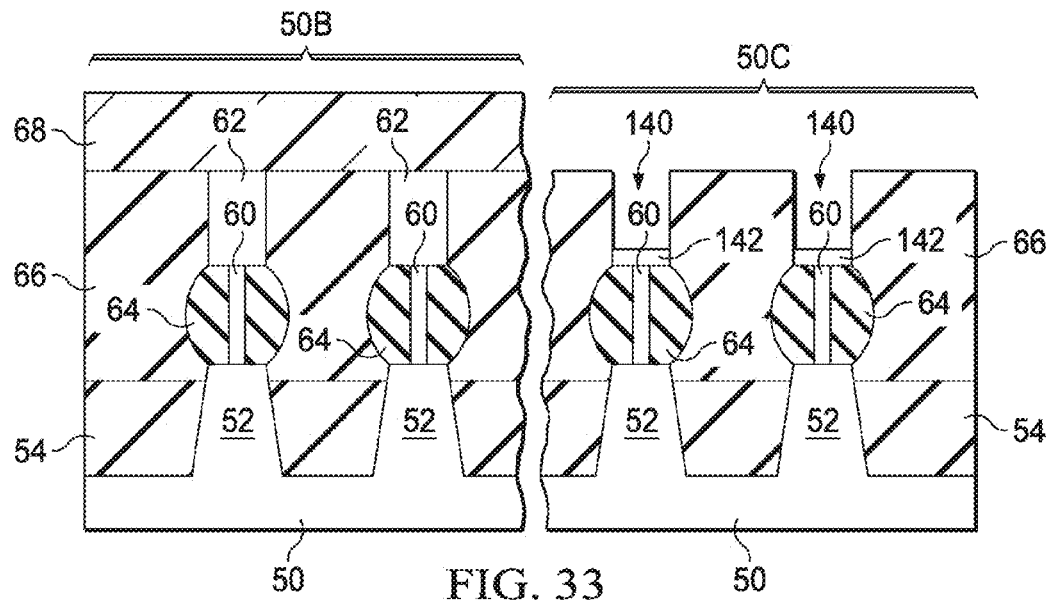

In FIG. 32 and step 222, a mask 68 is formed over the first region 50B of the substrate 50 while the second region 50C is exposed. The mask 68 may be a photoresist patterned by an acceptable photolithography process, or the like. Further in FIG. 32 and in step 264, while the mask 68 is on the first region 50B, recesses 140 are formed in the upper epitaxial portions 62 and/or the isolation regions 54 in the second region 50C. The recesses 140 may be formed by etching using any acceptable etch process, such as a RIE, NBE, TMAH, ammonium hydroxide, a wet etchant capable of etching silicon with good etch selectivity between silicon and a material of the isolation regions 54 and insulating material 66, the like, or a combination thereof. The etch may be anisotropic.

As illustrated, at least a portion of the upper epitaxial portions 62 in the second region 50C remain as template layers 142. Surfaces of the template layers 142 are exposed as at least portions of the bottom surfaces of the recesses 140. As illustrated, the bottom surfaces of the recesses 140 include all of top surfaces of the template layers 142 after an etching process. In the illustrated embodiment, the top surfaces of the template layers 142 are each planar. In other embodiments, the top surfaces of the template layers 142 may have different configurations, some of which are discussed below. As discussed below, the template layers 142 may be used as a template to epitaxially grow a material.

In FIG. 34 and step 266, epitaxial fins are formed in the recesses 140 in the second region 50C. In some embodiments, the epitaxial fins are formed by epitaxially growing a material in the recesses 140, such as by MOCVD, MBE, LPE, VPE, SEG, the like, or a combination thereof. As illustrated, each of the epitaxial fins in the second region 50C comprises an upper epitaxial portion 144. The upper epitaxial portions 144 are epitaxially grown on the template layers 142.

In some embodiments, the epitaxial fins, including the upper epitaxial portions 144, can comprise as silicon, silicon carbide, silicon germanium, germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like. A material of the upper epitaxial portions 144 may be different from a material of the template layers 142.

After the epitaxial fins in the second region 50C are formed, the mask 68 is removed. For example, if the mask 68 is a photoresist, the mask 68 may be removed by an appropriate ashing process, such as using an oxygen plasma. In other embodiments, the mask 68 may be removed using an etch, a CMP process, or the like. Further in FIG. 34 and in step 228, a planarization process, such as a CMP process, may be used to form the top surfaces of the epitaxial fins in the first region 50B and the second region 50C and the insulating material 66 and/or isolation regions 54 to be co-planar, for example, when the epitaxial fins are overgrown above the top surface of the insulating material 66 and/or isolation regions 54.

In FIG. 35 and step 230, the insulating material 66 and/or isolation regions 54 are recessed, such as to form STI regions. The insulating material 66 and/or isolation regions 54 are recessed such that epitaxial fins in the first region 50B and in the second region 50C protrude from between neighboring insulating material 66 and/or isolation regions 54. For simplicity herein, isolation regions 54 are illustrated in the figures; however, the isolation regions 54 may include insulating material 66. As illustrated, the top surfaces of the isolation regions 54 are above top surfaces of the lower epitaxial portions 60 and dielectric material 64 in the first region 50B and the second region 50C. In other embodiments, the top surfaces of the isolation regions 54 may be below top surfaces and above bottom surfaces of the lower epitaxial portions 60 and dielectric material 64, or the top surfaces of the isolation regions 54 may be below bottom surfaces of the lower epitaxial portions 60 and dielectric material 64. Further, the top surfaces of the isolation regions 54 may have a flat surface as illustrated, a convex surface, a concave surface (such as dishing), or a combination thereof. The top surfaces of the isolation regions 54 may be formed flat, convex, and/or concave by an appropriate etch. The isolation regions 54 may be recessed using an acceptable etching process.

Processing may then proceed as discussed with respect to FIGS. 13 through 23C and steps 232 through 256 to achieve the structure illustrated in FIGS. 36A, 36B, and 36C. The structure illustrated in FIGS. 36A, 36B, and 36C is the same as the structure in FIGS. 23A, 23B, and 23C, except with the lower epitaxial portions 60, dielectric material 64, template layers 142, and upper epitaxial portions 144 in the second region 50C.

Figure 38:
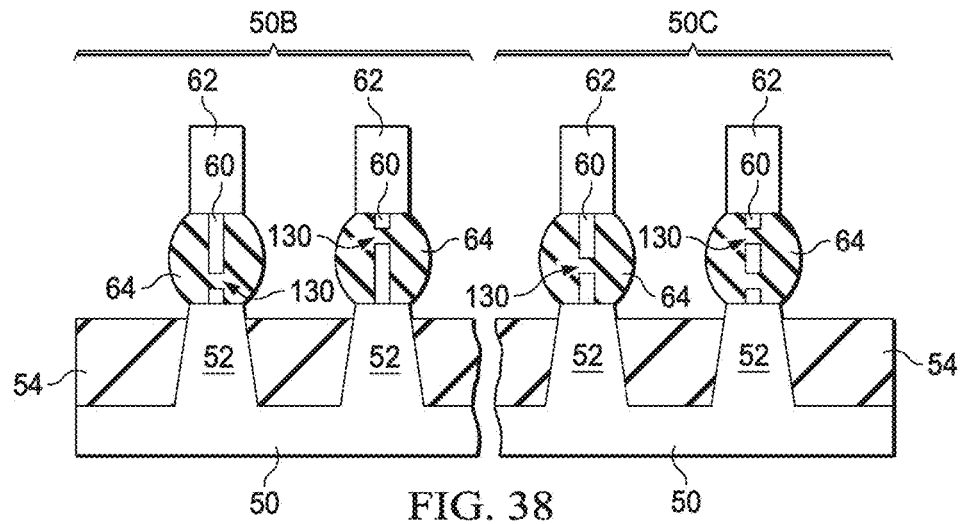
FIGS. 38 and 39A-C are cross-sectional views of intermediate stages comprising a modification in the manufacturing of finFETs in accordance with some embodiments.
Figure 39A:
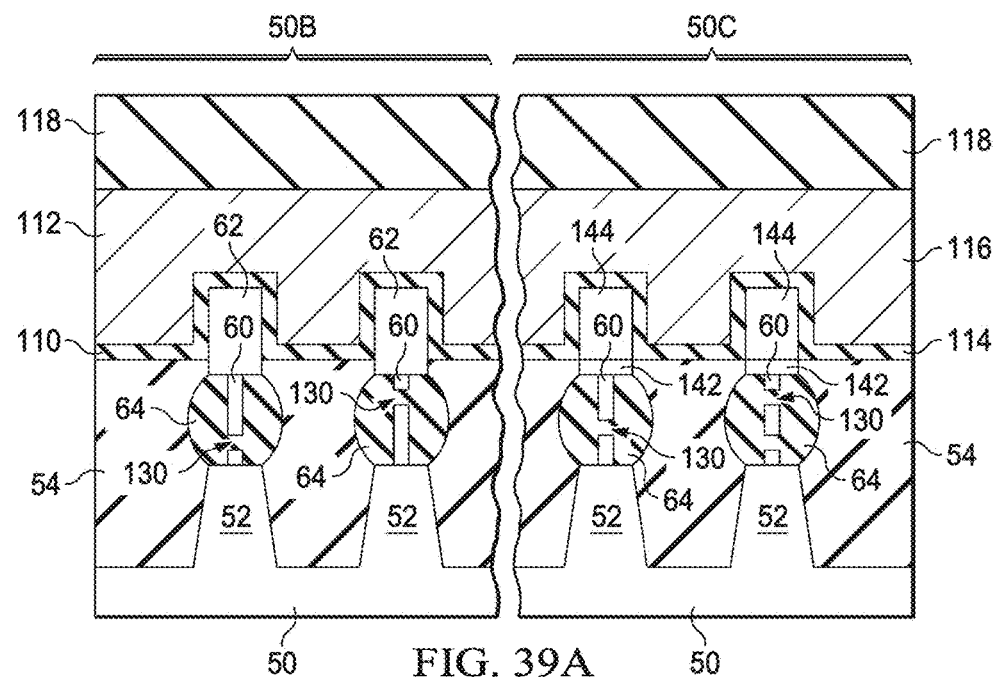
Figure 39B:
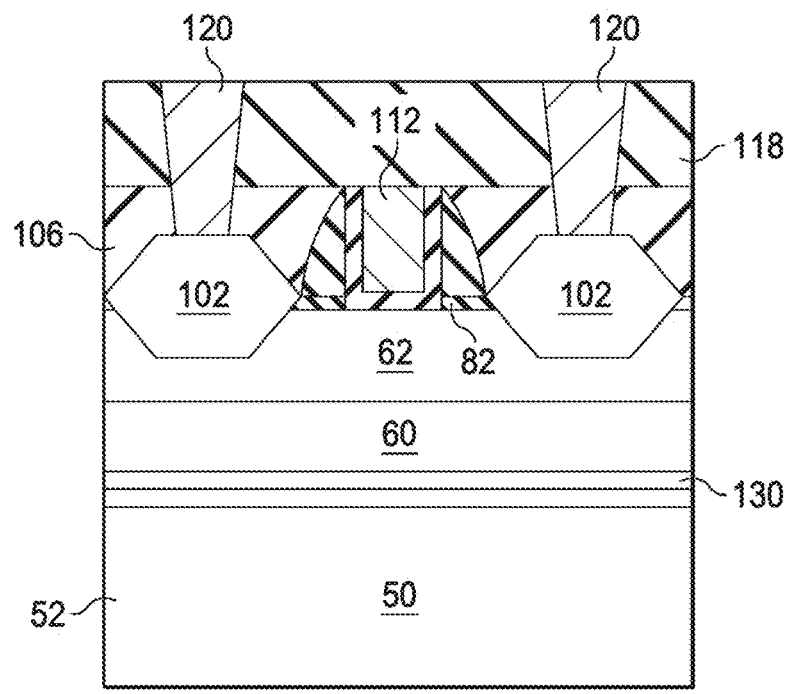
Figure 39C:
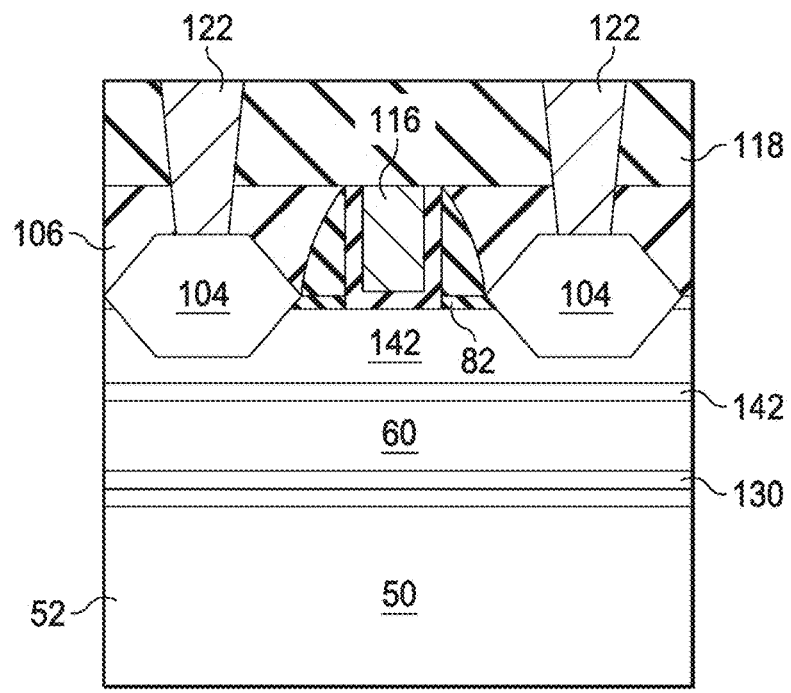

FIGS. 38, 39A, 39B, and 39C illustrate a modification to the process and structures discussed with respect to FIGS. 2 through 4, 27 through 35, and 13 through 23C. FIG. 38 illustrates a cross-sectional view of a structure after processing through the processes discussed with respect to FIGS. 2 through 4 and 27 through 29 and after a conversion process. In FIG. 38, the lower epitaxial portions 60 are converted to a dielectric material 64. The conversion process may be similar to that discussed above with respect to FIG. 30, and may be, for example, for a longer duration, at a higher temperature, the like, or a combination thereof. In the illustrated embodiment in FIG. 38, the lower epitaxial portions 60 are converted to a dielectric material 64 to an extent such that a discontinuous region of the lower epitaxial portion 60 remains between the upper epitaxial portions 62 and respective fins 52. Discontinuities 130 are illustrated. Processing may then proceed as discussed with respect to FIGS. 31 through 35 and 13 through 23C to achieve the structure illustrated in FIGS. 39A, 39B, and 39C. The structure illustrated in FIGS. 39A, 39B, and 39C is the same as the structure in FIGS. 36A, 36B, and 36C, except with the discontinuous regions of the lower epitaxial portions 60.

Figure 40:
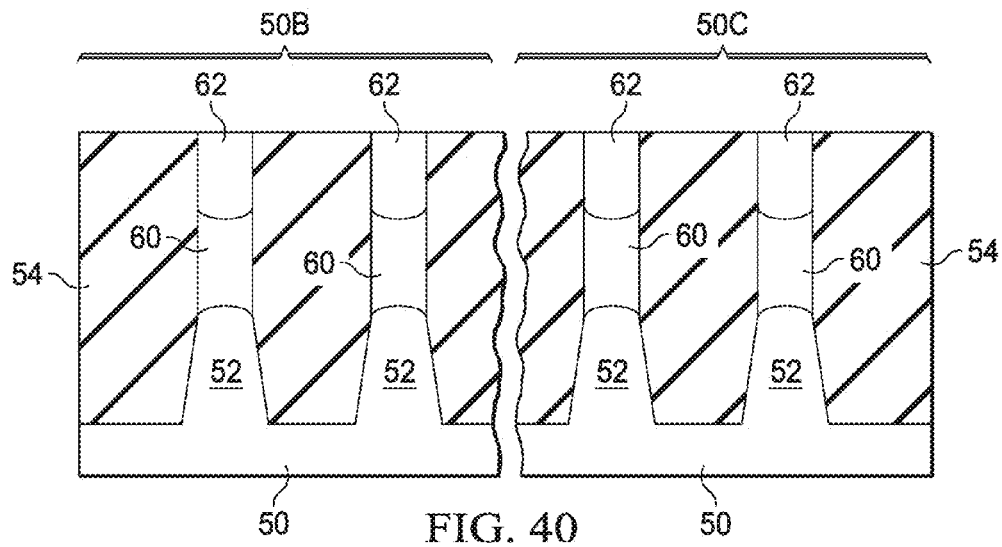
FIGS. 40 through 42 are cross-sectional views of aspects that can be incorporated into processes and structures in accordance with some embodiments.
Figure 41:
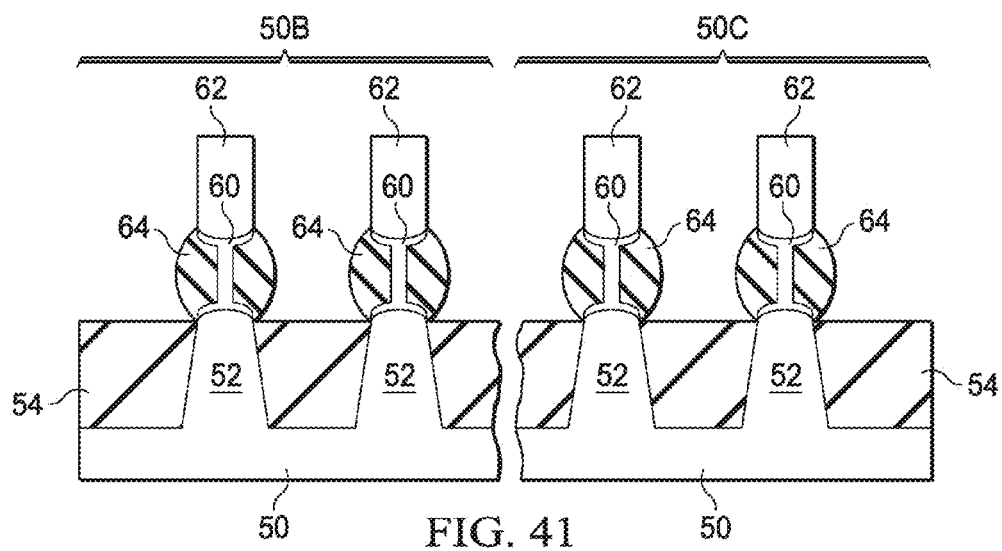
Figure 42:
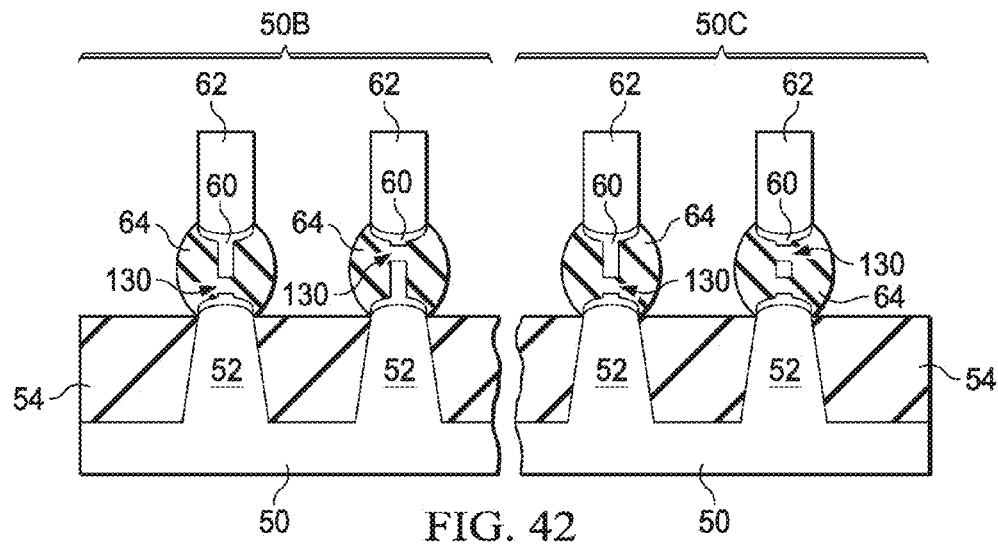

FIGS. 40 through 42 illustrate features that can be incorporated into embodiments. In FIG. 40, top surfaces of the fins 52 have a configuration, such as being convex (as illustrated), flat, or concave. These top surfaces may be formed by the recessing in FIG. 5, 10, or 27. The top surface configuration of the fins 52 can be formed by using an appropriate etching process, like a wet etch such as hot ammonia to form a concave or convex surface or a dry plasma etch to form a flat surface. Also in FIG. 40, top surfaces of the lower epitaxial portions 60 have a configuration, such as being concave (as illustrated), flat, or convex. These top surfaces may be formed by over growing the lower epitaxial portions and performing an etch-back process in FIG. 6, 11, or 28. The top surface configuration of the lower epitaxial portions 60 can be formed by using an appropriate etching process, like a wet etch such as hot ammonia to form a concave or convex surface or a dry plasma etch to form a flat surface.

FIG. 41 illustrates a structure after converting the lower epitaxial portions 60 to a dielectric material 64 where continuous portions of the lower epitaxial portions 60 remain, like in FIGS. 8 and 30. FIG. 42 illustrates a structure after converting the lower epitaxial portions 60 to a dielectric material 64 where discontinuous portions of the lower epitaxial portions 60 remain with discontinuities 130, like in FIGS. 25 and 38. As indicated, the features illustrated in FIG. 40 through 42 for the first region 50B may or may not be present simultaneously with the features illustrated for the second region 50C depending on how processing is performed. These features are illustrated in these discrete drawings for ease of illustration, and a person of ordinary skill in the art will readily understand how these features can be incorporated into the processes based on this discussion.

Figure 43:
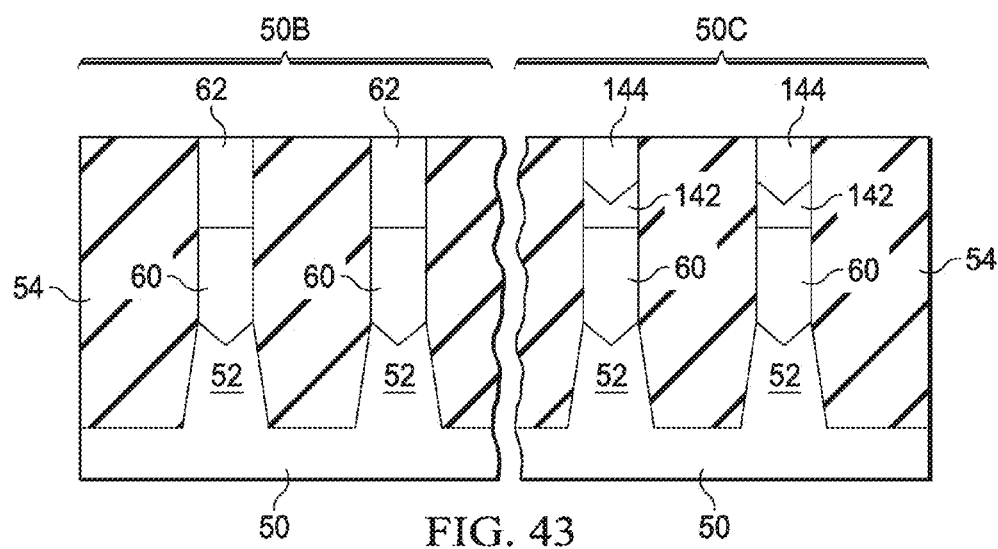
FIGS. 43 through 45 are cross-sectional views of aspects that can be incorporated into processes and structures in accordance with some embodiments.
Figure 44:
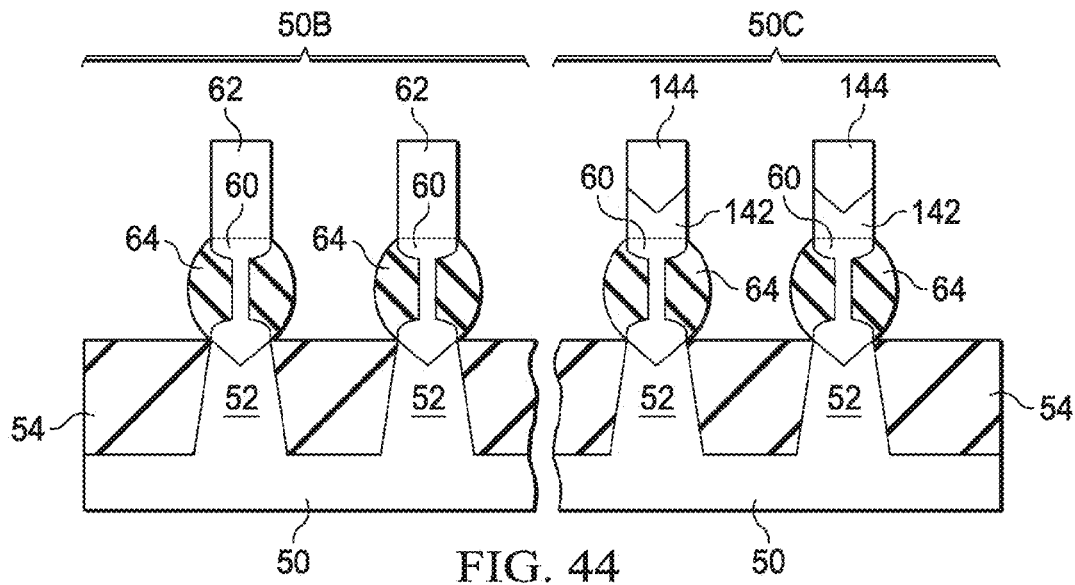
Figure 45:
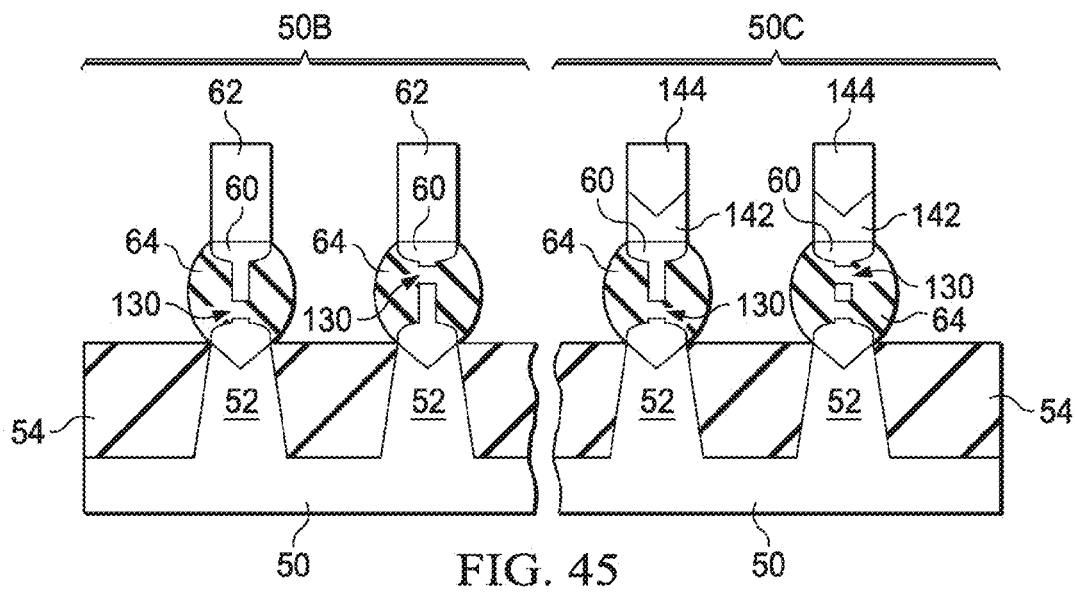

FIGS. 43 through 45 illustrate features that can be incorporated into embodiments. In FIG. 43, top surfaces of the fins 52 have a configuration, such as being a V-shape (as illustrated), which could further be symmetrical or asymmetrical. These top surfaces may be formed by the recessing in FIG. 5, 10, or 27. The top surface configuration of the fins 52 can be formed by using an appropriate etching process selective to a crystallographic plane, such as a (111) plane. Also in FIG. 43, top surfaces of the template layers 142 have a configuration, such as being a V-shape (as illustrated), which could further be symmetrical or asymmetrical. These top surfaces may be formed by the recessing in FIG. 33. The top surface configuration of the template layers 142 can be formed by using an appropriate etching process selective to a crystallographic plane, such as a (111) plane.

FIG. 44 illustrates a structure after converting the lower epitaxial portions 60 to a dielectric material 64 where continuous portions of the lower epitaxial portions 60 remain, like in FIGS. 8 and 30. FIG. 45 illustrates a structure after converting the lower epitaxial portions 60 to a dielectric material 64 where discontinuous portions of the lower epitaxial portions 60 remain with discontinuities 130, like in FIGS. 25 and 38. As indicated, the features illustrated in FIG. 43 through 45 for the first region 50B may or may not be present simultaneously with the features illustrated for the second region 50C depending on how processing is performed. These features are illustrated in these discrete drawings for ease of illustration, and a person of ordinary skill in the art will readily understand how these features can be incorporated into the processes based on this discussion.

Figure 46:
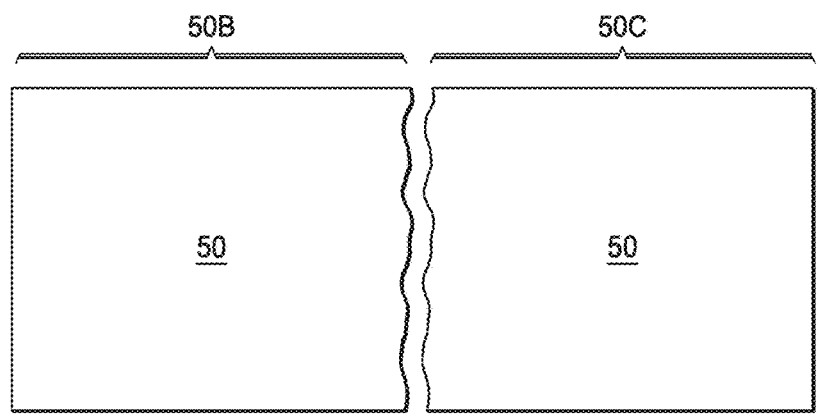
FIGS. 46 through 55 are cross-sectional views of intermediate stages in the manufacturing of finFETs in accordance with some embodiments.

FIGS. 46 through 55 are cross-sectional views of intermediate stages in the manufacturing of finFETs in accordance with an exemplary embodiment, and FIGS. 56A and 56B are a process flow of the process shown in FIGS. 46 through 55. FIGS. 46 through 555 illustrate reference cross-section A-A illustrated in FIG. 1, except for multiple finFETs.

FIG. 46 illustrates a substrate 50 like the substrate 50 in FIG. 2. The substrate 50 has a first region 50B and a second region 50C. As discussed with respect to FIG. 2, the first region 50B can be for forming n-type devices, such as NMOS transistors, such as n-type finFETs. As discussed with respect to FIG. 2, the second region 50C can be for forming p-type devices, such as PMOS transistors, such as p-type finFETs.

Figure 47:
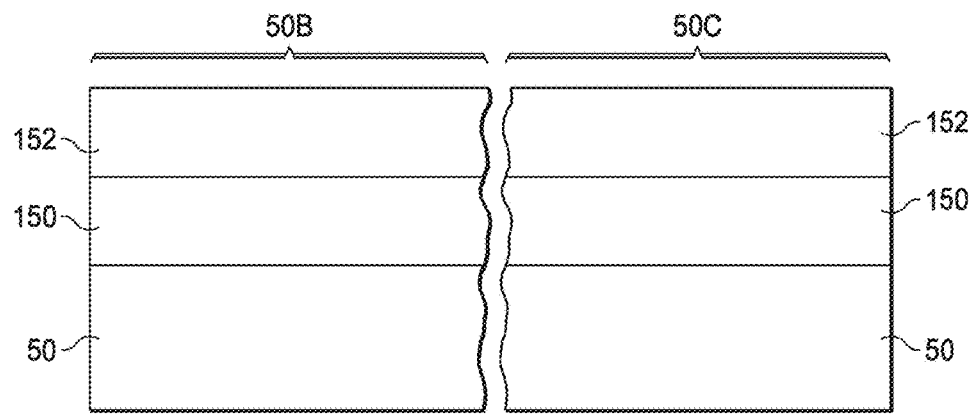

In FIG. 47 and step 300, a lower epitaxial layer 150 (e.g., a blanket layer) and an upper epitaxial layer 152 (e.g., a blanket layer) are formed in both the first region 50B and the second region 50C of the substrate 50. The lower epitaxial layer 150 is formed on the substrate 50, and the upper epitaxial layer 152 is formed on the lower epitaxial layer 150. In some embodiments, the lower epitaxial layer 150 and the upper epitaxial layer 152 are formed by epitaxially growing a material, such as by MOCVD, MBE, LPE, VPE, SEG, the like, or a combination thereof. Example materials of the lower epitaxial layer 150 and the upper epitaxial layer 152 are discussed subsequently after additional context is discussed.

Figure 48:
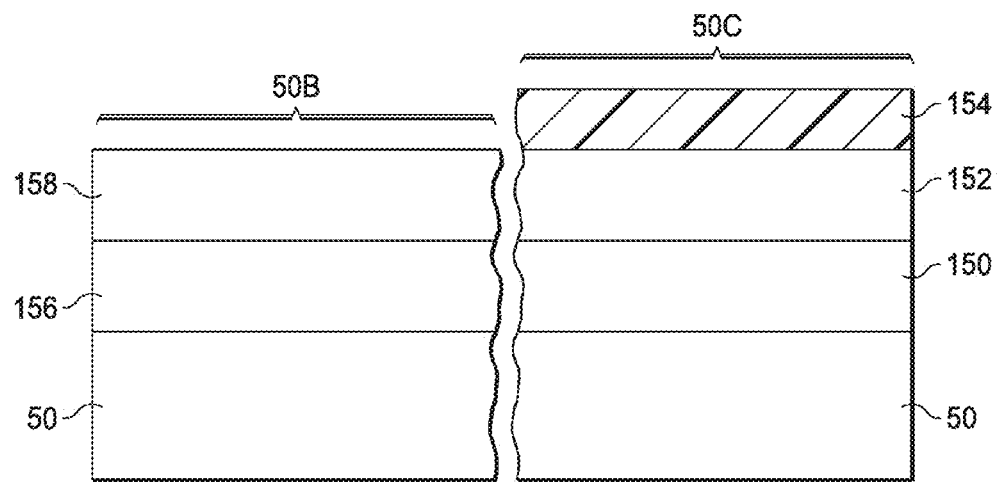

In FIG. 48 and step 302, a mask 154 is formed over the second region 50C of the substrate 50 while the first region 50B is exposed. The mask 154 may be a photoresist patterned by an acceptable photolithography process or the like. While the mask 154 is over the second region 50C, an etch, as shown in step 304, is performed to remove the upper epitaxial layer 152 and the lower epitaxial layer 150 in the first region 50B. The etching may be any acceptable etch process, such as a RIE, NBE, the like, or a combination thereof. Subsequently, in step 306, a lower epitaxial layer 156 (e.g., a blanket layer) and an upper epitaxial layer 158 (e.g., a blanket layer) are formed in the first region 50B of the substrate 50. The lower epitaxial layer 156 is formed on the substrate 50, and the upper epitaxial layer 158 is formed on the lower epitaxial layer 156. In some embodiments, the lower epitaxial layer 156 and the upper epitaxial layer 158 are formed by epitaxially growing a material, such as by MOCVD, MBE, LPE, VPE, SEG, the like, or a combination thereof. Example materials of the lower epitaxial layer 156 and the upper epitaxial layer 158 are discussed subsequently after additional context is discussed. In step 308, a planarization process, such as a CMP, may remove any remaining mask 154 and form top surfaces of the upper epitaxial layers 152 and 158 that are co-planar.

In some embodiments, the lower epitaxial layer 150 may not be removed from the first region 50B, and may replace the lower epitaxial layer 156 in the first region 50B. Further, each epitaxial layer may comprise one or more distinct layers that may be desirable for a given application.

Figure 49:
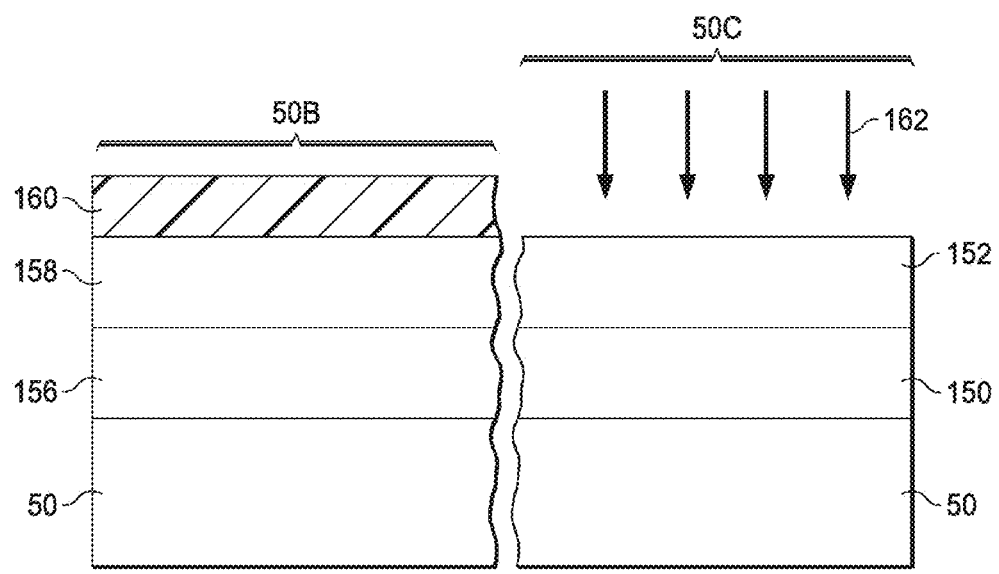
Figure 50:
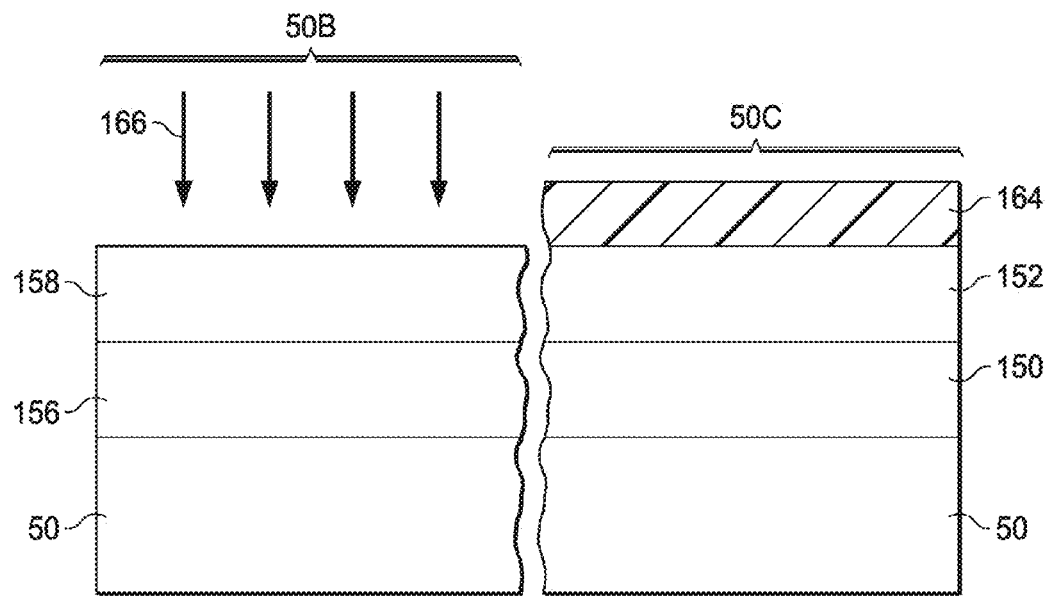

In FIGS. 49 and 50 and step 310 (similar to step 232 and the process steps in FIGS. 13 and 14), appropriate wells may be formed in the upper epitaxial layers 158 and 152, lower epitaxial layers 156 and 150, and/or substrate 50. For example, a P well may be formed in the first region 50B, and an N well may be formed in the second region 50C.

As illustrated in FIG. 49, a photoresist 160 is formed over the upper epitaxial layer 158 in the first region 50B. The photoresist 160 is patterned to expose the second region 50C of the substrate 50, such as a PMOS region. The photoresist 160 can be formed by using a spin-on technique and can be patterned using acceptable photolithography techniques. Once the photoresist 160 is patterned, an n-type impurity implant 162 is performed in the second region 50C, and the photoresist 160 may act as a mask to substantially prevent n-type impurities from being implanted into the first region 50B, such as an NMOS region. The n-type impurities may be phosphorus, arsenic, or the like implanted in the first region to a concentration of equal to or less than $10^{18}$ cm$^{-3}$, such as between about $10^{17}$ cm$^{-3}$ and about $10^{18}$ cm$^{-3}$. After the implant 162, the photoresist 160 is removed, such as by an acceptable ashing process.

As illustrated in FIG. 50, a photoresist 164 is formed over the upper epitaxial layer 152 in the second region 50C. The photoresist 164 is patterned to expose the first region 50B of the substrate 50, such as the NMOS region. The photoresist 164 can be formed by using a spin-on technique and can be patterned using acceptable photolithography techniques. Once the photoresist 164 is patterned, a p-type impurity implant 166 may be performed in the first region 50B, and the photoresist 164 may act as a mask to substantially prevent p-type impurities from being implanted into the second region, such as the PMOS region. The p-type impurities may be boron, BF$_2$, or the like implanted in the first region to a concentration of equal to or less than $10^{18}$ cm$^{-3}$, such as between about $10^{17}$ cm$^{-3}$ and about $10^{18}$ cm$^{-3}$. After the implant 166, the second photoresist may be removed, such as by an acceptable ashing process.

After the implants 162 and 166, an anneal may be performed to activate the p-type and n-type impurities that were implanted. The implantations may form a p-well in the first region 50B, e.g., the NMOS region, and an n-well in the second region 50C, e.g., the PMOS region. In some embodiments, the grown materials of the epitaxial layers may be in situ doped during growth, which may obviate the implantations, although in situ and implantation doping may be used together.

Figure 51:
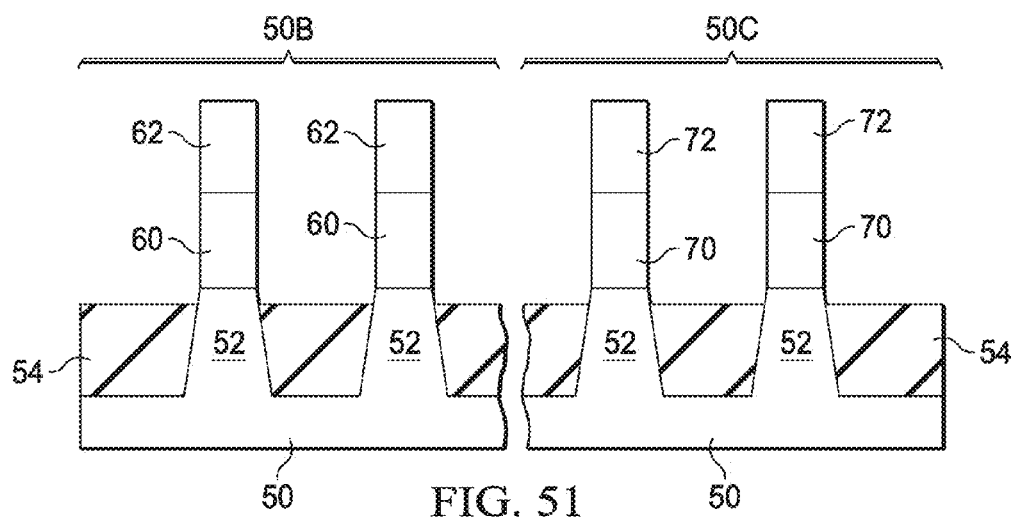

In FIG. 51 and step 312 (similar to step 200 and the process steps in FIG. 3), fins 52 and epitaxial fins are formed. The epitaxial fins in the first region 50B comprise lower epitaxial portions 60 and upper epitaxial portions 62 formed from the lower epitaxial layer 156 and upper epitaxial layer 158, respectively. The epitaxial fins in the second region 50C comprise lower epitaxial portions 60 and upper epitaxial portions 72 formed from the lower epitaxial layer 150 and upper epitaxial layer 152, respectively. In some embodiments, the fins 52 and epitaxial fins may be formed by etching trenches in the upper epitaxial layers 152 and 158, lower epitaxial layers 150 and 156, and substrate 50. The etching may be any acceptable etch process, such as a reactive ion etch (RIE), neutral beam etch (NBE), the like, or a combination thereof. The etch may be anisotropic.

Similar to previous discussion, a material of the upper epitaxial layer 158 (and hence, the upper epitaxial portions 62) is different from a material of the lower epitaxial layer 156 (and hence, the lower epitaxial portions 60). In some embodiments, the different materials of the upper epitaxial portions 62 and the lower epitaxial portions 60 allow a significant portion of the lower epitaxial portions 60 to be converted to a dielectric material while the upper epitaxial portions 62 are not significantly converted to a dielectric material. In the illustrated embodiment, the lower epitaxial portions 60 are silicon germanium, where the concentration of germanium is equal to or greater than 10% (e.g., $Si_{1-x}Ge_x$, where x>=0.10), such as greater than 30%, and the upper epitaxial portions 62 are silicon. In other embodiments, the epitaxial fins can comprise other material, such as silicon, silicon carbide, germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

The lower epitaxial portions 60 may be buffer layers, such as stress relaxation buffer layers, as discussed above. The stress relaxation buffer layer may further induce a stress in an overlying material, such as the upper epitaxial portions 62. The upper epitaxial portion 62 may be tensilely or compressively strained or may be partially or substantially relaxed, as discussed above.

Similar to previous discussion, in some embodiments, the upper epitaxial layer 152 (and hence, the upper epitaxial portions 72) and the lower epitaxial layer 150 (and hence, the lower epitaxial portions 70) can comprise as silicon, silicon carbide, silicon germanium, germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like. A material of the upper epitaxial portions 72 may be different from a material of the lower epitaxial portions 70.

The lower epitaxial portions 70 may be buffer layers. Further, the lower epitaxial portions 70 may be stress relaxation buffer layers, like the stress buffer layers previously discussed. Similar to that discussed above, an overlying layer, such as upper epitaxial portions 72, may have stress induced therein from the lattice mismatch with the stress buffer layer. The upper epitaxial portions 72 may be tensilely or compressively strained. Still in other embodiments, even when materials of a lower epitaxial portion 70 and an upper epitaxial portion 72 are lattice mismatched, the upper epitaxial portion 72 may be partially or substantially relaxed by plastic and/or elastic relaxation.

Figure 52:
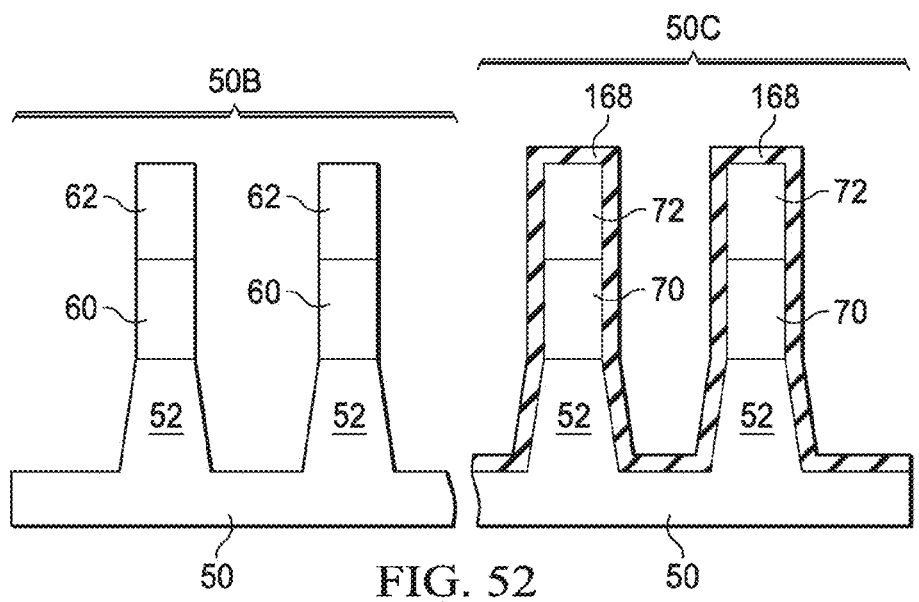

In FIG. 52 and step 314, a mask 168 is formed over the fins 52 and epitaxial fins in the second region 50C of the substrate 50 while the first region 50B is exposed. The mask 168 may comprise silicon nitride (SiN), silicon carbon nitride (SiCN), silicon oxide (SiO), silicon oxynitride (Si-$O_xN_y$), a combination thereof, or the like, deposited by CVD, PECVD, ALD, LPCVD, or the like. The deposition of the mask 168 may be conformal over the first region 50B and the second region 50C. A mask, such as a photoresist, can be formed over the second region 50C of the substrate 50 while the first region 50B is exposed, such as by an acceptable photolithography process or the like. Then, an acceptable etching process, such as a wet or dry etch, can be performed to remove the mask 168 from the first region 50B. In other embodiments, the mask 168 may be omitted, for example, when the lower epitaxial portions 70 are to be converted to a dielectric material during subsequent steps.

Figure 53:
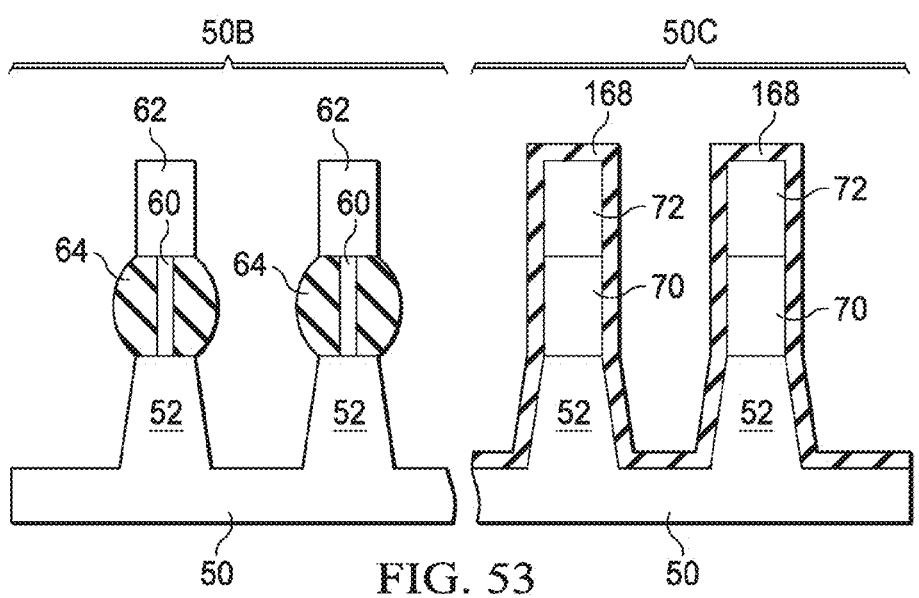

In FIG. 53 and step 216 as discussed with respect to FIG. 8, the lower epitaxial portions 60 are converted to a dielectric material 64. In some embodiments, the conversion process is an oxidation, such as discussed above. Other conversion processes may be used. In the illustrated embodiment in FIG. 53, the lower epitaxial portions 60 are converted to a dielectric material 64 to an extent such that a continuous region of the lower epitaxial portion 60 remains between the upper epitaxial portions 62 and respective fins 52. As will be discussed subsequently, the lower epitaxial portions 60 may be converted to a dielectric material 64 to an extent such that a discontinuous region of the lower epitaxial portion 60 remains.

Figure 54:
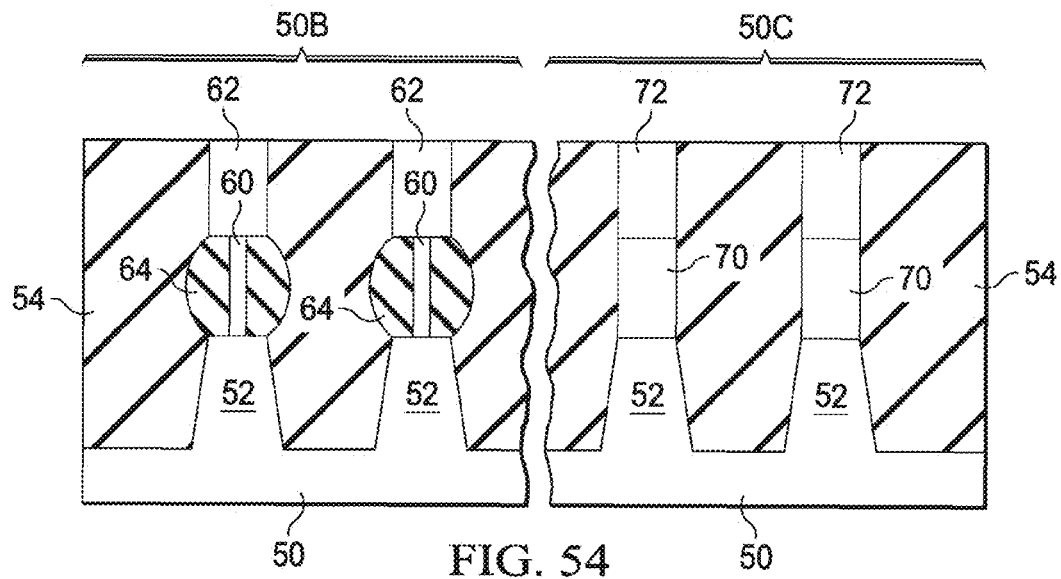

In FIG. 54, the mask 168 is removed in step 312, and isolation regions 54 are formed in step 320 (similar to step 202 and processing discussed with respect to FIG. 4). The mask 168 may be removed by an etch selective to the material of the mask 168, and may be a wet etch. Subsequently, an insulation material is formed between neighboring fins 52 and epitaxial fins to form the isolation regions 54. The insulation material may be an oxide, such as silicon oxide, a nitride, the like, or a combination thereof, and may be formed by HDP-CVD, FCVD, the like, or a combination thereof. Other insulation materials formed by any acceptable process may be used. In the illustrated embodiment, the insulation material is silicon oxide formed by a FCVD process. An anneal process may be performed once the insulation material is formed. Further in FIG. 54 and in step 322 (similar to step 204), a planarization process, such as a CMP, may remove any excess insulation material and form top surfaces of the isolation regions 54 and top surfaces of the epitaxial fins that are co-planar. It should be noted that different materials may be incorporated as the upper epitaxial portions 62 and/or 72 after the planarization process. For example, appropriate masking and etching may be performed to remove upper epitaxial portions 62 and/or 72, and a different material may be epitaxially grown in the recesses formed by the removal of upper epitaxial portions 62 and/or 72.

Figure 55:
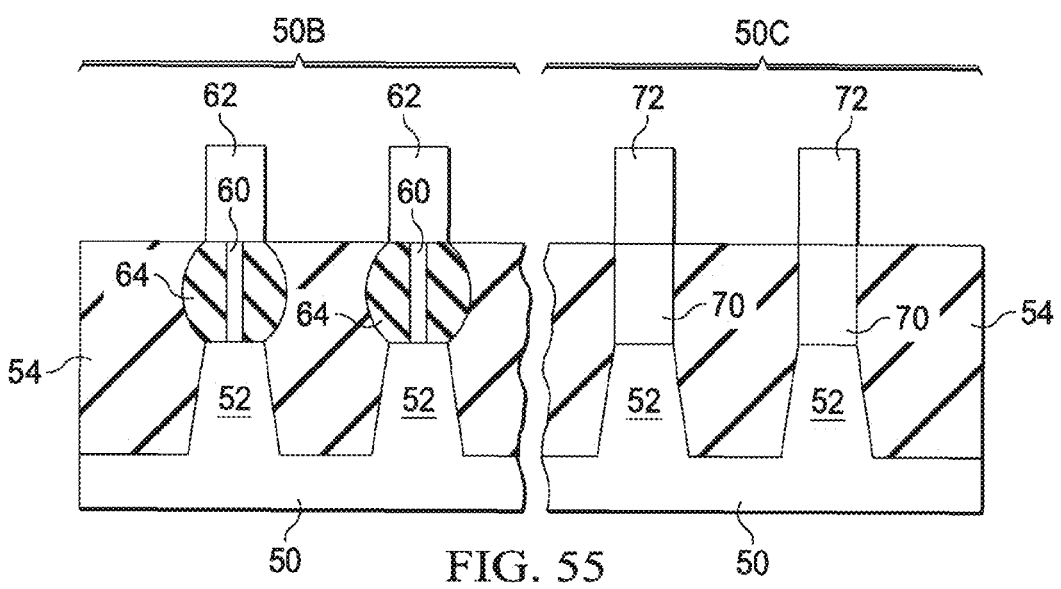

In FIG. 55 and step 324 (similar to step 230 and processing in FIG. 12), the isolation regions 54 are recessed, such as to form STI regions. The isolation regions 54 are recessed such that epitaxial fins in the first region 50B and in the second region 50C protrude from between neighboring isolation regions 54. As illustrated, the top surfaces of the isolation regions 54 are above top surfaces of the lower epitaxial portions 60 and dielectric material 64 in the first region 50B and above the lower epitaxial portions 70 in the second region 50C. In other embodiments, the top surfaces of the isolation regions 54 may be below top surfaces and above bottom surfaces of the lower epitaxial portions 60 and dielectric material 64 and below top surfaces and above bottom surfaces of the lower epitaxial portions 70, or the top surfaces of the isolation regions 54 may be below bottom surfaces of the lower epitaxial portions 60 and dielectric material 64 and bottom surfaces of the lower epitaxial portions 70. Further, the top surfaces of the isolation regions 54 may have a flat surface as illustrated, a convex surface, a concave surface (such as dishing), or a combination thereof. The top surfaces of the isolation regions 54 may be formed flat, convex, and/or concave by an appropriate etch. The isolation regions 54 may be recessed using an acceptable etching process, such as one that is selective to the material of the isolation regions 54. For example, a chemical oxide removal using a CERTAS® etch or an Applied Materials SICONI tool or dilute hydrofluoric (dHF) acid may be used.

Processing may then proceed as discussed with respect to FIGS. 15 through 23C and steps 234 to 256 to achieve the structure illustrated in FIGS. 23A, 23B, and 23C, or similar.

Figure 57:
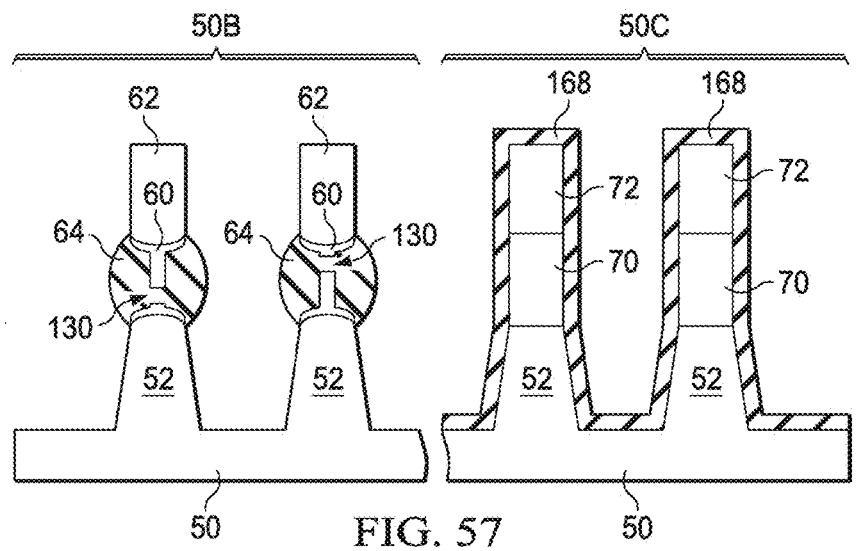
FIG. 57 is a cross-sectional view of an intermediate stage comprising a modification in the manufacturing of finFETs in accordance with some embodiments.

FIG. 57 illustrates a modification to the process and structures discussed with respect to FIGS. 46 through 55, and 15 through 23C. FIG. 57 illustrates a cross-sectional view of a structure after processing through the processes discussed with respect to FIGS. 46 through 52 and after a conversion process. In FIG. 57, the lower epitaxial portions 60 are converted to a dielectric material 64. The conversion process may be similar to that discussed above with respect to FIG. 53, and may be, for example, for a longer duration, at a higher temperature, the like, or a combination thereof. In the illustrated embodiment in FIG. 57, the lower epitaxial portions 60 are converted to a dielectric material 64 to an extent such that a discontinuous region of the lower epitaxial portion 60 remains between the upper epitaxial portions 62 and respective fins 52. Discontinuities 130 are illustrated. Processing may then proceed as discussed with respect to FIGS. 54, 55, and 15 through 23C to achieve the structure illustrated in FIGS. 26A, 26B, and 26C, or similar.

Figures 58, 59, 60:
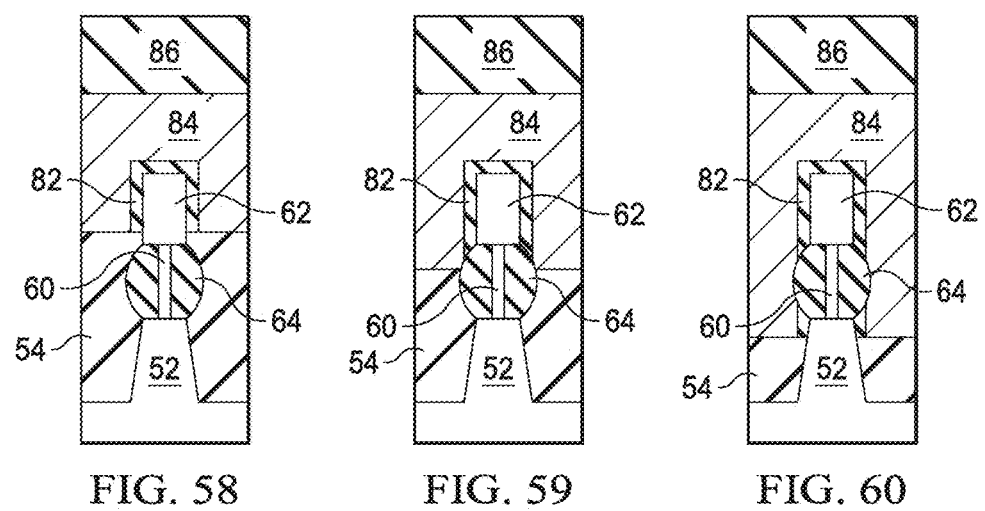
FIGS. 58 through 60 are cross-sectional views of aspects that can be incorporated into processes and structures in accordance with some embodiments.

FIGS. 58 through 60 illustrate various depths to which the isolation regions 54 may be recessed, for example in FIGS. 12, 35, and 55. FIGS. 58 through 60 correspond to aspects of FIG. 15 and various modifications discussed herein. As illustrated in FIG. 58, the top surface of the isolation region 54 is above a top surface of the lower epitaxial portion 60 and dielectric material 64. As illustrated in FIG. 59, the top surface of the isolation region 54 is between a top surface of the lower epitaxial portion 60 and dielectric material 64 and a bottom surface of the lower epitaxial portion 60 and dielectric material 64. As illustrated in FIG. 60, the top surface of the isolation region 54 is below a bottom surface of the lower epitaxial portion 60 and dielectric material 64. These modifications can be incorporated into any of the processes and structures discussed above.

FIGS. 61 through 63 are transmission electron microscopy (TEM) images of samples in accordance with embodiments. FIG. 61 illustrates a fin 52 and an epitaxial fin comprising a lower epitaxial portion 60 and an upper epitaxial portion 62. The lower epitaxial portion 60 has been oxidized to form a dielectric material 64, and the lower epitaxial portion 60 remains continuous. In the embodiment of FIG. 61, the fin 52 is silicon, the lower epitaxial portion 60 is $Si_{1-x}Ge_x$, where x>=0.10, the upper epitaxial portion 62 is silicon, and the dielectric material is SiGeO.

Similarly, FIG. 62 illustrates a fin 52 and an epitaxial fin comprising a lower epitaxial portion 60 and an upper epitaxial portion 62. The lower epitaxial portion 60 has been oxidized to form a dielectric material 64, and the lower epitaxial portion 60 is discontinuous with discontinuities 130. In the embodiment of FIG. 62, the fin 52 is silicon, the lower epitaxial portion 60 is $Si_{1-x}Ge_x$, where x>=0.10, the upper epitaxial portion 62 is silicon, and the dielectric material is SiGeO.

FIG. 63 illustrates a fin 52 and an epitaxial fin comprising a lower epitaxial portion 60, a template layer 142, and an upper epitaxial portion 144. The lower epitaxial portion 60 has been oxidized to form a dielectric material 64, and the lower epitaxial portion 60 remains continuous. In the embodiment of FIG. 63, the fin 52 and template layer 142 are silicon, and the lower epitaxial portion 60 and upper epitaxial portion 144 are $Si_{1-x}Ge_x$, where x>=0.10. The dielectric material is SiGeO.

Embodiments may achieve advantages. For example, by allowing for the upper epitaxial portions of the epitaxial fins to be strained, carrier mobility through a channel region of a finFET may be increased. Further, embodiments may form a partial or full omega gate on a finFET. For example, where a continuous lower epitaxial portion remains in an epitaxial fin, an omega gate may be partial, whereas when a discontinuous lower epitaxial portion remains in an epitaxial fin, an omega gate may be full. Some embodiments may therefore decrease a leakage current through the fin and substrate.

An embodiment is a structure. The structure comprises a fin on a substrate, isolation regions on the substrate, a dielectric region, and a gate structure. The fin includes a first epitaxial portion. The isolation regions are on opposing sides of the fin, and at least the first epitaxial portion of the fin protrudes from between the isolation regions. The dielectric region directly underlies the first epitaxial portion. A material of the dielectric region is different from a material of the isolation regions. The gate structure is along sidewalls and is over an upper surface of the fin. The gate structure defines a channel region in the first epitaxial portion.

Another embodiment is a structure. The structure comprises a channel region, an intermediate region directly underlying the channel region, a gate structure over the channel region, and source/drain regions on opposing sides of the channel region. The channel region comprises a first crystalline semiconductor material. The intermediate region comprises a second crystalline semiconductor material and a dielectric material. The dielectric material is a derivative of the second crystalline semiconductor material.

A further embodiment is a method. The method comprises epitaxially growing a first crystalline semiconductor material on a substrate and epitaxially growing a second crystalline semiconductor material above the first crystalline semiconductor material. After epitaxially growing the first crystalline semiconductor material and the second crystalline semiconductor material, the first crystalline semiconductor material and the second crystalline semiconductor material form a fin on the substrate. The method further comprises after epitaxially growing the second crystalline semiconductor material, converting at least a portion of the first crystalline semiconductor material in the fin to a dielectric material, forming a gate structure over the fin, and forming source/drain regions on opposing sides of the gate structure.

In some embodiments, a method includes epitaxially growing a first semiconductor material over a substrate, epitaxially growing a second semiconductor material different from the first semiconductor material over the first semiconductor material, the first semiconductor material and the second semiconductor material forming a fin over the substrate, and after the epitaxially growing the second semiconductor material, converting at least a portion of the first semiconductor material to a first dielectric material. The method also includes forming a gate structure over the fin, and forming source/drain regions on opposing sides of the gate structure.

In other embodiments, a method includes forming a fin protruding above a substrate, where the fin includes a second semiconductor layer over a first semiconductor layer, with the first semiconductor layer disposed between the second semiconductor layer and the substrate, where the first semiconductor layer and the second semiconductor layer have different compositions. The method further includes converting an exterior portion of the first semiconductor layer into a first dielectric material, forming isolation regions adjacent to the fin, the isolation regions including a second dielectric material different from the first dielectric material, and forming a gate structure over the fin.

In yet other embodiments, a method of forming a Fin Field-Effect Transistor (FinFET) device includes forming a first fin in a first region of a semiconductor device, forming a second fin in a second region of the semiconductor device, and replacing an upper portion of the first fin with a first epitaxial semiconductor structure, the first epitaxial semiconductor structure comprising a first epitaxial material and a second epitaxial material over the first epitaxial material, the second epitaxial material having a different rate of oxidization than the first epitaxial material. The method further includes replacing an upper portion of the second fin with a second epitaxial semiconductor structure, the second epitaxial semiconductor structure comprising the first epitaxial material and the second epitaxial material over the first epitaxial material, performing an oxidization process to convert exterior portions of the first epitaxial material into a first dielectric material, the first dielectric material being an oxide of the first epitaxial material, and after the oxidization process, removing an upper portion of the second epitaxial material of the second epitaxial semiconductor structure to form a recess. The method further includes growing a third epitaxial material in the recess, the third epitaxial material being different from the second epitaxial material, forming isolation regions on opposing sides of the first fin and on opposing sides of the second fin, the isolation regions comprising a second dielectric material different from the first dielectric material, and forming gate structures over the first fin and the second fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a recess in a first isolation region over a substrate;
    epitaxially growing a first semiconductor material in the recess;
    epitaxially growing a second semiconductor material different from the first semiconductor material in the recess over the first semiconductor material, the first semiconductor material and the second semiconductor material forming a fin over the substrate;
    after the epitaxially growing the second semiconductor material, converting at least a portion of the first semiconductor material to a first dielectric material;
    forming a gate structure over the fin; and
    forming source/drain regions on opposing sides of the gate structure.

2. The method of claim 1, wherein the first semiconductor material oxidizes faster than the second semiconductor material.

3. The method of claim 1, wherein the first semiconductor material comprises $Si_{1-x}Ge_x$, and the second semiconductor material comprises Si.

4. The method of claim 1, wherein the converting comprises performing an oxidization process.

5. The method of claim 4, wherein the oxidation process oxidizes at least a portion of the first semiconductor material into an insulating derivative of the first semiconductor material.

6. The method of claim 4, wherein the oxidization process oxidizes an exterior portion of the first semiconductor material, wherein an interior portion of the first semiconductor material remains un-oxidized.

7. The method of claim 6, wherein the interior portion of the first semiconductor material extends continuously from the second semiconductor material to the substrate.

8. The method of claim 6, wherein the interior portion of the first semiconductor material extends discontinuously from the second semiconductor material to the substrate.

9. The method of claim 1, further comprising forming second isolation regions on opposing sides of the fin, the second isolation regions comprising a second dielectric material different from the first dielectric material.

10. The method of claim 1, further comprising:
    after the converting, removing an upper portion of the second semiconductor material and keeping a lower portion of the second semiconductor material; and
    epitaxially growing a third semiconductor material over the lower portion of the second semiconductor material, the third semiconductor material being different from the second semiconductor material.

11. A method comprising:
    forming a fin protruding above a substrate, wherein the fin comprises a second semiconductor layer over a first semiconductor layer, with the first semiconductor layer disposed between the second semiconductor layer and the substrate, wherein the first semiconductor layer and the second semiconductor layer have different compositions;
    converting an exterior portion of the first semiconductor layer into a first dielectric material, wherein the second semiconductor material and the substrate are not converted into the first dielectric material;
    forming isolation regions adjacent to the fin, the isolation regions comprising a second dielectric material different from the first dielectric material; and
    forming a gate structure over the fin.

12. The method of claim 11, wherein the forming the fin comprises:
    epitaxially growing a first semiconductor material as a first blanket layer on the substrate;
    epitaxially growing a second semiconductor material as a second blanket layer on the first blanket layer; and
    patterning the first blanket layer and the second blanket layer to form the fin.

13. The method of claim 11, wherein the forming the fin comprises:
    etching the substrate to form a semiconductor fin protruding above the substrate, the semiconductor fin comprising a same material as the substrate;
    removing a top portion of the semiconductor fin distal the substrate; and
    successively growing a first epitaxial material and a second epitaxial material on a remaining bottom portion of the semiconductor fin to form the fin.

14. The method of claim 11, wherein the converting comprises an oxidization process, wherein the oxidization process converts the exterior portion of the first semiconductor layer into an oxide of the first semiconductor layer, wherein the second semiconductor layer and an interior portion of the first semiconductor layer are not oxidized by the oxidization process.

15. The method of claim 14, wherein after the oxidization process, the interior portion of the first semiconductor layer is discontinuous.

16. The method of claim 11, wherein the converting comprises performing an oxidization process in an environment having water steam.

17. A method of forming a Fin Field-Effect Transistor (FinFET) device comprising:
    forming a first fin in a first region of a semiconductor device;
    forming a second fin in a second region of the semiconductor device;
    replacing an upper portion of the first fin with a first epitaxial semiconductor structure, the first epitaxial semiconductor structure comprising a first epitaxial material and a second epitaxial material over the first epitaxial material, the second epitaxial material having a different rate of oxidization than the first epitaxial material;
    replacing an upper portion of the second fin with a second epitaxial semiconductor structure, the second epitaxial semiconductor structure comprising the first epitaxial material and the second epitaxial material over the first epitaxial material;
    performing an oxidization process to convert exterior portions of the first epitaxial material into a first dielectric material, the first dielectric material being an oxide of the first epitaxial material;
    after the oxidization process, removing an upper portion of the second epitaxial material of the second epitaxial semiconductor structure to form a recess;
    growing a third epitaxial material in the recess, the third epitaxial material being different from the second epitaxial material;
    forming isolation regions on opposing sides of the first fin and on opposing sides of the second fin, the isolation regions comprising a second dielectric material different from the first dielectric material; and
    forming gate structures over the first fin and the second fin.

18. The method of claim 17, wherein the first epitaxial material comprises $Si_{1-x}Ge_x$, and the second epitaxial material comprises Si.

19. The method of claim 17, wherein the first region is an N-type device region, and the second region is a P-type device region.

20. The method of claim 17, wherein after the oxidization process, interior portions of the first epitaxial material are continuous.

* * * * *